US007152996B2

(12) United States Patent
Luk

(10) Patent No.: US 7,152,996 B2
(45) Date of Patent: Dec. 26, 2006

(54) DIODE LIGHTING SYSTEM

(75) Inventor: John F. Luk, Flushing, NY (US)

(73) Assignee: Altman Stage Lighting Co., Inc., Yonkers, NY (US)

( * ) Notice: Subject to any disclaimer, the term of this patent is extended or adjusted under 35 U.S.C. 154(b) by 950 days.

(21) Appl. No.: 09/845,073

(22) Filed: Apr. 27, 2001

(65) Prior Publication Data

US 2002/0181231 A1    Dec. 5, 2002

(51) Int. Cl.
*F21V 5/00*    (2006.01)
(52) U.S. Cl. .............. 362/240; 362/800; 362/227; 362/238; 362/11
(58) Field of Classification Search ............. 362/241, 362/247, 245, 240, 331, 277, 319, 227, 11, 362/244, 660, 252, 800, 238; 428/51–58; 340/815.45, 241, 247, 245, 240, 331, 219
See application file for complete search history.

(56) References Cited

U.S. PATENT DOCUMENTS

| | | | |
|---|---|---|---|
| 4,654,629 A | | 3/1987 | Bozos et al. |
| 4,826,269 A | | 5/1989 | Stripper et al. |
| 4,893,223 A | * | 1/1990 | Arnold ............... 362/252 |
| 5,038,258 A | * | 8/1991 | Koch et al. ............ 362/237 |
| 5,580,163 A | * | 12/1996 | Johnson, II ............ 362/285 |
| 5,673,995 A | | 10/1997 | Seguee |
| 5,690,417 A | * | 11/1997 | Polidor et al. ............ 362/244 |
| 5,752,766 A | | 5/1998 | Bailey |
| 5,838,247 A | * | 11/1998 | Bladowski ............ 340/815.45 |
| 5,890,794 A | | 4/1999 | Abate et al. |
| 6,033,087 A | | 3/2000 | Shoos et al. |
| 6,582,090 B1 | * | 6/2003 | Coots et al. ............ 362/11 |
| 2002/0048170 A1 | * | 4/2002 | Momot et al. ............ 362/244 |

OTHER PUBLICATIONS

GELcoreLLC V GE Lightng The Essence of Light Order NO. and Encore 70852 Corp.
Nichia Cororation Light Catalog No. 990610K Emitting Diode Product Guide.
LumiLeds JV Philips Press Release Feb. 9, 2000 Lilghting Lighting and Agilent Technologies.

* cited by examiner

*Primary Examiner*—Sandra O'Shea
*Assistant Examiner*—Anabel Ton
(74) *Attorney, Agent, or Firm*—Myron Greenspan, Esq.; Lackenbach Siegel, LLP

(57) ABSTRACT

A lighting system for stage, theatrical and architectural lighting, comprising a frame for supporting a plurality of light emitting diodes. The diodes are mounted to the frame so that each diode is both secured to the frame and also simultaneously positioned wherein each discrete diode light beam is directed to a prescribed remote focal point (target zone) and thereupon directed to a predetermined illumination area. Electrical power for transmitting and controlling electrical voltage to light emitting diodes by electrical circuitry integral with the frame. The frame can be configured as any hollow volume such a cone, a semi-ellipse, and a semi-sphere or can be configured as planar. Flexible blanks having apertures and pads for electrical connections can be used to construct rigid frames. An imaging gate a collimating lens and a focusing lens can be interposed between the frame and the illumination area. The frame can also be a sandwich frame having positive and negative electrically conductive layers interposed between layers of biasable insulating foam.

105 Claims, 31 Drawing Sheets

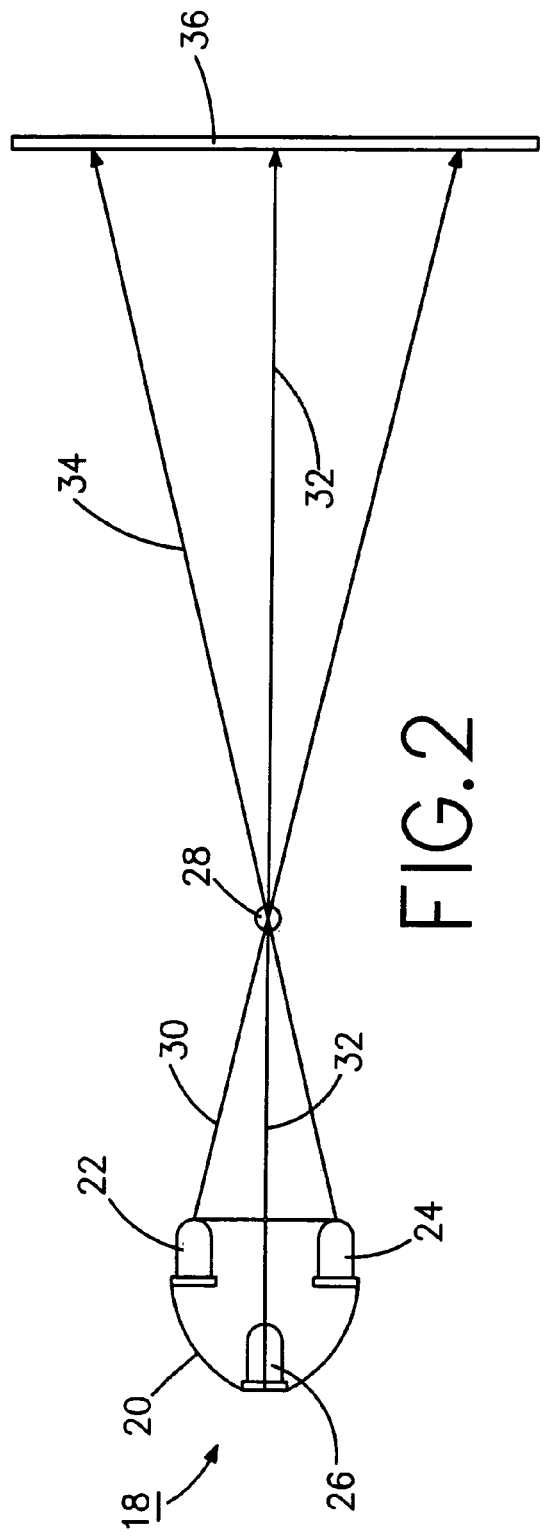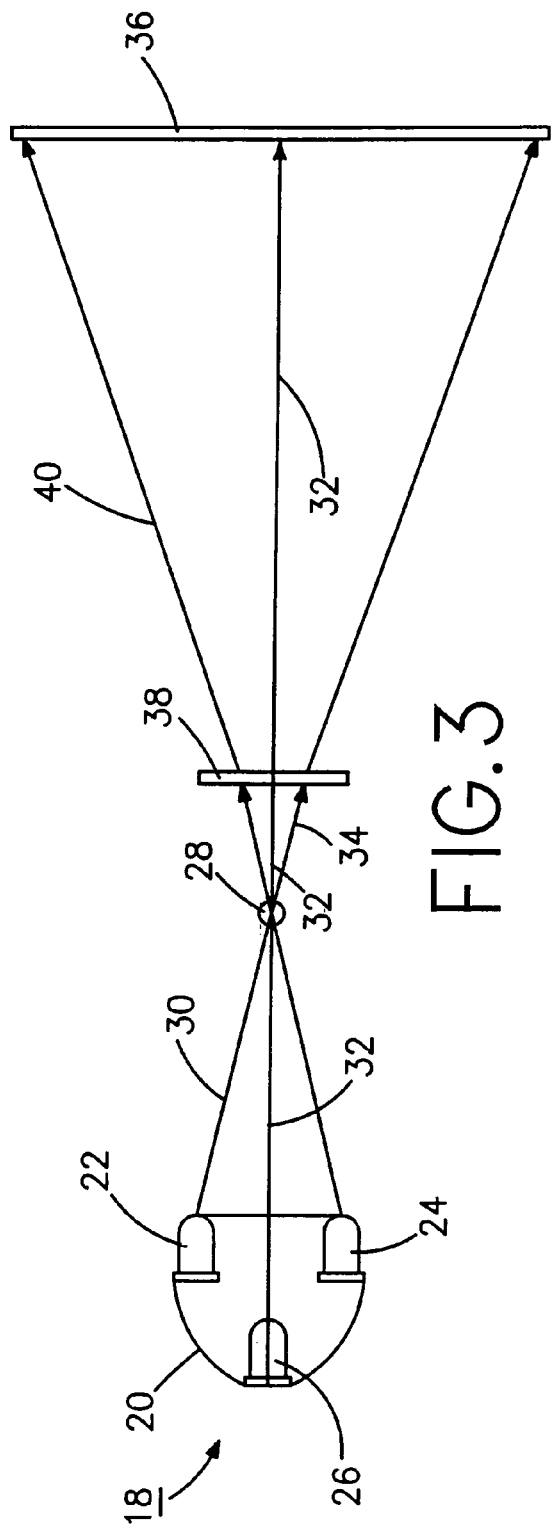

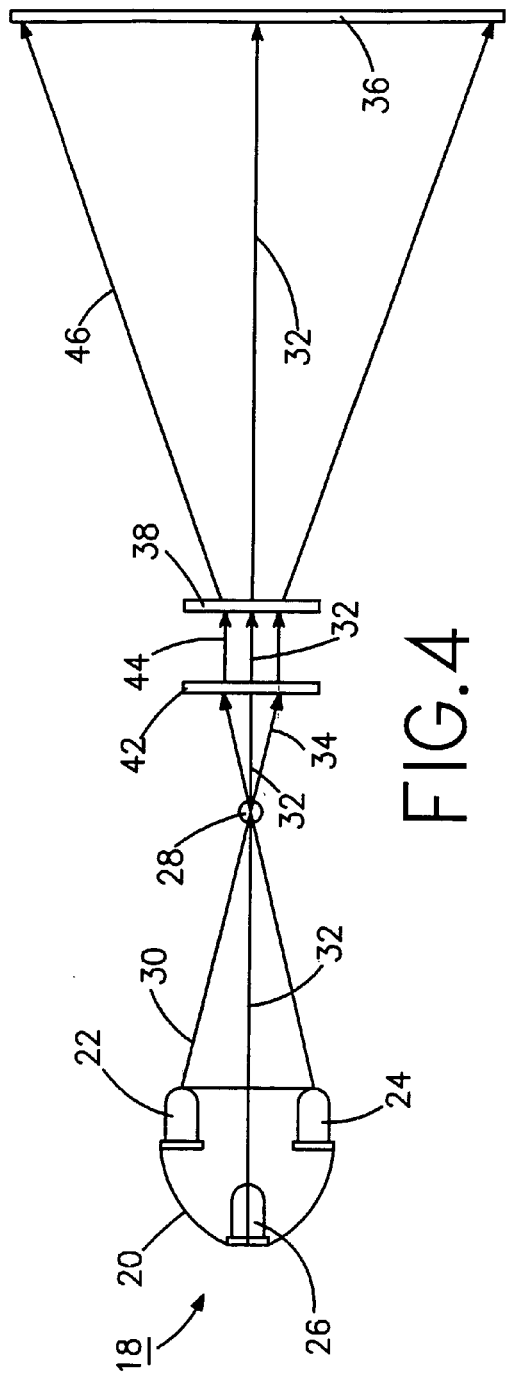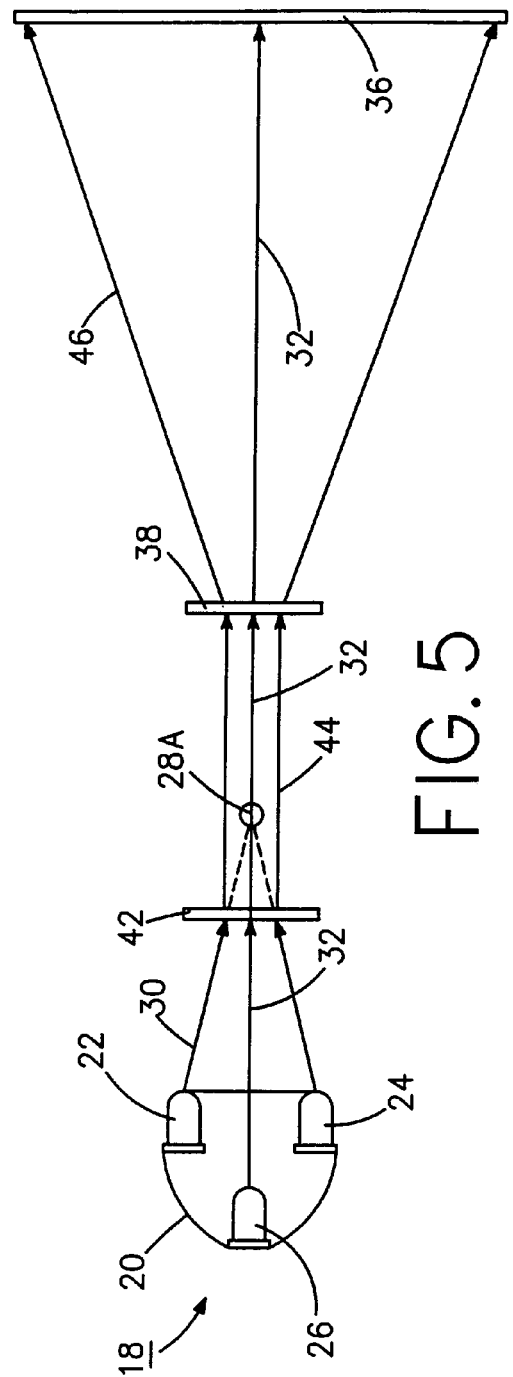

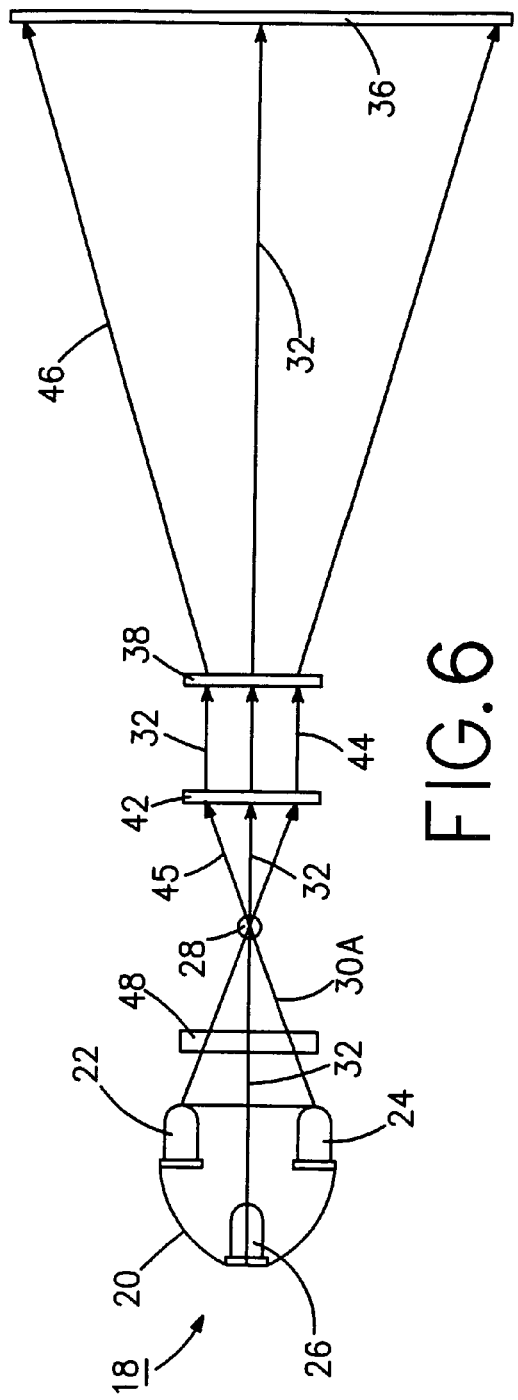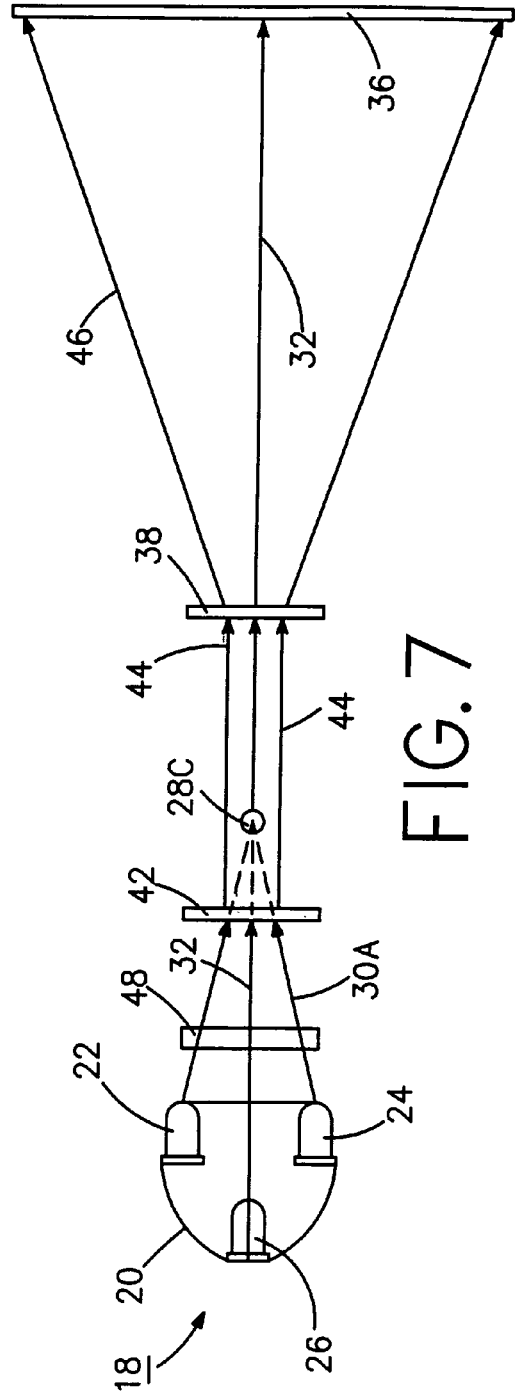

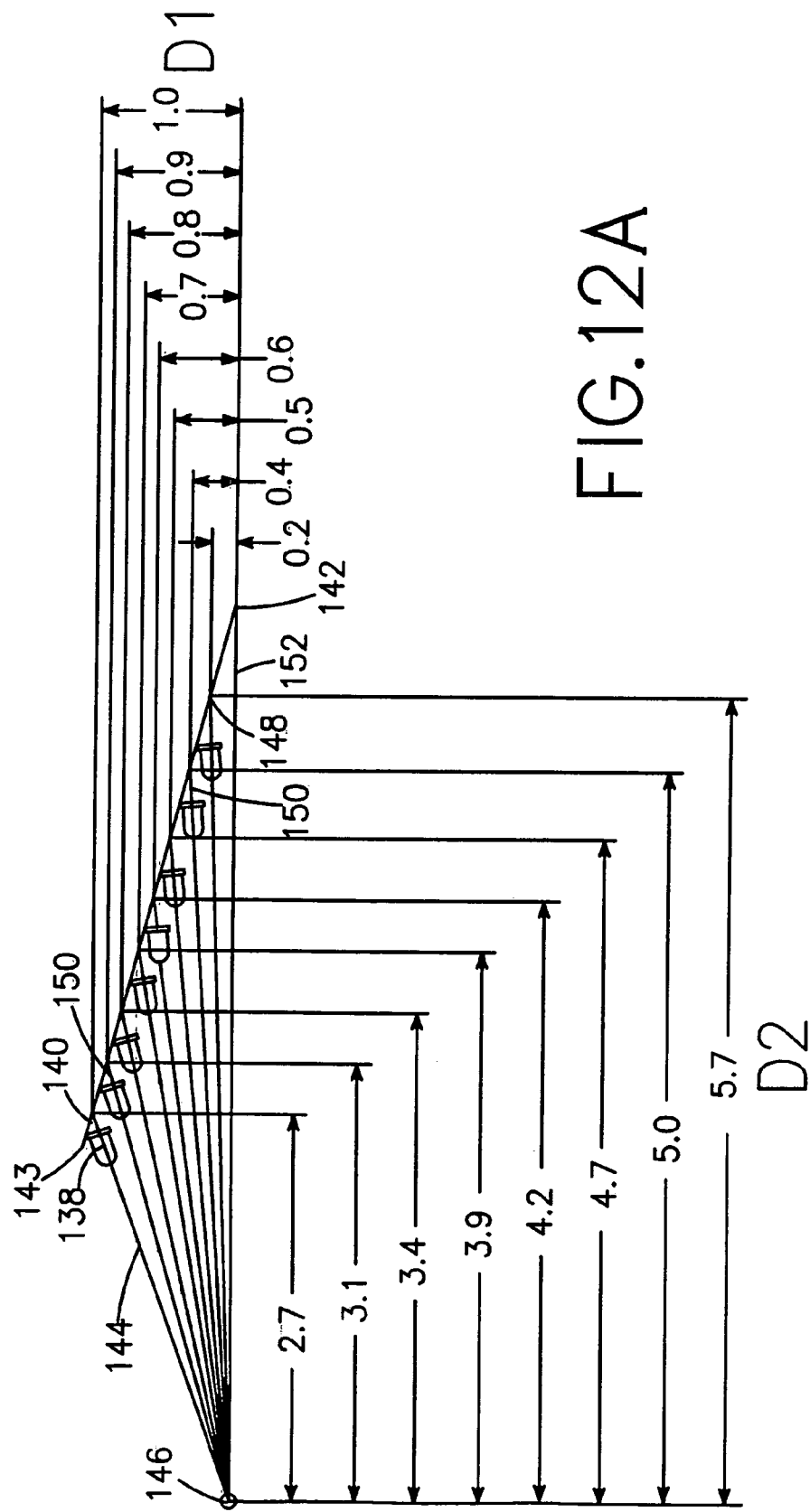

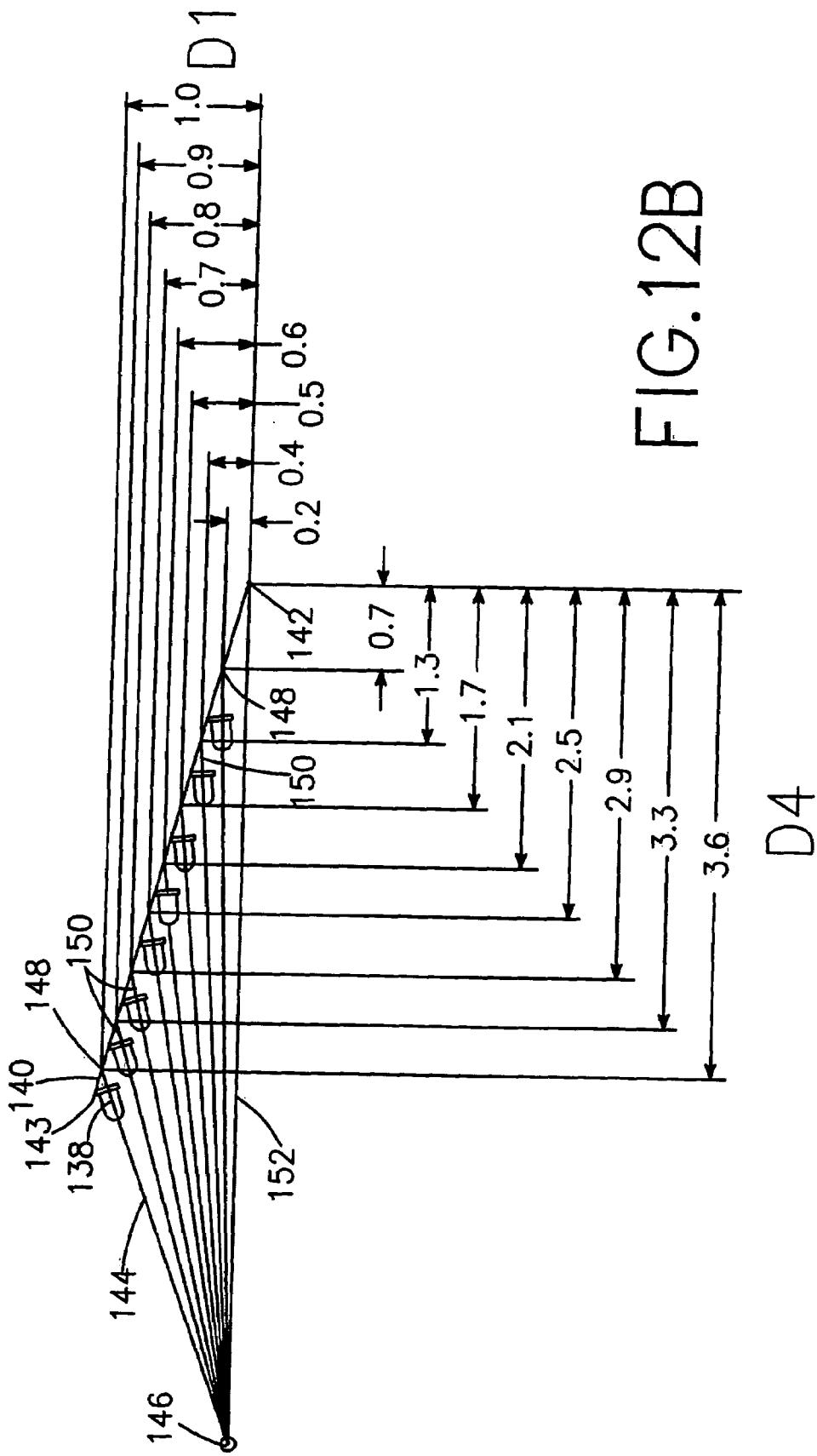

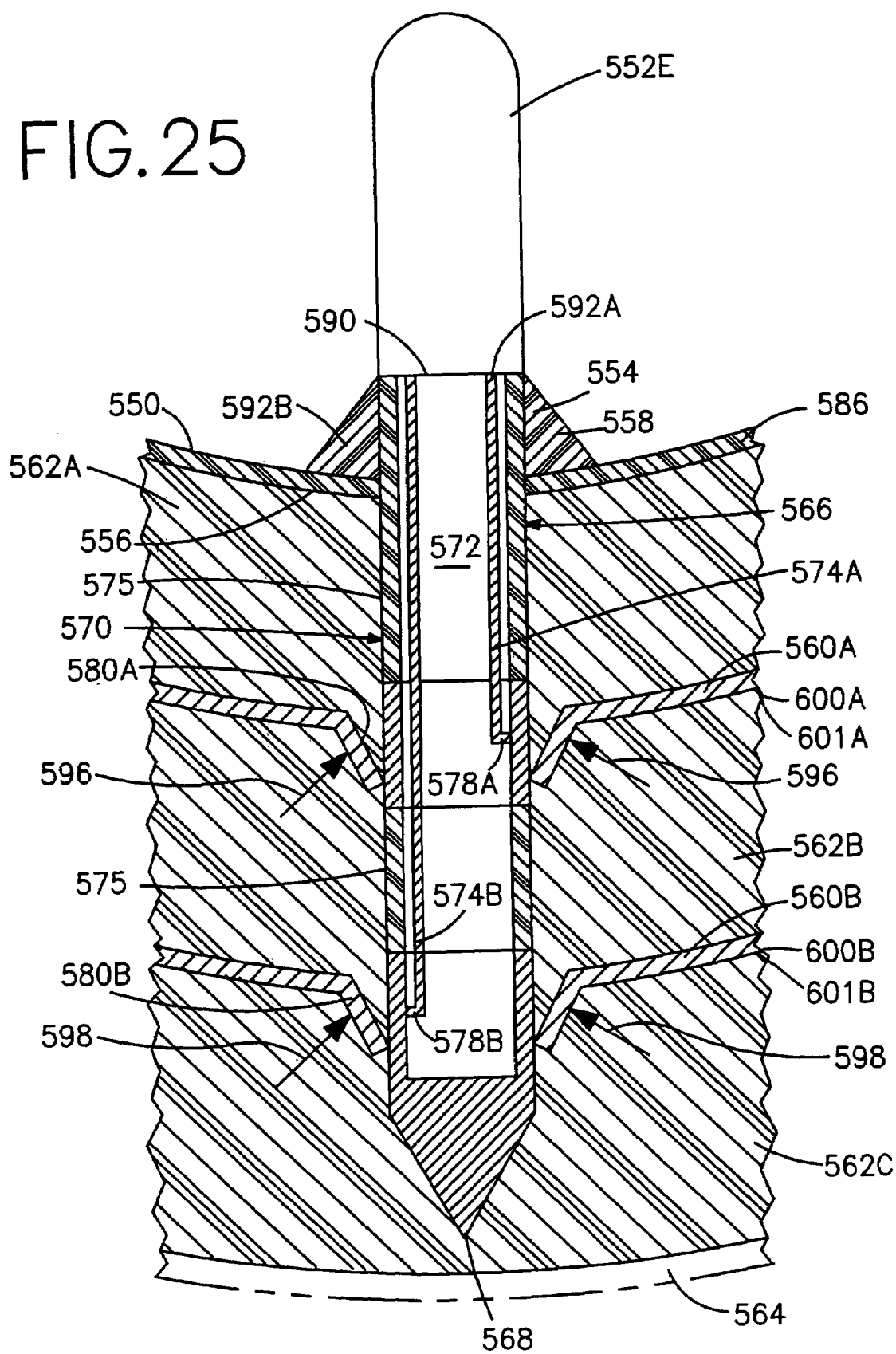

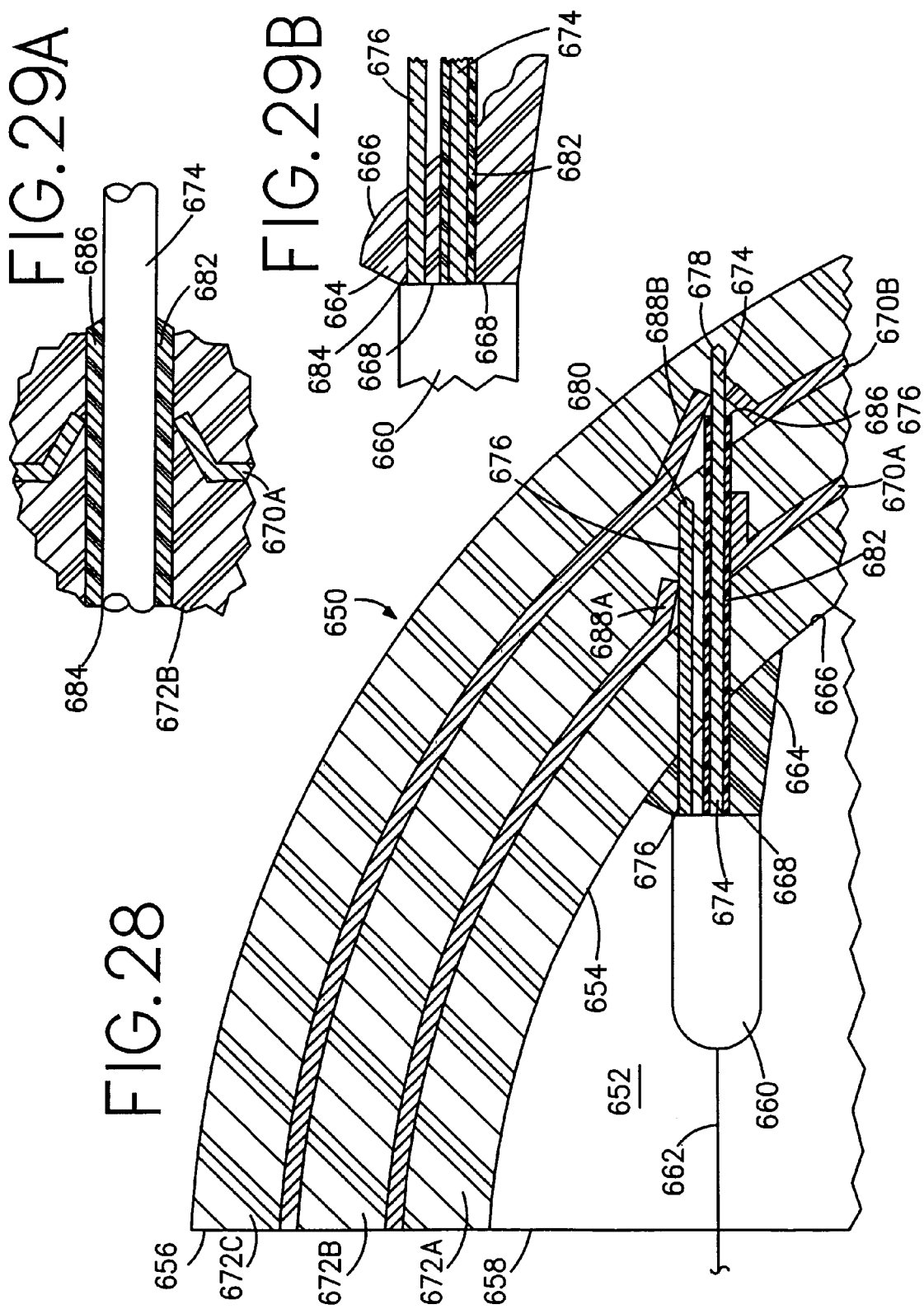

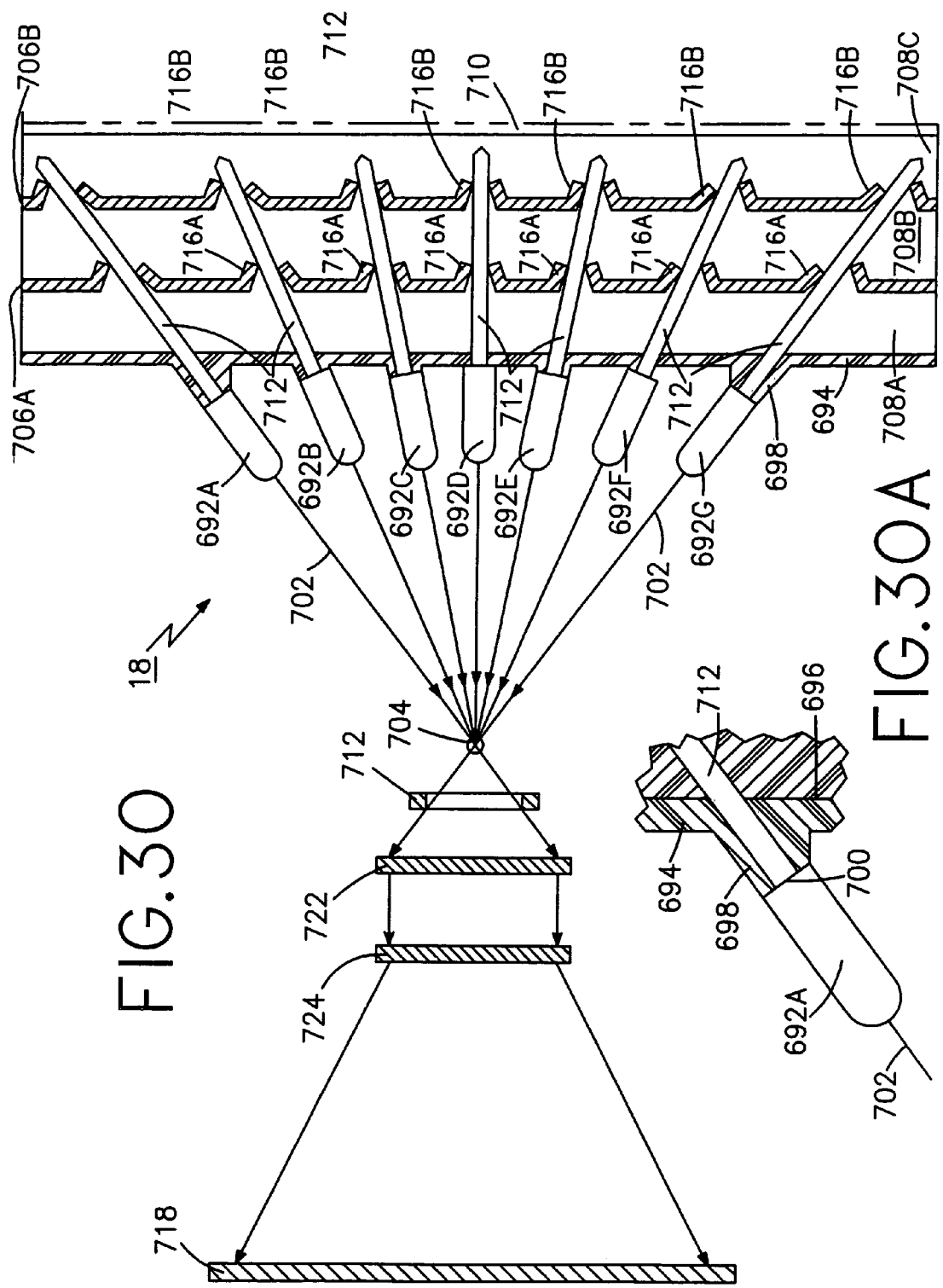

DIODE LIGHTING SYSTEM

FIELD OF THE INVENTION

The present invention relates to light emitting diode illumination sources used in combination with architectural, theatrical and stage lighting systems.

BACKGROUND OF THE INVENTION

Incandescent and halogen type lamps have been widely used in various conventional lighting devices for the projection of light onto a surface for illumination and for general illumination purposes. Such lamps depend on the heating of a tungsten wire filament to a high temperature and therefore emit light. These lamps are not energy efficient and they generate excessive heat.

Illuminating light sources such as metal halide arc lamps, gas discharge lamps, fluorescent lamps and halogen light bulbs, as examples, have been widely used in various conventional lighting devices for the projection of light onto a surface for illumination. Such light sources are used in architectural, theatrical and stage lighting systems as well as in industrial applications for lighting surfaces, scenery, an object, or a person. These light sources are also used to project a sharp image of a gobo, shutter cut, or pattern onto a surface when such items are placed at the gate aperture of lighting devices somewhere between the light source and a lens lighting system.

These image projection and lighting systems are typically called ellipsoidals. Conventional lighting systems comprise an ellipsoidal reflector used with a single high-intensity lamp, an imaging gate, and light collection lenses, including focusing lenses and collimating lenses. A single ellipsoidal reflector is used because it enhances light collection in the most efficient configuration known in the art of light projection. By definition, an ellipse has two focal points. The curve of an ellipsoidal reflector is matched with the light source to produce an exact focused secondary image of the light source at the same distance at which it is located from the reflector at the opposite end. When a light source is placed at the primary focal point of the reflector, the ellipsoidal reflector reflects or redirects, the light to the secondary focal point in front of the reflector. Multi-facets on the inside surface of the ellipsoidal reflector project the light beams to the secondary focal point.

Conventional light sources have shortcomings. They generate a large amount of heat and so consume a large amount of energy, with the result that lamp life is short. In addition, lighting systems that use the conventional light sources suffer from the excess amount of heat that is transferred to the exterior of the fixture housing. Likewise, the use of the incandescent filament lamps and arc lamps in conventional ellipsoidal projection lighting systems transfer a high degree of heat to the fixtures. The primary reason for this heat loss is that a major part of the light energy is in fact wasted as infrared heat energy. The use of cold mirror coated reflectors has helped somewhat, but these fixtures continue to have low energy efficiency. An additional problem with conventional light sources is that they have low resistance to vibration.

An alternate light source is the light emitting diode (LED). Advancements have been made in LED technology and in the overall use of LEDs. LEDs have several different characteristics that set them apart from conventional light emitting technology. As one example, an LED used in place of a conventional light source will produce a cooler, longer running, and more energy efficient lighting fixture. A disadvantage of LEDs when compared to incandescent and halogen lamps is their relatively low illumination intensity. A basic characteristic of LEDs that sets them apart from conventional light emitting technology is that while conventional lamps radiate light into the surrounding hemisphere with relatively equal intensity in all directions, light emitting diode lamps with their substantially planar luminescent elements radiate high intensity light primarily in the forward direction resulting in only minimal quantities of light energy radiated to the sides. It is to be noted, however, that LEDs are presently manufactured with integral lenses molded into the diode housings just in front of the diode chip. Even with the lenses, however, LEDs are available only with some degree of beam spread, or angle. Beam spreads of a LED, shown in FIG. 1 herein for purposes of exposition only, vary according to the manufacturer generally between approximately 5 and 70 degrees. Despite there being some degree of beam spread, LEDs are much more centered than conventional lamp technology. For purposes of clarity, FIG. 2 shows a straight line representing the virtual center of a typical LED beam.

The solid state design of LEDs allows them to be more durable and robust, and lets them withstand shock, vibration, frequent power cycling, and extreme temperatures. LEDs have an average usable life of typically 100,000 hours or more when they are operated within their electrical specifications. In comparison, incandescent filament lamps generate high-intensity light for only a short time, typically a few hundred hours, and are very susceptible to damage from both shock and vibration.

Red, green, and blue (RGB) LEDs are known in the art. It is noted that color gel filters used with conventional light source technology are not necessary in diode technology because RGB LEDs are capable of serving as a full color spectrum generating light source. The primary colors red, green, and blue of RGB LEDs can be mixed to produce the secondary colors cyan, yellow, magenta (CYM), and also white light. Mixing green and blue gives cyan, as is known in the art of colors. Likewise as is known in the art, mixing green and red gives yellow. Mixing red and blue gives magenta. Mixing red, green, and blue together results in white. Advances in light-emitting diode technology include the development of multi-chip and multi-LED arrays, which have led to brighter LEDs available in different colors. LEDs are available in both visible colors and infrared. In addition to red, yellow, and amber/orange, which were the first available colors, LEDs are also available in green, blue, and even white light. Clearly, for many applications, light-emitting diodes can compete directly with incandescent filament light sources.

While incandescent filament lamps give off the full spectrum of light, LEDs can emit focused discrete beams of color at a variety of different angles. Color efficiency in LEDs is much better than it is for incandescent filament lamps. In order to get color from an incandescent filament lamp, a specific color gel or filter in that particular color spectrum has to be used. This can waste 90 percent and more of the incandescent filament lamp's light energy. In comparison, LEDs deliver 100% of their energy as light and give a more intense colored light. This efficiency also gives LEDs the advantage of white light as well.

LED lamps have been considered for many lighting devices because of their long life, high luminous efficiency, and intrinsic colors. However, their use has been limited to low intensity devices because individually, they emit only small quantities of light energy. It has not been possible to efficiently combine a plurality of LED lamps into a single lighting device comprising a number of LEDs of limited size together capable of emitting a concentrated light beam meeting specific intensity, beam spread, power consumption, and size requirements that is related to large scale lighting arts such as architectural displays, and theatrical and stage productions.

PRIOR ART

Because LEDs generally emit only a small quantity of light, it is therefore necessary to use means for increasing the total quantity of light. Previous inventions have been developed to overcome this problem by increasing the number of LEDs used, or by aiming the LEDs to a common point.

Some patents that have addressed this problem are as follows:

| Patent Number: | 4,654,629 | Mar. 31, 1987 | Bozos et al. |
| --- | --- | --- | --- |
| Patent Number: | 4,826,269 | May 2, 1989 | Stripper et al. |
| Patent Number: | 4,893,223 | Jan. 9, 1990 | Arnold |
| Patent Number: | 5,673,995 | Oct. 7, 1997 | Segued |
| Patent Number: | 5,690,417 | Nov. 25, 1997 | Plodder et al. |
| Patent Number: | 5,752,766 | May 19, 1998 | Bailey et al. |
| Patent Number: | 5,838,247 | Nov. 17, 1998 | Bladowski |
| Patent Number: | 5,890,794 | Apr. 06, 1999 | Abate et al. |
| Patent Number: | 6,033,087 | Mar. 07, 2000 | Shoos et al. |

Some recent publications describe applications that have addressed this area of diode technology are as follows:

1) GELcore LLC, a joint venture of GE Lighting and Emcore Corporation, The Essence of Light, Order No. 70852.

2) Nichia Corporation, Light Emitting Diode Product Guide, Cat. No. 990610K, printed May, 1999.

3) LumiLeds Lighting, a joint venture between Philips Lighting and Agilent Technologies, Press Release, Feb. 9, 2000, www.lighting.philips.com/nam/press/1999/070199a.shtml Today, lighting fixtures that incorporate LEDs as their primary light source rely on the direct light that is emitted from each diode. Patents that describe lighting fixtures that incorporate LEDs as their primary light source and rely on the direct light as emitted from each diode are as follows:

U.S. Pat. No. 4,654,629 issued to Bozos et al. on Mar. 31, 1987, utilizes a flat planar surface to mount LEDs. Such diodes are primarily arranged in a flat and planar array with the LEDs mounted in such a manner in which the beam output from each LED is perpendicular to the mounting plane.

U.S. Pat. No. 5,690,417 issued to Plodder et al. on Nov. 25, 1997, likewise describes a planar array of light emitting diodes.

Although a planar array is the simplest of all possible configurations, such a lighting system is limited in that the number of LEDs that can be used is limited.

U.S. Pat. No. 5,673,995 issued to Segued on Oct. 7, 1997, discloses a support element for a motor vehicle indicating display and the method of making it. The invention teaches the broad concept of mounting a plurality of LEDs along a curved or arcade surface.

Alternatively, some inventions focus the LEDs or other light sources to a common point to achieve a brighter source. The use of a curved mounting surface, or specifically mounting and positioning the individual LED allows light to be concentrated to a remote focus point. Several patents that disclose this construction are as follows;

1) U.S. Pat. No. 4,826,269 issued to Stripper et al. on May 2, 1989.

2) U.S. Pat. No. 4,893,223 issued to Arnold on Jan. 9, 1990.

3) U.S. Pat. No. 6,033,087 issued to Shoos et al. on Mar. 7, 2000.

4) U.S. Pat. No. 4,654,629 issued to Bozos mentioned above

5) U.S. Pat. No. 5.690,417 issued to Plodder et al. mentioned above.

These inventions all focus the discrete light sources to a common point for the illumination of objects for close inspection or for small scale viewing purposes. None of the named prior art disclosures are applicable to large scale use for viewing by an audience, for example.

Other patents that have addressed this problem are as follows:

1) U.S. Pat. No. 5,838,247 issued to Bladowski on Nov. 17, 1998, discloses a lamp that uses a massed arrangement of LEDs. The LEDs are arranged in a conical reflector that directs light outwardly. All the LEDs, however, are positioned at the same angle within the reflector housing, with the result that the light beams come out collimated and normal to the front of the reflector housing. The arrangement of the LEDs in the Bladowski invention offers an increased array of light sources used, but the final beam output offer less than maximum output because the beams from the discrete light sources are not directed to a common focal point.

2) U.S. Pat. No. 5,752,766 issued to Bailey on May 19, 1998, discloses a focusable LED stage light. The array of multi-color LEDs are mounted on a flexible diaphragm-like support structure which may be deflected to focus a beam of variable colored light. This arrangement allows a user to focus the individual LEDs together to form a brighter beam. The limitation on how many light sources can be used is imposed by the initial mounting surface. Sufficient room between the light sources is required to allow for the flexing of the diaphragm-like support member and to prevent them from interfering with each other during the flexing.

3) U.S. Pat. No. 5,890,794 issued to Abate et al. on Apr. 6, 1999, discloses LEDs that are positioned around the outside circumference of a cylinder made also of a flexible mounting material. The beam output in this case is projected outwards from the outside surface of the tube instead of converging the beam outputs to a common point. Once again, this configuration imposes limits on the number of LEDs that can be utilized. Furthermore and more importantly, the light beams do not converge together at a focal point.

4) U.S. Pat. No. 6,016,038 issued to Mueller et al. on Jan. 18, 2000, describes LED lighting systems capable of generating light, such as for illumination and display purposes that includes a control processor to alter the brightness and/or color of the generated light by using pulse-width modulated signals.

5) U.S. Pat. No. 6,132,859 issued to Jolly on Oct. 17, 2000, describes a sandwich panel with conductive cores interposed between layers of nonconductive foam and a lamp connected to at least one pin having electrical leads connected to the conductive cores connected to a source of electrical voltage.

SUMMARY OF THE INVENTION

Accordingly, the object of the present invention is to provide an illuminating device that uses substantially the maximum number of LEDs possible that are compactly arranged in close mutual proximity onto a curved surface.

The above object is accomplished by a unique structure for a LED illuminating device of the present invention which includes a larger array of LEDs that are compactly arranged in close proximity along the inside surface of a substantially ellipsoidal-type housing or a housing having a configuration that is related to an ellipsoidal-type housing with the light rays from the LEDs being directed to a single focal region.

It is another object of the invention to devise an arrangement for focusing a plurality of LEDs mounted on any type of surface into a single focal region with all the LEDs being directed to a single focal region.

It is a further object of this invention to maximize the number of LEDs within any suitably confined volume by arranging the LEDs in an array on the inner surface of the volume so as to obtain the most efficient and brightest possible light output.

It is yet another object of this invention to use an LED light source in combination with an imaging gate and lenses to create an energy efficient and longer-lasting lighting system.

It is yet another object of this invention to use individual LED light sources mounted in a hollow volume configured in any of several known geometric configurations that efficiently direct the light beams emitted by each of the LEDs to a common focal point, or target zone, for the purpose of organizing the individual LED light sources into a single total LED generated light beam.

In accordance with these and other objects that will be made evident in the course of this disclosure, there is provided a lighting system for architectural, theatrical and stage lighting including a frame for supporting a plurality of light emitting diodes (LEDs) for generating a plurality of substantially forward-directed light beams to a prescribed focal point, or target zone so that an organized diode-generated light beam is directed from the target zone to an illumination area. The diode frame can be configured as a hollow volume of various geometrical configurations such as semi-ellipsoidal shaped, cone-shaped, and semi-spherical shaped. The diode frame can also be planar. An imaging gate aperture, a collimating lens and a focusing lens can be included in the illumination lighting system. A flexible unitary housing/diode mounting frame/electrical circuit board can be used to construct a unitary rigid housing/diode mounting frame/electrical circuit board for many of the variously configured hollow volumes in which the LEDs are positioned.

The present invention will be better understood and the objects and important features, other than those specifically set forth above, will become apparent when consideration is given to the following details and description, which when taken in conjunction with the annexed drawings, describes, illustrates, and shows preferred embodiments or modifications of the present invention and what is presently considered and believed to be the best mode of practice in the principles thereof.

Unlike incandescent lamps that radiate their light into the surrounding hemisphere with relatively equal intensity in all directions, LED lamps with their substantially planar luminescent elements, radiate high intensity light in the forward direction with a substantial gradient resulting in only minimal quantities of light energy radiated to the sides. The present invention takes advantage of the LED and incorporates them in a new arrangement array allowing for more LEDs to be installed into a similarly sized space. Each LED is mounted to a mounting template that aims each LED so that the light beam emanating from each LED points to a common remote location, or target zone. This unique arrangement array gives rise to a more concentrated and much brighter light output than is attained in the known art of the ellipsoidal housing. When RGB LEDs are used, a brighter and more intense full spectrum of color can be obtained. This feature in combination with the ability to project a sharp focused pattern gives rise to a new and unique lighting system.

Unlike incandescent lamps that radiate their light into the surrounding hemisphere with relatively equal intensity in all directions, LED lamps with their substantially planar luminescent elements, radiate high intensity light substantially in the forward direction resulting in only minimal quantities of light energy being radiated to the sides. The present invention takes advantage of this characteristic of the LED and incorporates it in the new arrangement array set forth above so as to increase and even maximize in at least one configuration the number of LEDs that can be installed into a given volume.

As described, each LED is mounted to a housing and is properly aimed so that the combined light outputs all point to a common remote location. This unique arrangement array gives rise to a highly concentrated and bright light output in a more efficient manner than has been made possible by the prior art. When combined with an imaging gate and a light collimating lens that projects the diode generated light onto a display surface for lighting or viewing, a brighter lighting system than has been know in the art is possible. When RGB LEDs are used, a brighter and more intense full spectrum of color can be obtained.

In applications where the overall diameter of the light fixture is limited, as in the case of conventional ellipsoidal fixtures, such size restriction puts a limitation to the number of LEDs that can be used. Stated in another way, the total mass of LEDs is limited by the diameter of the standard light fixture. In addition, when the overall diameter of the light fixture is less that the overall length of the light fixture, there is also a limitation to the number of LEDs that can be used. The greatest number of LEDs can be achieved with a housing that offers the greater surface area. Such an area is directly related to the length of the housing compared to the diameter of the housing. Stated in another way, a long housing provides the most efficient configuration for maximizing the number of LEDs. Besides the mentioned planar and conical mounting surfaces, also possible are spherical, parabolic, ellipsoidal, and other curved mounting surfaces.

It is possible to compare various surface configurations to determine which surface will provide the greatest number of LEDs. Basically, the curve with the largest lateral area or surface area for the mounting of the LEDs will allow the greatest array. The surface area as herein defined is the sum of the areas of all of the forward facing surfaces, or faces, of a three-dimensional hollow volume.

Basic mathematical calculations related to the above definition of the surface area for a three dimensional hollow volume with a diameter of $2x$ and a depth of $y$ are as follows:

The hypotenuse $z$ can be derived from $z^2=x^2+y^2$:

A flat planar circular arrangement gives an area of $A=Pi(x^2)$.

A semi-spherical arrangement gives a surface area of $S=2Pi(x^2)$.

A conical arrangement gives a surface area of S=Pi(xz).
A semi-ellipsoidal arrangement gives a surface area of S=2 Pi((y/x)/2)².
Given x=1 in.; y=3 in.; z=3.162278 in. and Pi=3.141592, the following values are defined for this example:

The flat planar circular arrangement gives an area of 3.14 sq. in.
The semi-spherical arrangement gives a surface area of 6.28 sq. in.
The conical arrangement gives a surface area of 9.93 sq. in.
The semi-ellipsoidal arrangement gives a surface area of 14.14 sq. in.

Based on the above quantitative calculations, one can conclude the following:

A flat planar arrangement uses the least amount of LEDs.
A spherical arrangement uses more LEDs.
A conical arrangement uses even more LEDs.
An ellipsoidal arrangement provides the greatest number of LEDs.

LEDs are available in different sizes and shapes. The LEDs used in the following examples are the white NSPW 500BS Series of High Luminous Intensity lamp types available from Nichia Corporation, but they are readily available from other sources among others including GELcore LLC, a joint company that combines GE Lighting and Emcore Corporation, and LumiLeds Lighting that combines Philips Lighting and Hewlett Packard's Agilent Technologies. Using a round 5 mm diameter LED as the preferred luminescent light source and an overall diameter housing of 2.2 in. with a depth of 3.0 in., the following actual number of LEDs were mounted with each of the configuration arrangements to achieve the maximum possible array:

The flat circular surface provided for 67 LEDs.
The semi-spherical surface provided for 90 LEDs.
The conical surface provided for 110 LEDs.
The semi-ellipsoidal surface provided for 181 LEDs.

A correlation between the number of light emitting diodes used to an expected luminous output can be developed. For example, each 5 mm LED used in this calculation is expected to deliver about 5.60 candela operating at a nominal forward current of 30 milli-amps. This equates to a power consumption of about 105 milli-watts by each LED. For this exercise, we can use the semi-ellipsoidal surface for the calculations. The LEDs are arranged so that the output beams all point straight out or normal to the face of the housing opening. The end result is a totally collimated beam with a very even beam output distribution representative of a flood output beam. A total of 181 LEDs equates to about 1014 total candela and about 19 watts of power. This array of LEDs shows some benefits when compared to a conventional 20-watt MR16 incandescent filament lamp giving off only 560 total candelas. The above configuration of 181 LEDs producing 1014 candela has an output equivalent of a 36 watt incandescent lamp when compared to a standard Continuum brand MR16 lamp made by Philips Lighting, for example, while consuming only 19 watts.

This improvement in energy output as compared to energy input proves itself in actual cost savings as related to energy conservation during the lifetime of the solid state light source when the savings that can be achieved in terms of kilowatt-hours are calculated. A 1000 watts divided by 19 watts yields 52.63. There are exactly 8,760 hours total in one year. If the total hours are divided by 52.63, the result is 166.45 hours. Using a kilowatt-hour cost rate of $0.13 multiplied by 166.45 hours yields an annual cost of $21.64 to operate the improved LED light source above. In comparison, the annual cost to operate a 36-watt incandescent lamp under the same values is $40.99. The difference is $19.35 a year in savings. During the course of the lifetime of 11 years for the improved solid state light source, the savings amount to $212.85. The savings will be even higher when the individual LED output also increases. LumiLeds Lighting claims future outputs of 5–20 candela are possible, and has announced on Feb. 26, 2001 that it will produce a single white LED with an output of seventeen lumens. This is four times more white light output than the best know white LED presently available.

It is to be noted that the direct power cost saving as calculated above does not include maintenance costs involved in replacing incandescent lamps every few hundred hours or so.

Halogen and incandescent lamps are used in packages known today in the lighting industry as A90, MR16, PAR16, PAR20, PAR30, PAR36, PAR38, PAR46, PAR56, and PAR64, as examples. Retrofitting these existing lamps with the LEDs directed at a common focal point as described above will offer longer life, lower heat, greater reliability, maintenance free handling and durability, and most importantly, energy savings and conservation.

It should be noted that the LEDs are not perfect point sources of light. As previously noted, each LED has a lens molded in front of a diode chip mounted in a reflector dish. In the above experiments, a 20-degree beam angle light output, or beam spread, was chosen for the LEDs. A tighter beam angle LED can be used. A narrower beam angle will give a better collection of light to a common focus point. Because of the beam spread, there will be some stray light lost within the substantially ellipsoidal housing. This stray light can be gathered and reflected to the front of the housing if the inside surface of the substantially ellipsoidal housing, or ellipsoidal mounting template that holds the LEDs, has a reflective coating applied. This reflective coating will further increase the efficiency of this already improved LED light source.

The above exercises demonstrate the following:
1. A substantially ellipsoidal housing offers the maximum surface for the implementation of a substantially larger array arrangement of LEDs.
2. Focusing all the LEDs in an ellipsoidal housing to a remote focal point produces a brighter spot, and thus a brighter light source, than is provided by incandescent lamps.
3. The LED directed to a remote focal point when used with an imaging gate aperture and at least one lens will provide an image projection lighting system significantly superior to an incandescent or other similar lighting systems.

A minor drawback at this time is the individual retail price of a single LED. The cost drops down a bit when purchasing in larger quantities, but presently, the overall cost is still high. At the time of this application, a single white LED from Nichia Corporation costs in the range of $0.80 even when buying in quantities of 100,000 pieces. The relative high cost of massed LEDs can be overcome in view of their energy savings and low current draw.

In addition, the direct generation of colored light by selection of the proper type of LEDs used may make redundant the need for colored lenses, with consequent improvements both in efficiency, visibility, and cost. One particular use is in display and general lighting applications, where the long life characteristics of LEDs, their suitability for repetitive switching, their lower temperature operation, and their higher efficiency all contribute to qualify them for such use. Owing to the achieved quality of compaction, and the durability of the units, particularly when assembled upon a printed circuit board, their use without extensive protective housings is possible. Such technology of LEDs increases their range of applicability.

Those skilled in the art will further appreciate the above-mentioned improvements and advantages, and the superior features of the invention upon reading the detailed description, which follows in conjunction with the drawings.

BRIEF DESCRIPTION OF THE DRAWINGS

FIG. 2 shows the present invention in a side view schematic representation with a support housing configured as a hollow volume wherein a plurality of light-emitting diodes (not shown) are so positioned that each diode light beam is directed to a diode light-organizing focal area, or target zone, and thereupon the diode generated light beam is directed to an illuminated area shown for purposes of exposition as a flat wall or screen;

FIG. 3 shows the present invention in a side view schematic representation in a configuration analogous to that shown in FIG. 2 further including a focusing lens with a diode light-organizing target zone located between the support housing and the focusing lens from which the diode-generated light beam is directed to an illuminated area shown as a flat wall or screen;

FIG. 4 shows the present invention in a side view schematic representation in a configuration analogous to that shown in FIG. 2 further including a collimating lens and a focusing lens with a diode light-organizing target zone located between the support housing and the collimating lens with the diode-generated light beam being directed from the collimating lens to a focusing lens that then directs the diode-generated light beam to an illuminated area shown as a flat wall or screen;

FIG. 5 shows the present invention in a side view schematic representation in a configuration analogous to that shown in FIG. 4 further including a collimating lens and a focusing lens with the diode light-organizing target zone being located between the collimating lens and the focusing lens;

FIG. 6 shows the present invention in a side view schematic representation in a configuration analogous to that shown in FIG. 4 further including a collimating lens and a focusing lens with an imaging gate having a gobo and/or shutter connected thereto and located between the housing and the collimating lens with the diode light-organizing target zone being located between the gate and the collimating lens with the focusing lens directing the diode-generated light beam to illuminated area shown as a flat wall or screen;

FIG. 7 shows the present invention in a side view schematic representation in a configuration analogous to that shown in FIGS. 5 and 6 with the diode light-organizing target zone being located between the collimating lens and the focusing lens;

FIG. 25 is a sectional side view of one of the electrical pin connectors shown in FIG. 24 mounted to the sandwich structure;

FIG. 28 is a partial sectioned side view of an embodiment of the present invention analogous to the view shown in FIG. 24 showing a single diode having two separate electrical connecting pins;

FIG. 29A is an isolated partially sectioned side view of a portion of the long pin shown in FIG. 28;

FIG. 29B is an isolated sectioned side view of the diode mount shown in FIG. 28;

FIG. 30 is a sectioned side view of is a schematic side view of another embodiment of the present invention analogous to the sandwich structure shown in FIG. 24 formed by a sandwich structure having a substantially planar configuration with two conductive cores interposed between layers foam insulating material with a plurality of LEDs removably mounted thereto by electrical pin connectors in contact with the conductive cores;

FIG. 30A is a sectioned side view detail of the diode and diode mount shown in FIG. 30;

Figure 1A:
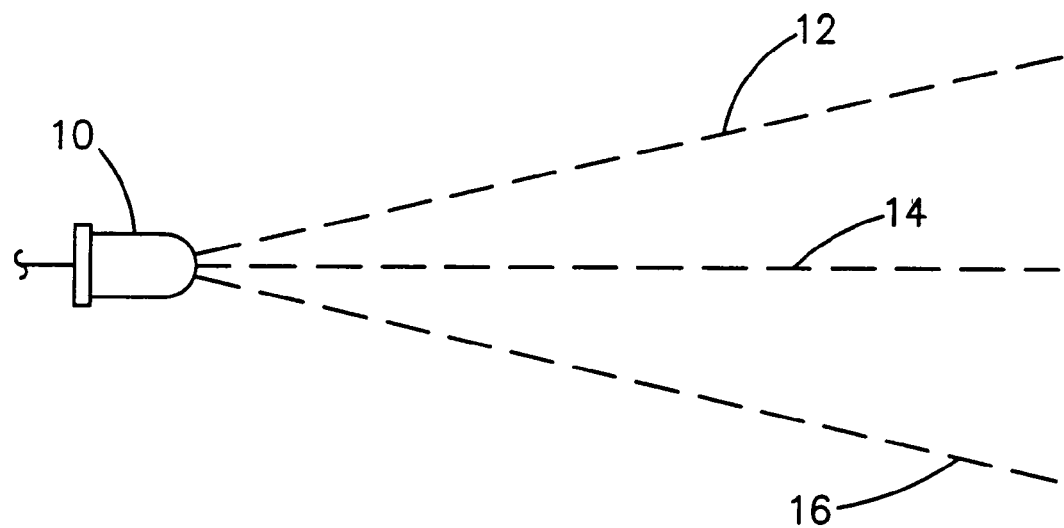
FIG. 1A shows an LED indicating a typical diode beam spread.
Figure 1B:
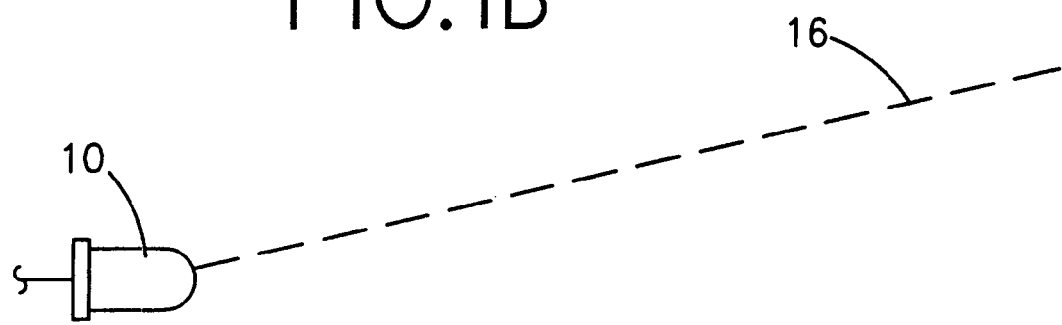
FIG. 1B shows the LED shown in FIG. 1A with a virtual single center light beam that is representative in the present application of the actual diode beam spread as shown in FIG. 1A.

The present invention will be better understood and the objects and important features, other than those specifically set forth above, will become apparent when consideration is given to the following details and description, which when taken in conjunction with the annexed drawings, describes, illustrates, and shows preferred embodiments or modifications of the present invention and what is presently considered and believed to be the best mode of practice in the principles thereof.

Other embodiments or modifications may be suggested to those having the benefit of the teachings therein, and such other embodiments or modifications are intended to be reserved especially as they fall within the scope and spirit of the subjoined claims.

DETAILED DESCRIPTION OF PREFERRED EMBODIMENTS OF THE INVENTION

Reference is now made in detail to the drawings and in particular to FIGS. 1–7 in which identical or similar parts are designated by the same reference numerals throughout.

FIG. 1A shows a typical light emitting diode (LED), or diode, 10 generating a diode beam 12 that comprises a diode central beam 14 and a typical diode beam spread 16 that typically ranges between approximately 50° to 70° in accordance with the specifications of various manufacturers. Most of the diode beam strength and brightness is contained in the course of this application in diode central beam 14 with the understanding that typical slight diode beam spread 16 is included as in FIG. 1B. FIGS. 2–7 show various configurations of an architectural, theatrical, and stage invention with each configuration being schematically represented as follows.

A basic configuration of the architectural, theatrical, and stage lighting system 18 in accordance with the present invention is shown in FIG. 2. Lighting system 18 includes a support housing, or frame, 20 configured as a hollow volume and defines a mounting surface wherein an array of light-emitting diodes exemplified by a diode 22 at the top rim of frame 20, a diode 24 at the bottom rim of frame 20, and a diode 26 positioned at the rear center of frame 20 are set forth. Each exemplary diode 22, 24, and 26 is so positioned in the schematic FIGS. 2–7 that each diode light beam generated by each diode of the total array of diodes including exemplary diodes 22, 24, and 26 is directed to a diode light-organizing focal area, or target zone, 28. The diode generated light beam is indicated in totality as a first diode-generated total light beam 30 that is shown along with an isolated central diode beam 32 emanating from center diode 26 for purposes of exposition. The diodes, except for center diodes at 26, are, therefore, skewed to the mounting surface of the mounting template. After a convergence of all diode-generated light beams at a target zone 28, diode first total light beam 30 becomes an expanding diode-generated second total light beam 34 including central diode light beam 32 which is directed to an illuminated area shown for purposes of exposition as a flat wall, or screen, 36. The position of target zone 28 relative to screen 36 determines the extent of the illumination, or wash, of screen 36. Support frame 20 is shown in the schematic side view of FIG. 2 as having an ellipsoidal shape for purposes of exposition, but other shapes, such as cone shaped, semi-spherical shaped, and flat are possible. The configuration of support frame 20 is coextensive with the configuration of the plurality array of diodes positions therein with each diode being directed to target zone 28.

Another configuration of architectural, theatrical and stage lighting system 18 is shown in FIG. 3. The configuration of lighting system 20 shown in FIG. 3 is analogous to that shown in FIG. 2 with the further inclusion of a focusing lens 38 with diode light-organizing target zone 28 being located between support frame 20 and focusing lens 38. First diode-generated total light beam 30 with central beam 32 passes through target zone 28 from where second diode-generated total light beam 34 with central beam 32 passes to focusing lens 38, which in turn directs a focused third diode-generated total light beam 40 including central diode beam 32 to flat screen 36.

Another configuration of architectural, theatrical and stage lighting system 18 is shown in FIG. 4, which is analogous to that shown in FIGS. 2 and 3. FIG. 4 further includes a collimating lens 42 with diode light-organizing target zone 28 being located between frame 20 and collimating lens 42. First total diode-generated light beam 30 including central diode beam 32 is directed from frame 20 to target zone 28 from where second diode total light beam 34 including central diode beam 32 passes to collimating lens 42. A third diode light beam 44, which is a collimated light beam with diode central light beam 32, is directed from collimating lens 42 to focusing lens 38 that then directs a fourth diode total light beam 46 including diode central beam 32 to illuminated flat wall or screen 36.

Another configuration of architectural, theatrical and stage lighting system 18 is shown in FIG. 5, which is analogous to that shown in FIG. 4 and includes a virtual diode focus area, that is, a virtual light-organizing target zone 28A, located between the collimating lens 42 and the focusing lens 38. First diode-generated light beam 36 with central diode beam 32 is directed from frame 20 to collimating lens 42. Third diode total light beam 44, which is a collimated light beam with diode central light beam 32, is directed from collimating lens 42 to focusing lens 38 from where a fourth diode-generated light beam 46 with diode central beam 32 is directed to illuminated flat wall or screen 36.

Figure 8:
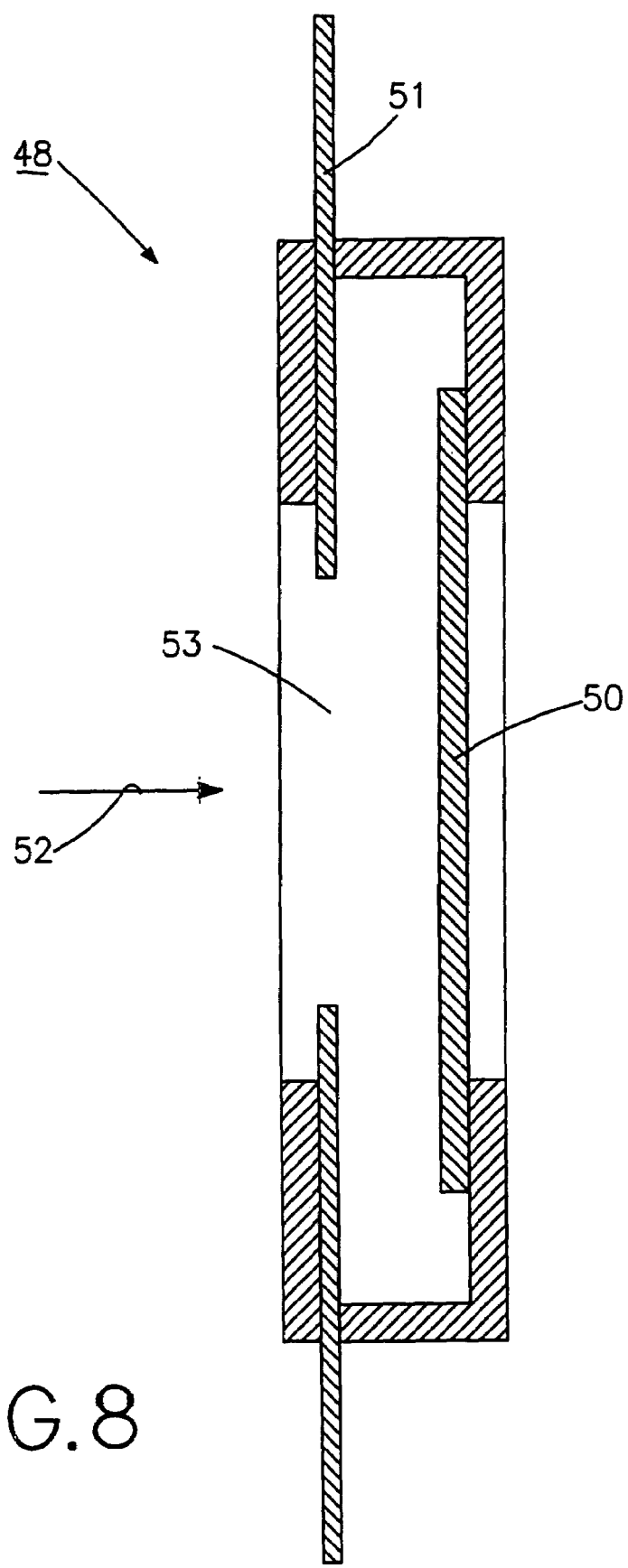
FIG. 8 shows a schematic sectional side view of the imaging gate as shown in FIGS. 6 and 7 further including a gobo and a shutter also indicated schematically.

Another configuration of architectural, theatrical and stage lighting system 18 is shown in FIG. 6, which is analogous to the configuration shown in FIG. 4 and includes a fixed imaging gate 48 positioned between frame 20 and collimating lens 42. Imaging gate 48 generally has a gobo 50 and a shutter blade 51 connected thereto as shown in FIG. 8. A diode light-organizing target zone 28 is located between imaging gate 48 and collimating lens 42. An imaged first diode total light beam 30A including diode central beam 32 is directed from frame 20 to focusing zone 28 and then by an inverted second beam 45 to collimating lens 42. A third diode total light beam 44, which is a collimated light beam along with diode central light beam 32, is directed from collimating lens 42 to a focusing lens 38 that then directs a focused fourth diode total light beam 46 with diode central beam 32 to flat wall or screen 36.

Another configuration of architectural, theatrical and stage lighting system 18 is shown in FIG. 7, which is analogous to FIGS. 5 and 6. A virtual diode light-organizing target zone 28C is located between collimating lens 42 and focusing lens 38. Imaging gate 48 optionally includes gobo 50 and a shutter 51 as shown in FIG. 8. A virtual focal area, or virtual diode light-organizing target zone, 28C is located between collimating lens 42 and focusing lens 38. Imaged first diode light beam 30A with diode central beam 32 is aimed from frame 20 to virtual target zone 28C. Imaged first beam 30A encounters intervening collimating lens 42 from where a collimated second diode-generated total light beam 44 is directed to focusing lens 38 that then directs fourth diode total light beam 46 with diode central beam 32 to illuminated flat wall or screen 36.

A schematically indicated imaging gate 48 shown in FIG. 8 includes a gobo 50 and a shutter 51 both of which are known in the art of architectural, theatrical and stage lighting with an expanding light beam 52 indicated as entering gate aperture 53.

Figure 9:
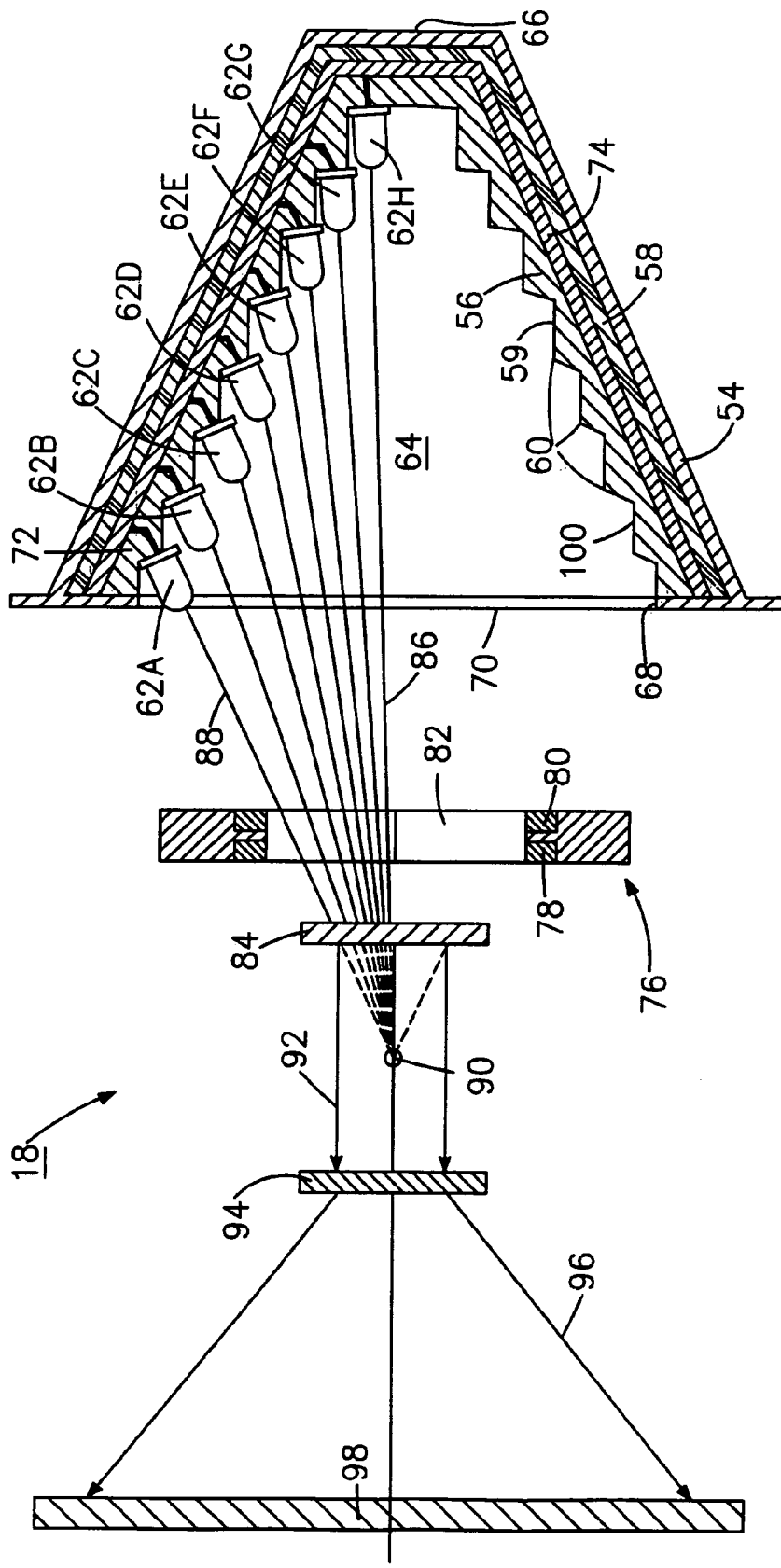
FIG. 9 is a schematic side view of a lighting system comprising a mid-sectioned cone-shaped hollow volume configured as a housing with a mounting template positioned in the housing with a circuit board mounted in the housing in association with the mounting template with a plurality of LEDs individually secured to the mounting template with each LED having a diode-generated light beam directed through an imaging gate towards a diode light beam-organizing target zone located between a collimating lens and a focusing lens as generally shown in FIG. 5 with the light beams being directed first to the collimating lens and thereupon directed to the focusing lens and then to a display surface.

An architectural, theatrical and stage lighting system 18, which is analogous to the stage lighting system 18 as that shown in various configurations in FIGS. 2–7 is shown in FIG. 9 in a detailed configuration in a schematic side view. For purposes of clarity of exposition, only one-half of the diodes are shown with the understanding that the sectioned diodes represent the total diode array of FIG. 9. Lighting system 18 as shown in FIG. 9 includes a mid-sectioned hollow volume configured as a cone-shaped nonconductive housing, or frame 54. A cone-shaped nonconductive diode mounting template 56 is positioned in the hollow volume of frame 54. An electrical circuit board 58 that transmits and controls direct current electrical voltage is configured as a cone is also mounted in frame 54. Mounting template 56 includes a plurality of graduated steps 60 that are located over the entire inner surface 59 area of mounting template 56. Light emitting diodes (LEDs) are placed in mounting steps 60 in a compact as possible array of diodes. In the particular array shown in FIG. 9, diodes indicated as diodes 62A–62H, eight of which shown sectioned in the exemplary midview of FIG. 9, can be individually removed and secured to each of the plurality of mounting steps 60 by manner known in the art, for example by gluing, to mounting steps 60. The total number of diodes that is in the exemplary configuration of FIG. 9 totals 108, the arrangement of each being indicated in a flat, pre-mounted alternative circuit board blank 158 shown in FIG. 13 that shows an arrangement of diodes that is analogous to the rigid circuit board 58 shown in FIG. 9. An array of 108 diodes are mounted at the inner surface of mounting template 56 in a configuration of eight concentric rings onto graduated steps 60 as follows: 20 diodes in a circular configuration around the outer rim of cone-shaped mounting template 56 as represented by exemplary diode 62A; 20 diodes in a circular configuration inwardly concentric with diodes 62A and as represented by exemplary diode 62B; 16 diodes 62C in a circular configuration inwardly concentric with diodes 62B as represented by exemplary diode 62C; 16 diodes 62D in a circular configuration inwardly concentric with diodes 62C as represented by exemplary diode 62D; 12 diodes 62E in a circular configuration inwardly concentric with diodes 62D as represented by exemplary diode 62E; 12 diodes 62F in a circular configuration inwardly concentric with diodes 62E as represented by exemplary diode 62F; 8 diodes 62G in a circular configuration inwardly concentric with diodes 62F as represented by exemplary diode 62G; and a most inward 4 diodes 62H inwardly concentric with diodes 62G as represented by exemplary diodes 62H.

Mounting template 56 itself is configured so as to define a hollow volume, in particular being configured as a cone-shaped volume 64 having a vertex 66 and a periphery, or rim, 68 that defines a circular aperture 70. Cone-shaped volume 64 is functionally coextensive with the cone-shaped volume defined by cone-shaped frame 54. Cone-shaped volume 64 of mounting template 56 has a cone inner volume surface that is functionally coextensive with graduated steps 60. Plurality of diodes 62A–62H mounted to steps 60 themselves form another cone-shaped volume that is functionally coextensive with cone-shaped mounting volume 64. Each diode of plurality of diodes 62A–62H is provided with electrical leads 72 that are in electrical connection with circuit board 58. Each circular configuration of the eight concentric rings formed by diodes 62A, 62B, 62C, 62D, 62E, 62F, 62G, and 62H define planes parallel to one another and parallel to the plane defined by rim 68. An optional intervening cone-shaped mounting board 74 is positioned between mounting template 56 and frame 54. Each of diodes 62A–62H are provided with electrical leads 72 to circuit board 58. It is noted that a slight clearance at leads 72 between diodes 62A–62H and mounting board 74, or circuit board 58, as the case may be, is recommended, so that the epoxy bulb (not shown) at the base of each diode and thus the diode chip itself is not damaged from excessive heat during the soldering process of connection. This clearance is typically no less than 3 mm. Inner surface 59 of mounting template 56 can be coated with a layer of light reflecting substance 100 to further enhance the collection of any scattered light beams within cone-shaped volume 64.

A fixed imaging gate 76 analogous to fixed imaging gate 48 is positioned proximate to frame 54. Imaging gate 76 has mounted thereto a gobo 78 and a shutter blade 80 both indicated schematically as shown in FIG. 9. Imaging gate 76 has a fixed gate aperture 82. A collimating lens 84 is positioned down from imaging gate 76 and a focusing lens 94 is positioned spaced from collimating lens 84. Each discrete center beam 86 from each of diodes 62A–62H passes through gate aperture 82 and the totality of diode light beams creates a first total diode light beam 88 that passes through imaging gate aperture 82. First total diode light beam 88 substantially fills the areas around gate aperture 82 to produce an even coverage of light.

In accordance with the present invention, each of the array of 108 diodes 62A–62H is independently positioned at its own graduated step 60 at a preset angle so that each discrete light beam 86 is directed at a focal point, or target zone, 90 so that the totality of diode beams converge towards target zone 90. In the particular configuration of lighting system 18 shown in FIG. 9, a first total light beam 88, which is a converging beam, passes through imaging gate aperture 82 and thereafter encounters intervening collimating lens 84 from where a collimated second diode-generated total light beam 92 is directed to a focusing lens 94 that then directs a focused third diode-generated light beam 96 to a screen 98. When focused third diode-generated light beam 96 strikes screen 98 an image created at imaging gate 76 is focused on screen 98. The image that is created is related to the shape of gate aperture 82 in itself, or is related to the shape of a gobo pattern made by gobo 78 located in gate aperture 82, or is related to the shape of a light beam made by a shutter blade 80 located in gate aperture 82. Collimating lens 84 and focusing lens 94 are movable within the optical lighting system by means known in the art so that third total diode light beam 96 can zoom and focus the gobo pattern or shutter blade shape or other such shaping object located at imaging gate 76 onto screen 98. Screen 98 is merely representative of other possible objects to illuminate, such as a person or a decorative construct.

In the configuration of lighting system 18 shown in FIG. 9, focal point, or target zone, 90 is a virtual, or imaginary focal point or target zone since the beams of first total light beam 88 never reach that zone. Target zone 90 nonetheless achieves the function of the present invention for the reason that the paths of the totality of the 108 discrete light beams generated by diodes 62A–62H become organized in intensity and direction by their orientation towards target zone 90. The organization of first total diode light beam 88 is accomplished by each of diodes 62A–62H being positioned in graduated steps 60, which are structured to orient each diode beam of diodes 62A–62H towards target zone 90.

Figure 10:
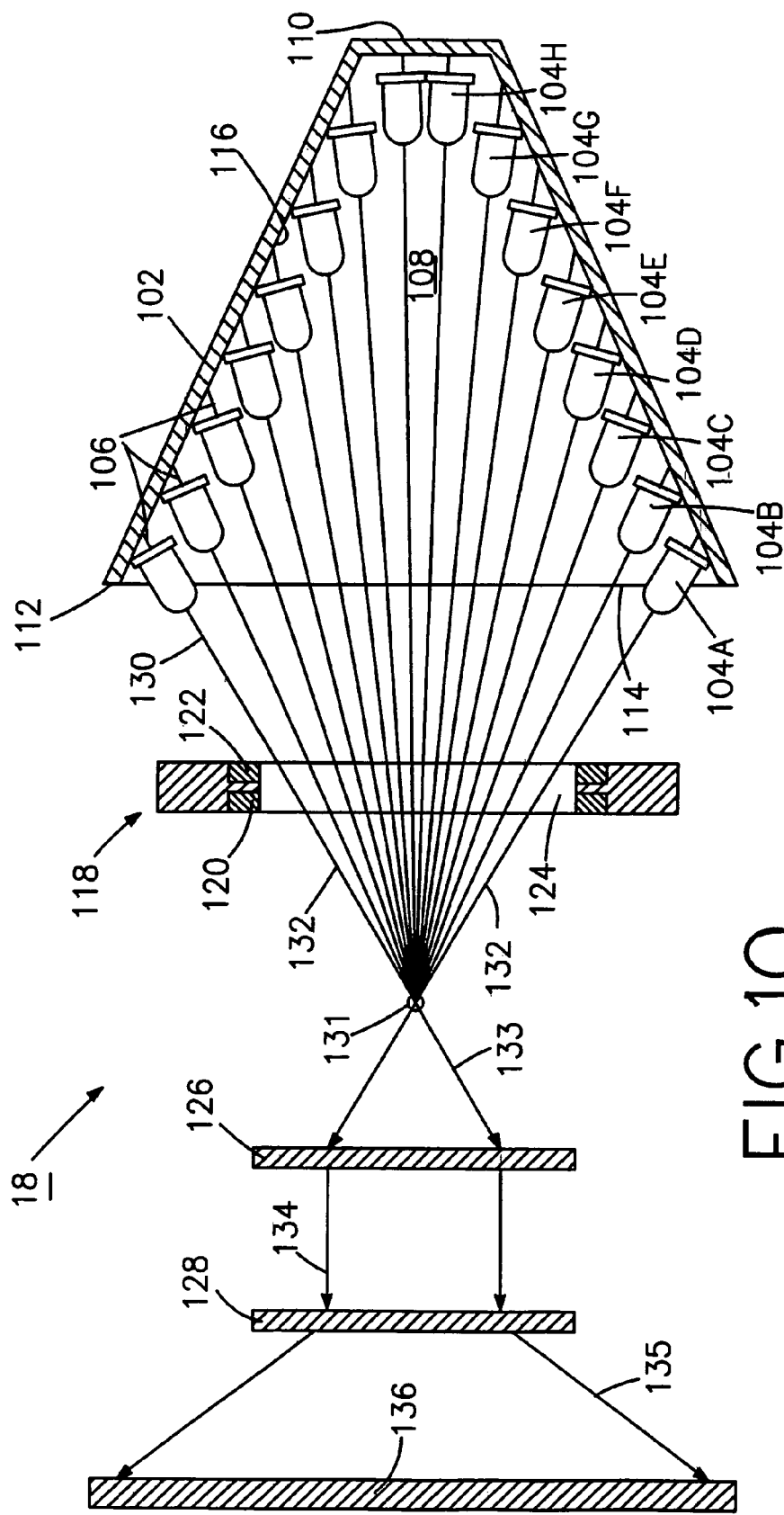
FIG. 10 is a view analogous to FIG. 9 with the LEDs being mounted onto a circuit board housing that also functions as a mounting template with a diode beam-organizing target zone located between an imaging gate and a collimating lens.
Figure 13:
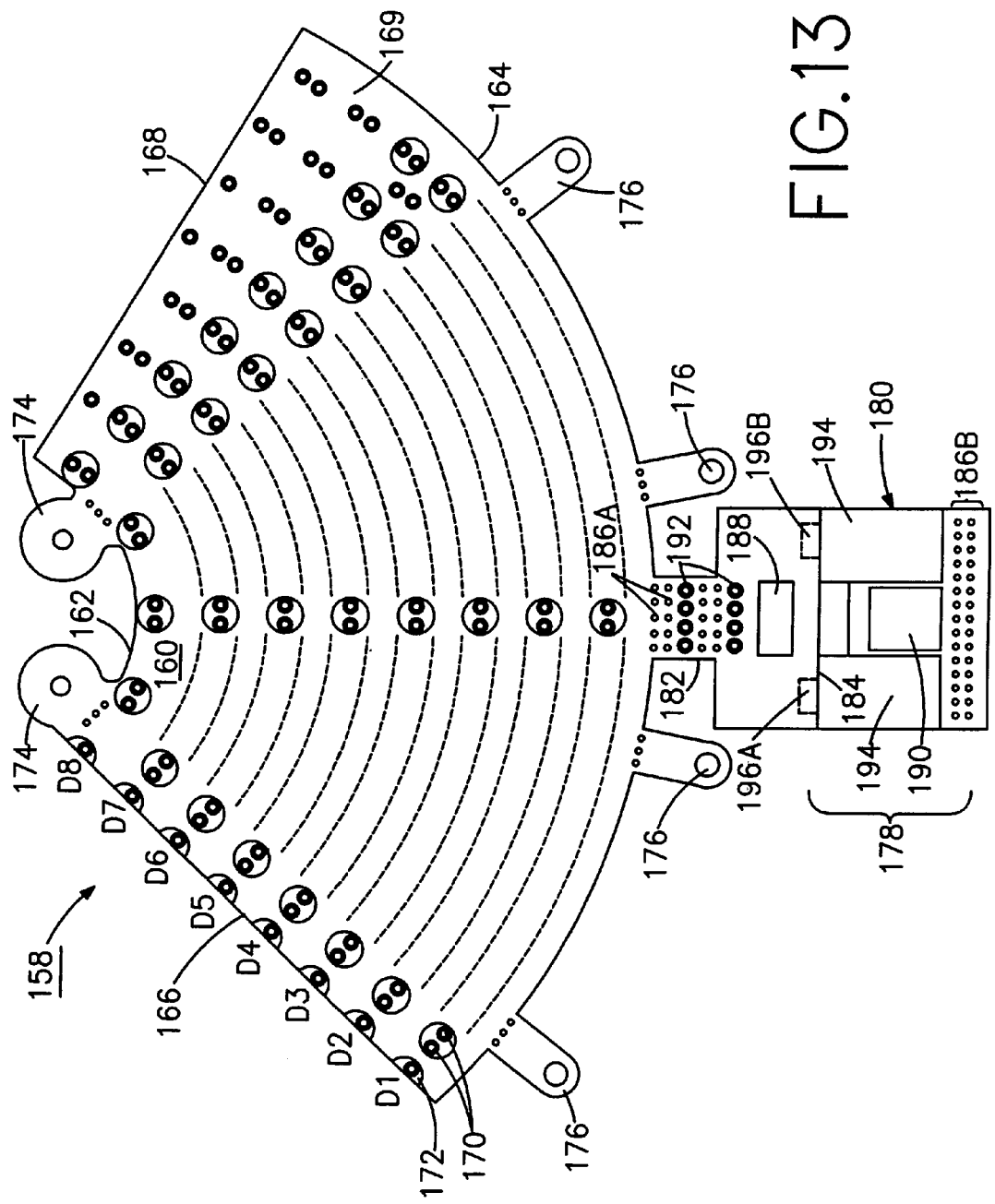
FIG. 13 is a top view of a flexible blank prior to being shaped into a rigid cone-shaped configuration of a rigid combination circuit board, mounting template and housing such as shown in FIG. 10 and further includes an electrical control system.

Another embodiment or configuration of architectural, theatrical and stage lighting system 18 is shown in FIG. 10 in a detailed configuration in a schematic side view. Lighting system 18 as shown in the configuration of FIG. 10 is analogous to FIGS. 4 and 9 and includes a unitary housing/diode frame/circuit board 102 that defines a hollow volume configured as a cone-shaped nonconductive housing that also functions both as a mounting frame for securing an array of 108 light emitting diodes indicated as diodes 104A–104H and also functions and also as an electrical circuit board. Unitary housing/diode frame/circuit board 102 is made of a nonconductive material that maintains a rigid cone-shaped configuration. The array of diodes indicated as diodes 104A–104H, eight of which are shown sectioned in the midview of FIG. 10, are individually secured to unitary housing/diode frame/circuit board 102 by stiff electrical leads 106 that are in electrical connection with the circuit board function thereof. A thin flat flexible blank 158 shown in FIG. 13 is subsequently rolled to a cone shape and secured at its side to achieve rigid unitary housing/diode frame/circuit board 102 shown in FIG. 10. Diodes 104A–104H are mounted as compactly as possible at the inner surface of cone-shaped housing/diode frame/circuit board 102 by stiff electrical leads 106. It is noted that a slight clearance at leads 106 between diodes 104A–104H and unitary housing/frame/circuit board 102 is preferred so that the epoxy bulb (not shown) at the base of each diode and thus the diode chip itself is not damaged from excessive heat during the soldering process of connection. This clearance is typically no less than 3 mm unitary from housing/diode frame/circuit board 102.

Diodes 104A–104H are mounted in a configuration of eight concentric rings as follows: 20 diodes in a circular configuration around the circular outer rim of cone-shaped housing/diode frame/circuit board 102 as represented by exemplary diode 104A; 20 diodes 104B in a circular configuration inwardly concentric with diodes 104A and as represented as exemplary diode 104B, 16 diodes 104C in a circular configuration inwardly concentric with diodes 104B as represented by exemplary diode 104C, 16 diodes 104D in a circular configuration inwardly concentric with diodes 104C as represented by exemplary diode 104D; 12 diodes 104E in a circular configuration inwardly concentric with diodes 104D as represented by exemplary diode 104E; 12 diodes 104F in a circular configuration inwardly concentric with diodes 104E as represented by exemplary diode 104F; 8 diodes 104G in a circular configuration inwardly concentric with diodes 104F as represented by exemplary diode 104G; and a most inward 4 diodes 104H inwardly concentric with diodes 104G as represented by exemplary diode 104H.

Unitary housing/diode frame/circuit board 102 itself is configured so as to define a hollow volume, in particular being configured as a cone-shaped volume 108 having a vertex 110 and a periphery, or rim, 112 that defines a circular aperture 114. Cone-shaped volume 108 has a cone inner volume surface 116 that receives diodes 104A–104H. Plurality of diodes 104A–104H themselves form another cone-shaped volume that is functionally coextensive cone-shaped volume 108. Each circular configuration of the eight concentric rings formed by diodes 104A, 104B, 104C, 104D, 104E, 104F, 104G, and 104H define planes parallel to one another and parallel to the plane defined by rim 112.

A fixed imaging gate 118 is positioned proximate to unitary housing/diode frame/circuit board 102. Imaging gate 118 is analogous to imaging gate 48 shown in FIG. 8 and has mounted thereto a gobo 120 and a shutter blade 122 both indicated schematically. Imaging gate 118 has a fixed gate aperture 124. A collimating lens 126 is positioned down from imaging gate 118 and a focusing lens 128 is positioned further down from collimating lens 126. Each discrete beam 130 from each of diodes 104A–104H passes through gate aperture 124 and the totality of light beams creates a first total diode generated light beam 132 that passes through imaging gate aperture 124. First total diode light beam 132 substantially fills the areas around gate aperture 124 to produce an even coverage of light.

In accordance with the present invention, each of the array of 108 diodes 104A–104H is independently positioned by its own stiff electrical lead 106 at inner volume surface 116 at a preset angle so that each discrete light beam 130 is directed at a focal point, or target zone 131, so that the diode beams converge at target zone 131. In the particular configuration of lighting system 18 shown in FIG. 10, first total light beam 132, which is a converging beam, passes through imaging gate aperture 124 to target zone 131 where the beam is inverted and thereafter becomes second total diode light beam 133 and then encounters intervening collimating lens 126 from where a collimated third total diode light beam 134 is directed to a focusing lens 128 that then directs a focused fourth diode-generated light beam 135 to a screen 136. When focused fourth diode-generated light beam 135 strikes screen 136, an image created at imaging gate 124 is focused on screen 136. The image that is created is related to the shape of gate aperture 124 itself, or is related to the shape of a gobo pattern made by gobo 120 located in gate aperture 124, or is related to the shape of a light beam made by a shutter blade 122 located in gate aperture 124. Collimating lens 126 and focusing lens 128 are movable within the optical lighting system by means known in the art so that third light beam 134 can zoom and focus the gobo pattern or shutter blade shape or other such shaping object located at imaging gate 118 onto screen 136. Screen 136 is merely representative of other possible objects to illuminate, such as a person or a decorative construct.

Target zone 131 achieves the function of the present invention for the reason that the paths of the totality of the 108 discrete light beams generated by diodes 104A–104H become organized in intensity and direction by their orientation towards target zone 131. The organization of first total diode light beam 132 is accomplished by each of diodes 104A–104H.

FIGS. 11, 12A, 12B, 12C, 12D and 12E indicate a method of calculation related to the positioning diodes mounted in a cone-shaped diode frame 140 analogous to the cone-shaped volumes shown in FIGS. 9 and 10 particularly indicated as cone-shaped frames 54 and 102.

Figure 11:
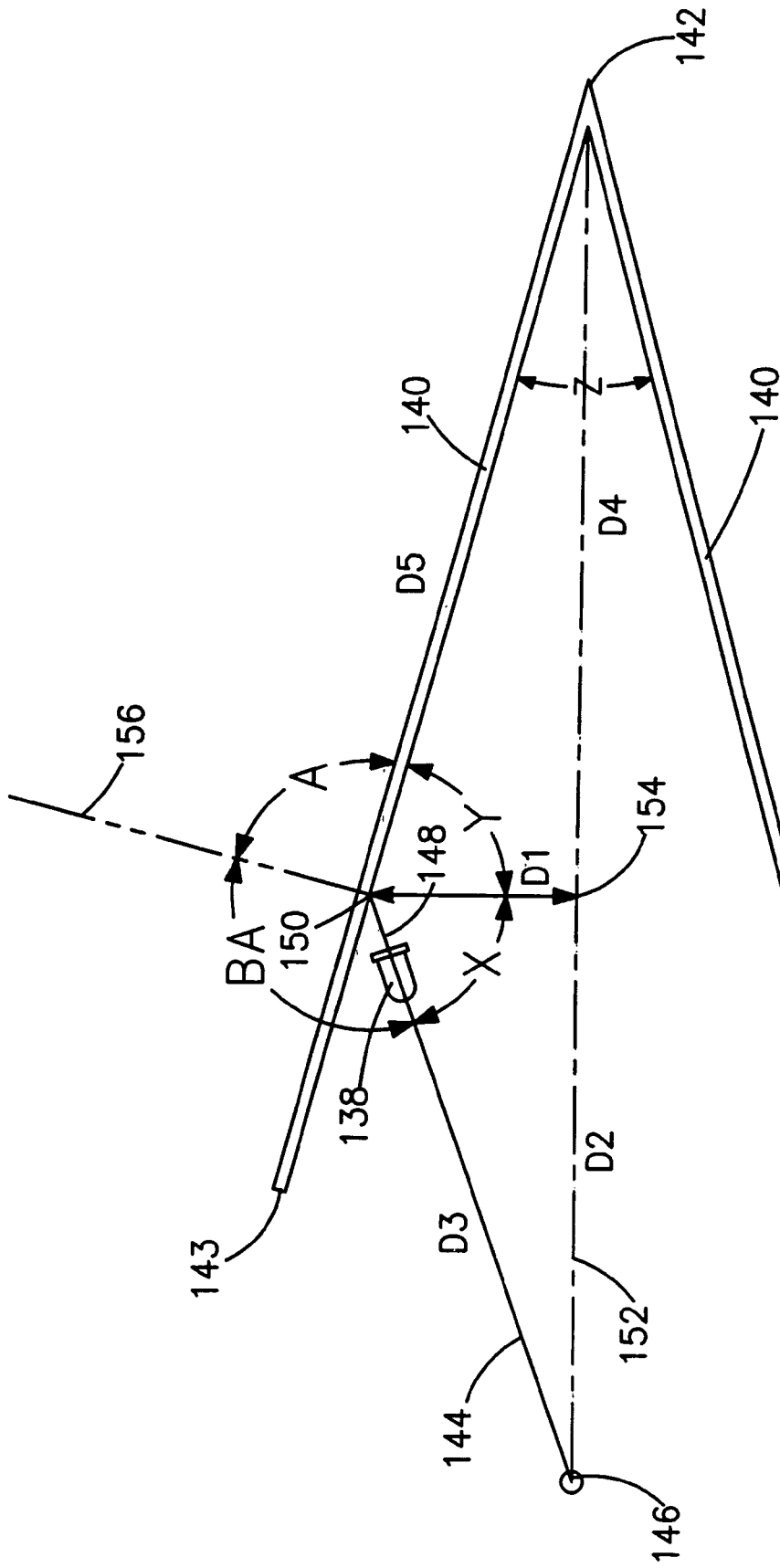
FIG. 11 is a schematic mid-sectioned side view of a conical LED arrangement showing a single exemplary diode mounted to a circuit board-type template configured as a conical volume such as that shown in FIGS. 9 and 10 with a diode light beam directed to a diode light-beam target zone and further showing formulaic distances D1, D2, D3, D4, and D5 and formulaic angles X, Y, Z for calculating the bend angle BA relative to the conical template wall for the exemplary diode so as to direct the diode light beam to a diode light-organizing target zone and further showing bend angle BA.

FIG. 11 shows in a schematic side view an isolated exemplary diode 138 shown for purposes of exposition mounted to a cone-shaped diode frame 140 having a defined cone vertex 142 analogous in general to the cone vertex areas shown in FIGS. 9 and 10. Exemplary diode 138 generates a discrete diode beam 144 that is directed to a predetermined focal point, or target zone 146. A stiff electrical lead 148 for diode 138 such as stiff electrical leads 106 shown in FIG. 10 is connected to frame 140 at a lead connecting point 150. An imaginary cone center line, or cone axis, 152 extends from cone vertex 142 to target zone 146. A distance D1 extends between lead connecting point 150 perpendicular to axis 152 at an axial point 154. A distance D2 extends between target zone 146 and axial point 154. A distance D3 extends between lead connecting point 150 and target zone 146. A distance D4 measured along diode frame 140 extends between cone vertex 142 and lead connecting point 150. A distance D5 extends between cone vertex 142 and lead connecting point 150. An angle X is defined between distance D1 and diode beam 144, also indicated as distance D3. An angle Y is defined between distance D1 and frame 140 at distance D5. An angle Z is defined between cone axis 152 and cone frame 140. A beam angle indicated as beam angle BA as diode beam D3, also indicated as distance D3, and an imaginary line 156 extending perpendicularly outwardly from frame 140 at lead connecting point 150 indicated as a 90° angle A defined between frame 140 and imaginary line 156. The sum of beam angle BA, angle A, angle X and angle Y is 360°.

FIGS. 12A–12D indicate in schematic cross-section eight concentric diode rings mounted to cone-shaped diode frame 140 with a with a single central diode 138 located at cone vertex 142. FIGS. 12A–12E are directly related to the schematic of FIG. 11 and show hypothetical distances for schematic distances D1, D2, D3, D4 and D5 and the resulting calculation of angles X, Y, Z and BA as a result of the hypothetical distances. The calculation of the angles of eight equally spaced diodes 38 relative to frame 140 as directed to a target zone 146 of any diode in the various configurations of lighting system 18 described in relation to FIGS. 11, 12A–12E can be applied to the calculation of diode angles in any of various configurations of the hollow volumes other than a cone-shaped hollow volume.

Figure 12:
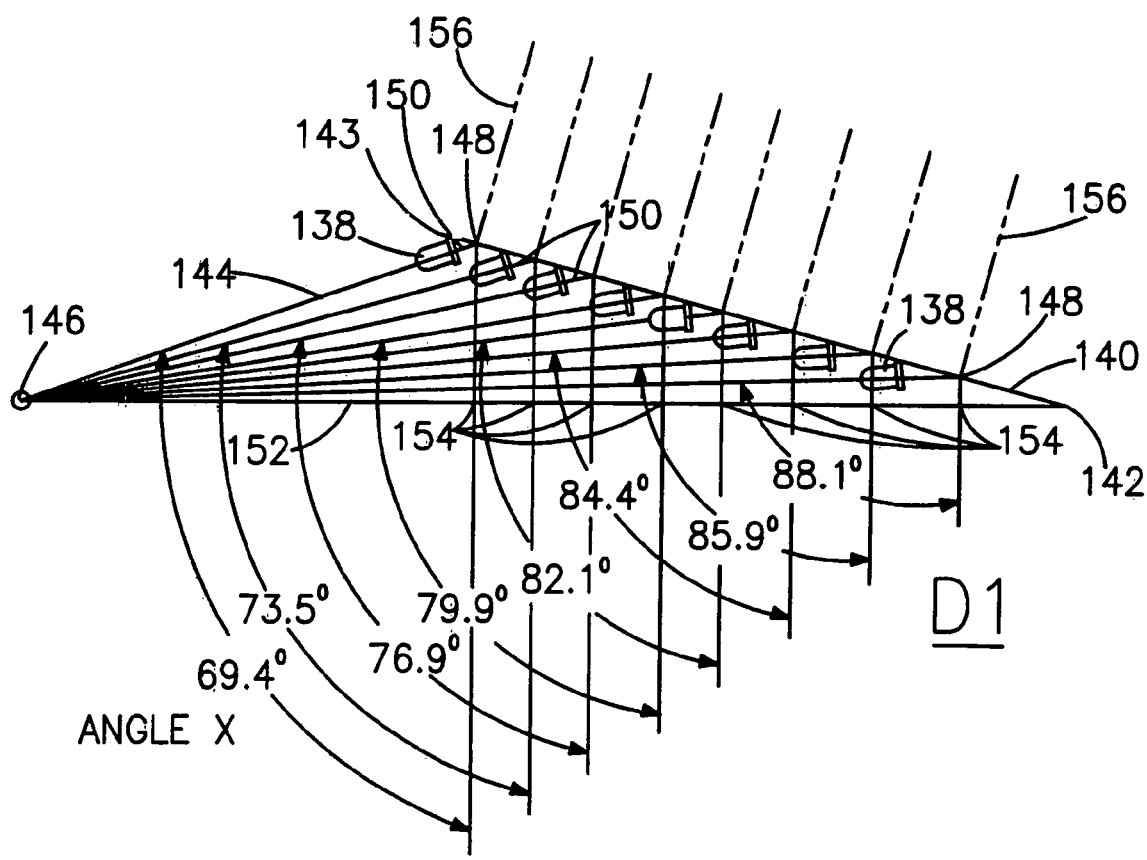
FIG. 12A is a schematic side view of the conical LED arrangement as shown in FIG. 11 with selected sectioned diodes of a diode array aligned with the single exemplary diode shown in FIG. 11 and further showing exemplary distances related to the formulaic distances D1 and D2 shown in FIG. 11.
FIG. 12B is a schematic side view of the conical LED arrangement as shown in FIGS. 11 and 12A with further sectioned diodes aligned with the single exemplary diode shown in FIG. 11 and further showing exemplary distances related to the formulaic distances D1 and D4 shown in FIG. 11.
FIG. 12C is a schematic side view of the conical LED arrangement as shown in FIGS. 11, 12A and 12B and further showing each angle X for each diode related to the formulaic angle X shown in FIG. 11.
FIG. 12D is a schematic side view of the conical LED arrangement as shown in FIGS. 11, 12A, 12B, and 12C and further showing the each angle Y for each diode related to the formulaic angle Y shown in FIG. 11.

FIG. 12A shows hypothetical distances D1 of eight equally spaced diodes 138 mounted to a cone-shaped frame 140 as related to distances D1 and D2 for each diode 138 as related to the schematic as shown in FIG. 11. Starting with the diode 138 proximate to cone rim 143 and continuing to the diode 138 proximate to cone apex 142 the distances D1 and D2 are as follows: 1.0 inch and 2.7 inches respectively; 0.9 inch and 3.1 inches respectively; 0.8 inch and 3.4 inches respectively; 0.7 inch and 3.9 inches, respectively; 0.6 inch and 4.2 inches, respectively; 0.5 inch and 4.7 inches, respectively; and 0.4 inch and 5.0 inches, respectively; and 0.2 inch and 5.7 inches, respectively.

FIG. 12B shows hypothetical distances D1 of eight equally spaced diodes 138 mounted to cone-shaped frame 140 as related to distances D1 and D4 for each diode 138 as related to the schematic shown in FIG. 11. Starting with the diode 138 proximate to cone rim 143 and continuing to the diode 138 proximate to cone apex 142 the distances D1 and D4 are as follows: 1.0 inch and 3.6 inches, respectively; 0.9 inch and 3.3 inches, respectively; 0.8 inch and 2.9 inches, respectively; 0.7 inch and 2.5 inches, respectively; 0.6 inch and 2.1 inches, respectively; 0.5 inch and 1.7 inches, respectively; and 0.4 inch and 1.3 inches, respectively; and 0.2 inch and 0.7 inch, respectively.

FIG. 12C shows eight hypothetical angles X for each diode 138 as related to the schematic as shown in FIG. 11. Starting with the diode 138 proximate to cone rim 143 and continuing to the diode 138 proximate to cone apex 142 each angle X is calculated in accordance with the following formula as follows: Angle X=arctan D2/D1. For example the angle X for the diode 138 most proximate to rim 143 is 2.7 in./1.0 in.=2.7=69.4°. In an analogous manner the subsequent seven angles are determined as 73.5°, 76.9°, 79.9°, 82.1°, 84.4°, 85.9°, and 88.1°. Round off methodology is used to arrive at the calculated angles.

Figure 12D:
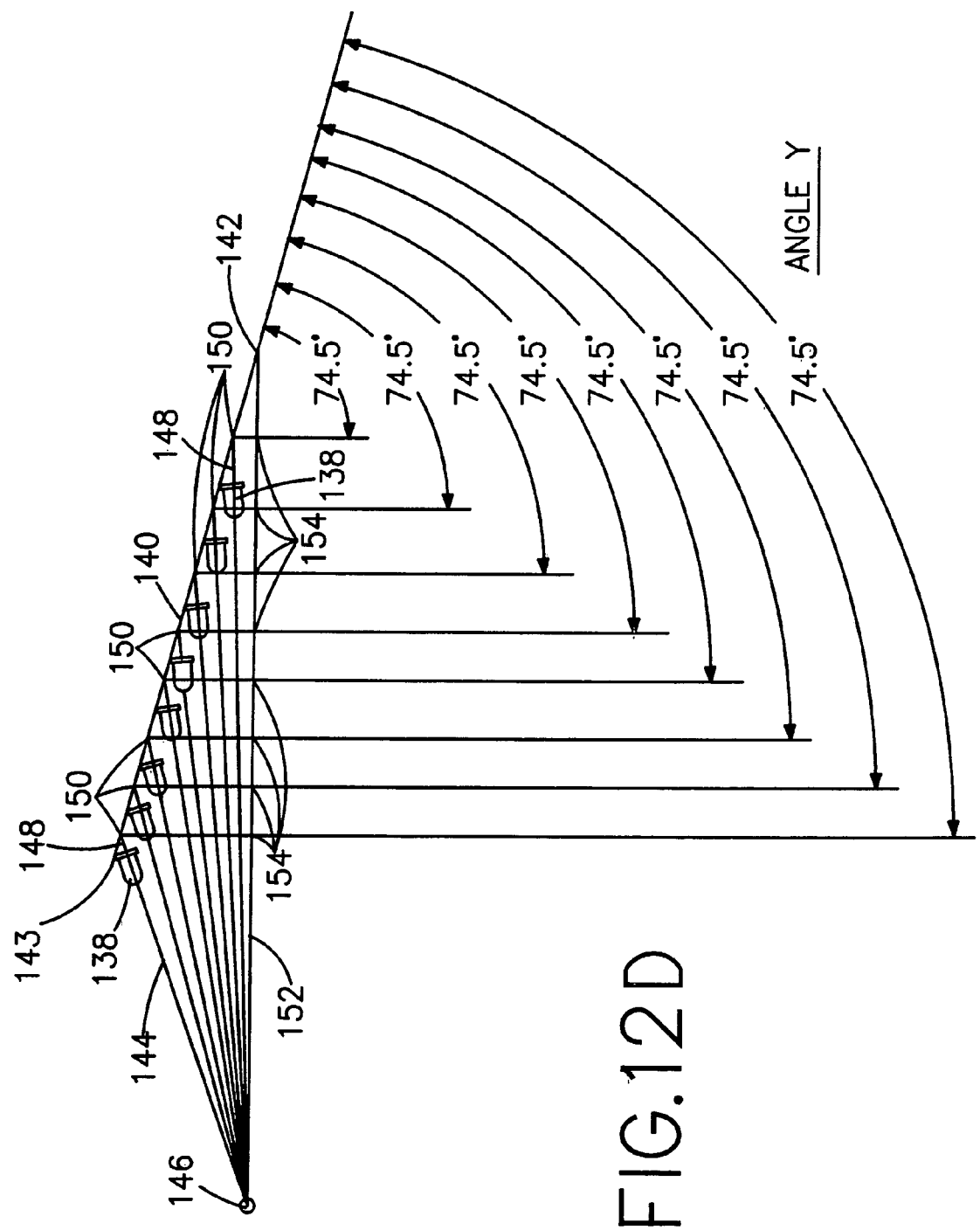

FIG. 12D shows eight hypothetical angles Y for each diode 138 as related to the schematic as shown in FIG. 11. Starting with the diode 138 proximate to cone rim 143 and continuing to the diode 138 proximate to cone apex 142 each angle Y is calculated in accordance with the following formula as follows: Angle Y=arctan D4/D1. For example the angle Y for the diode 138 most proximate to rim 143 is 3.6 in./1.0 in.=3.6=74.5°. In an analogous manner the subsequent seven angles are all determined as 74.5°. Round off methodology is used to arrive at the calculated angles.

FIG. 13 shows a top view of a flexible thin flat blank 158 prior to being formed by wrapping to form rigid cone-shaped unitary housing/diode frame/support circuit board 102 as shown in FIG. 10. Blank 158 is made of a nonconductive material, for example, a polyimide material that can withstand high temperatures during a soldering process. The preferred thickness of blank 158 is approximately 0.01 inches but the thickness might range generally between a lower end thickness of 0.0005 inch and an upper end thickness of 0.0625 inch depending on the material used. Other materials that can be used include Mylar and polyester.

Blank 158 has opposed flat sides with a top side 160 shown and a bottom side (not shown). Top side 160 is the designated inner mounting surface for diodes 104A–104H. Blank 158 includes an inner curved, or arced, edge 162 that is designated to be the vertex 110 of unitary cone-shaped circuit board 102 and an outer curved, or arced, edge 164 concentric with inner curved edge 162 that is designated to be the base, or rim 112 of unitary cone-shaped circuit board 102. Blank 158 further includes left and right linear side edges 166 and 168 as positioned in the view of FIG. 13 that are designated to be joined when cone-shaped unitary circuit board 102 is formed. An overlap area 169 is provided along right linear side edge 168 of flexible circuit board 158 adjacent to right linear side edge 168 for a more rigid support when flexible blank 158 is formed into a rigid cone shape. Provisions are made in blank 158 for eight concentric ring formations for diodes D1–D8 having 108 paired electrical lead passages 170 aligned with solder pads 172 attached to top side 160 and also with aligned solder pads (not shown) attached to the opposed bottom side of blank 158.

Blank 158 defines 108 paired passages 170 for rigid electrical leads such as rigid electrical leads 106 as shown in FIG. 10 and lead 148 as shown in FIG. 11. Diodes D1–D8, or diodes 104A–104H, as the case may be, are to be mounted at passages 170 in a configuration as discussed in relation to FIGS. 10 and 11, respectively. Paired passages 170 are formed in concentric curved configurations so that after forming of flexible blank 158 into a rigid cone shape become annular configurations as shown in FIGS. 10 and 11. Eight curved configurations are shown in FIG. 13 as a first outer curve of 20 lead holes 170, a second inward curve of 20 lead holes 170, a third inward curve of 16 lead holes 170, a fourth inward curve of 16 lead holes 170, a fifth inward curve of 12 lead holes 170, a sixth inward curve of 12 lead holes 170, a seventh inward curve of 8 lead holes, and an eighth most inward curve of 4 lead holes 170. The eight curved configurations accommodate diodes 104A–104H respectively of FIG. 10 and of diodes D1–D8 respectively of FIGS. 12A–12D.

Blank 158 includes a pair of mounting tabs 174 extending outwardly from arced inner edge 162 and four mounting tabs 176 extending outwardly from arced outer edge 164. Mounting tabs 174 and 176 are optionally included for attachment to an optional insulated outer cap, or cover (not shown) that can be used to cover and protect the formed rigid mode of unitary circuit board 102 as shown in FIG. 10. The optional outer cover will also provide safety and isolation for protruding portions of electrical leads 106 and 148 as the case may be from external exposure. Mounting tabs 174 and 176 can also be used to secure flexible blank 158 when in the rigid fully formed mode to an optional lamp housing or to an mounting fixture (not shown).

Blank 158 optionally is unitary with electronics for controlling the current related to diodes D1–D8. Control circuitry 178 can be mounted on a control electronics circuit board that is unitary with flexible blank 158 at a connecting portion 182. Alternatively, control circuitry can be provided remotely on a separate circuit board. A bridge rectifier 188 converts alternating current input voltage 190 at either of optional input electrical lead passages to direct current voltage that is directed to diodes D1–D8 by input/output leads positioned at electrical lead input holes 192 defined by control electronics board 180. Direct current voltage electrical lead holes 192 are defined by control circuit board 180 at connecting portion 182. The output voltage is smoothed out by means of a capacitor 194.

Two separate control circuits 196A and 196B are integrated into control circuitry 178 each controlling a different series of diodes D1–D8. A set of flexible circuit board bands (not shown) can connect similar colored diodes together. Red, green and blue diodes can be used for any of diodes D1–D8 individually or collectively. Different combinations of energized RGB diodes at various intensities result in a particular wavelength of color or colors are adaptively mixed at a focal point, or target zone such as target zone 131 of FIG. 10. Diodes D1–D8 can generate both a full spectrum color light or generate a white light.

Figure 14:
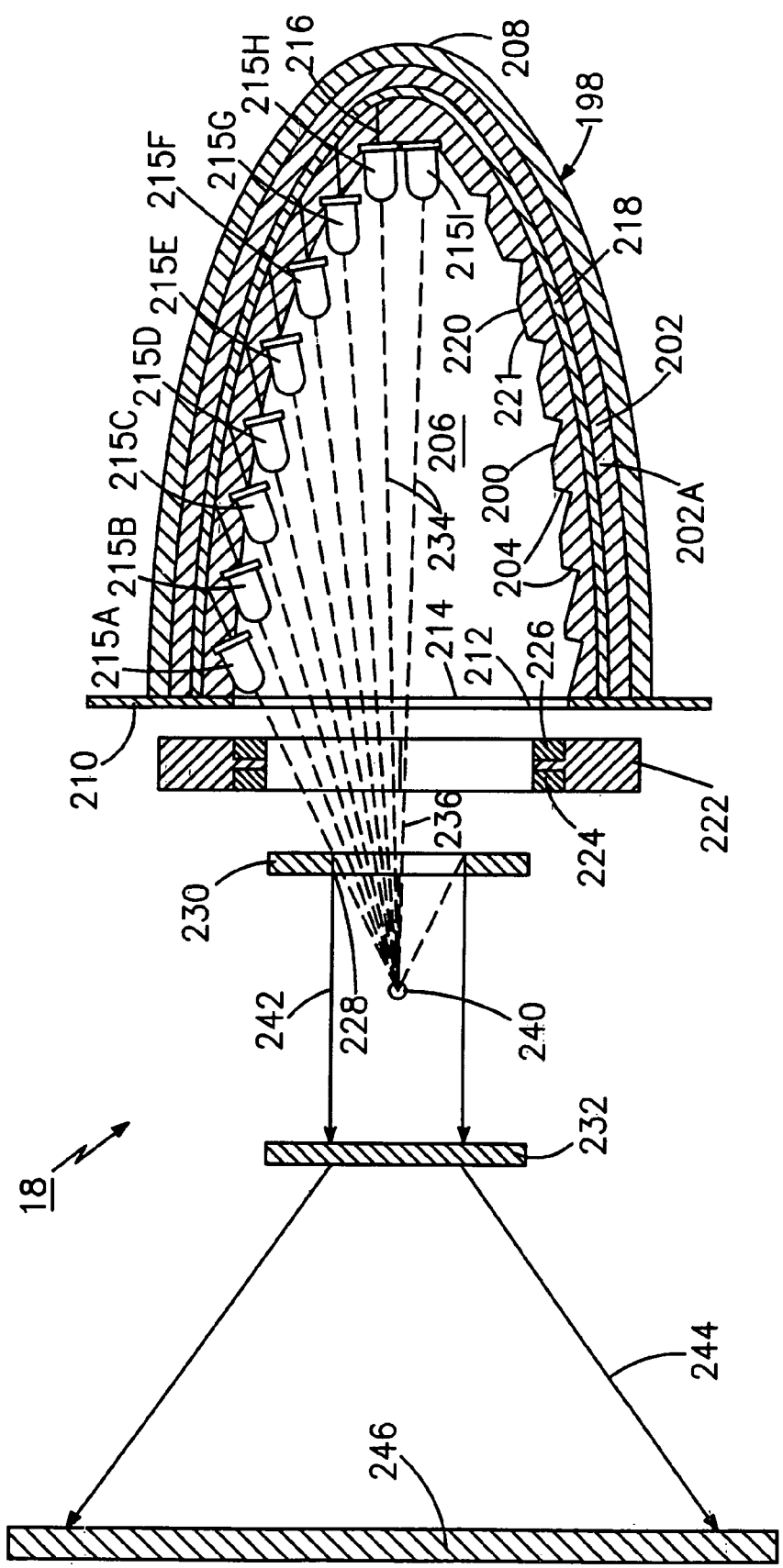
FIG. 14 is a schematic side view of a lighting system comprising a mid-sectioned ellipsoidal-shaped hollow volume including a housing and a mounting template positioned in the housing with a circuit board mounted in the housing in association with the mounting template with a plurality of LEDs individually secured to the mounting template with each LED having a diode-generated beam directed through an imaging gate towards a diode-generated light beam-organizing target zone located between a collimating lens and a focusing lens as generally shown in FIG. 7 with the diode-generated light beams being directed first to the collimating lens and thereupon directed to the focusing lens and then to a display surface.

Another embodiment of architectural, theatrical and stage lighting system 18 as that shown in various configurations in FIGS. 2–7 is shown in FIG. 14 in a detailed configuration in a schematic side view and includes a mid-sectioned hollow volume configured as a semi-ellipse, or ellipsoidal-shaped, nonconductive housing, or frame, 198. An ellipsoidal-shaped nonconductive diode mounting template 200 is positioned in the hollow volume of frame 198. An electrical circuit board 202 that transmits and controls direct current electrical voltage is configured as an ellipsoid is also mounted adjacent to frame 198. Mounting template 200 includes a plurality of graduated steps 204 that are located over the entire inner surface area of mounting template 200.

Mounting template 200 itself is configured so as to define a hollow volume, in particular being configured as a semi-ellipsoid, or ellipsoidal-shaped volume 206, in particular being configured as a semi-ellipse, having a curved base 208 and a rim 210 that defines a circular aperture 212 in a plane 214. Semi-ellipsoid-shaped volume 206 is functionally coextensive with the semi-ellipsoid-shaped volume defined by semi-ellipsoid-shaped frame 198. Semi-ellipsoid-shaped volume 206 of mounting template 200 has an semi-ellipsoid inner volume surface that is functionally coextensive with graduated mounting steps 204. A total of 157 diodes 215A–215I mounted to mounting steps 204 themselves form another ellipsoidal-shaped volume that is functionally coextensive with ellipsoidal-shaped volume 206. Diodes 215A–215I are removably secured, for example by gluing or in any manner known in the art, to mounting steps 204.

Each diode of diodes 215A–215I is provided with electrical leads 216 that are in electrical connection with circuit board 202. Each circular configuration of the eight concentric rings formed by diodes 215A–215H define planes parallel to one another and parallel to the plane defined by rim 210. A single center diode 215I is positioned at curved base 208 at the center of the concentric rings formed by diodes 215A–215H. An optional intervening semi-ellipsoid-shaped mounting board 218 is positioned between mounting template 200 and frame 198. Each of diodes 215A–215I is provided with electrical leads 216 to circuit board 202. A slight clearance at electrical leads 216 between diodes 215A–215I and mounting board 218, or circuit board 202A, as the case may be, is recommended, so that the epoxy bulb (not shown) at the base of each diode and thus the diode chip itself is not damaged from excessive heat during the soldering process of connection. This clearance is typically no less than 3 mm. Inner surface 220 of mounting template 200 can be coated with a layer of a light reflecting substance 221 to further enhance the collection of any scattered light beams from within ellipsoidal-shaped volume 206.

Light emitting diodes are placed in mounting steps 204 in a compact as possible array of diodes. In the particular array shown in FIG. 14, diodes indicated as diodes 215A–215I, eight of which shown sectioned in the midview of FIG. 14, are individually secured to each of the plurality of mounting steps 204. The total number of diodes that are in the exemplary configuration of FIG. 14 totals 157 including single center diode 206I, the arrangement of each being indicated in a flat, flexible blank 290 shown in FIG. 16 that is to be formed into the rigid circuit board 202 shown in FIG. 14. An array of diodes totaling 157 diodes are mounted as compactly as possible at the inner surface of mounting template 200 in a configuration of eight concentric rings onto graduated mounting steps 204 as follows: 24 diodes in a circular configuration around the outer rim of cone-shaped mounting template 200 as represented by exemplary diode 215A; 24 diodes in a circular configuration inwardly concentric with diodes 215A and as represented as diode 215B; 24 diodes 215C in a circular configuration inwardly concentric with diodes 215B as represented by exemplary diode 215C; 24 diodes 215D in a circular configuration inwardly concentric with diodes 215C as represented by exemplary diode 215D; 24 diodes 215E in a circular configuration inwardly concentric with diodes 215D as represented by exemplary diode 215E; 18 diodes 215F in a circular configuration inwardly concentric with diodes 215E as represented by exemplary diode 215F; 12 diodes 215G in a circular configuration inwardly concentric with diodes 215F as represented by exemplary diode 215G; and a most inward 6 diodes 215H inwardly concentric with diodes 215G as represented by exemplary diodes 215H. Single center diode 215I completes the diodes.

A fixed imaging gate 222 is positioned proximate to housing 198. Imaging gate 222 is analogous to imaging gate 48 shown in FIG. 8. Imaging gate 222 has mounted thereto a gobo 224 and a shutter blade 226 such as gobo 50 and shutter blade 51 indicated in FIG. 8. Imaging gate 222 has a fixed gate aperture 228. A collimating lens 230 is positioned spaced from imaging gate 222 and a focusing lens 232 is positioned further spaced from collimating lens 230. Each discrete diode light beam 234 from each of diodes 215A–215I passes through gate aperture 228 and the totality of diode light beams creates a first total diode generated light beam 236 that passes through imaging gate aperture 228. First total diode light beams 236 substantially fills the areas around gate aperture 228 to produce an even coverage of light. The totality of light beams generated by diodes 215A–215I create the first total diode light beam 236 that passes through imaging gate aperture 228.

Figure 15:
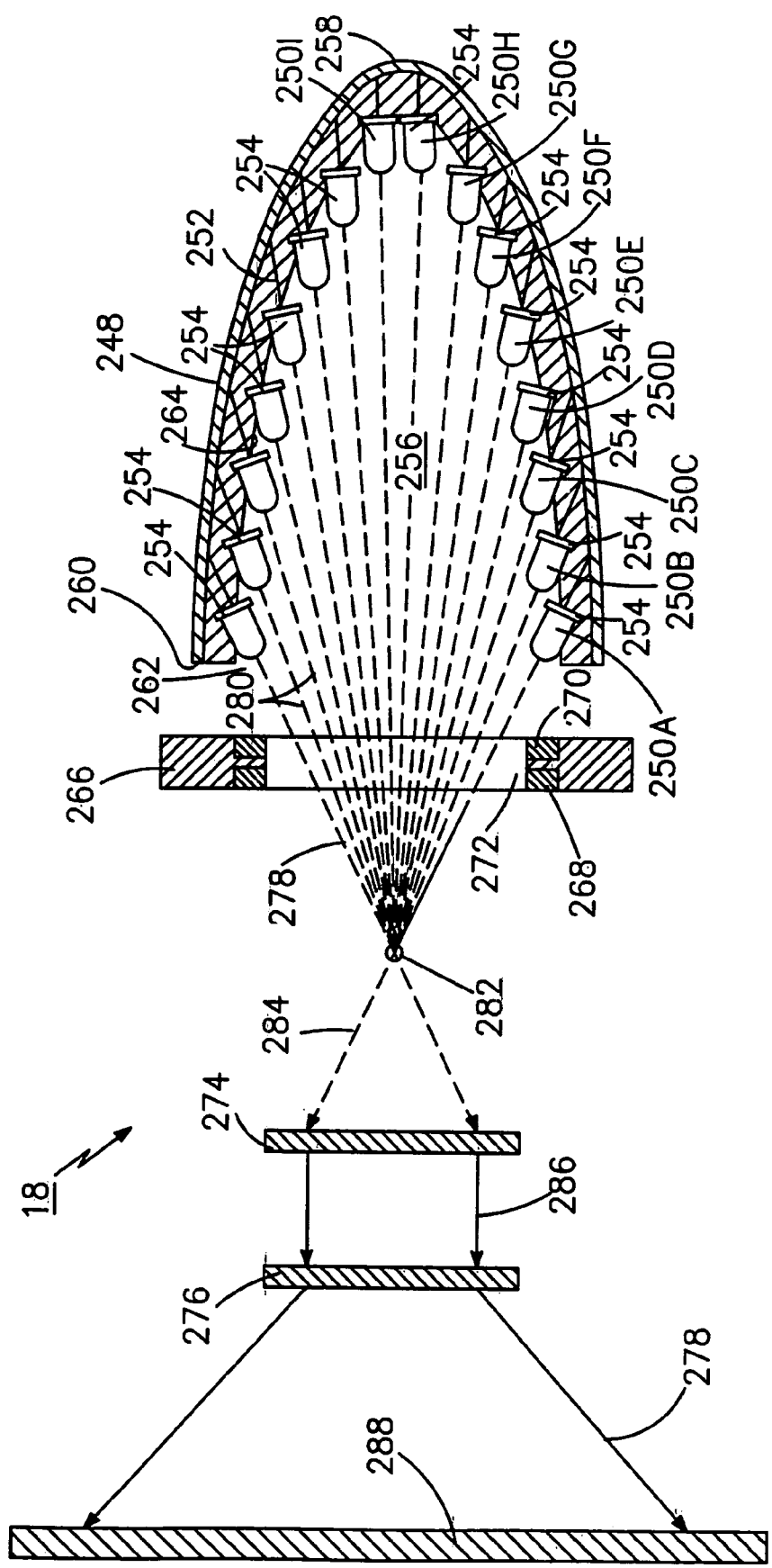
FIG. 15 is a schematic side view of a lighting system analogous to the lighting system shown in FIG. 14 including a circuit board configured as a hollow semi-ellipsoidal hollow volume that also functions as a mounting template with a plurality of LEDs individually secured the circuit board with the diode-generated light beams being directed through an imaging gate to a diode-generated beam-organizing target zone and then to a collimating lens and then to a focusing lens and then to a display surface.

In accordance with the present invention, each of the array of 157 diodes 215A–2015I is independently positioned at its own graduated mounting step 204 at a preset angle so that each discrete diode light beam 234 is directed at a focal point, or target zone, 240 so that the diode beams converge towards target zone 240. In the particular configuration of lighting system 18 shown in FIG. 14, first total light beam 236, which is a converging beam, passes through imaging gate aperture 228 and thereafter converges at focal point (target zone) 240 and thereupon reverses in image and then encounters collimating lens 230 from where a collimated second diode-generated total light beam 242 is directed to focusing lens 232 that then directs a focused third diode-generated light beam 244 to a screen 246. When focused third diode-generated light beam 244 strikes screen 246, an image created at imaging gate 222 is focused on screen 246. The image that is created is related to the shape of gate aperture 228 in itself, or is related to the shape of a gobo pattern made by gobo 224 located in gate aperture 228, or is related to the shape of a light beam made by a shutter blade 226 located in gate aperture 228. Collimating lens 230 and focusing lens 232 are movable within the optical lighting system by means known in the art so that third light beam 244 can zoom and focus the gobo pattern of gobo 224 or shutter blade shape of shutter blade 226 or other such shaping object located at imaging gate 222 onto screen 246. Screen 246 is also representative of other possible objects to illuminate, such as a person or a decorative construct. are set forth. Each exemplary diode 22, 24, and 26 is so positioned in the schematic FIGS. 2–7 that each diode light beam generated by each diode of the total array of diodes including exemplary diodes 22, 24, and 26 is directed to a diode light-organizing focal area, or target zone, 28. The diode generated light beam is indicated in totality as a Another embodiment or configuration of architectural, theatrical and stage lighting system 18 is shown in FIG. 15 in a detailed configuration in a schematic side view. lighting system 18 as shown in the configuration of FIG. 15 is analogous in certain respects to FIG. 4 and FIG. 14 and includes a mid-sectioned hollow volume configured as an ellipsoid-shaped nonconductive frame 248 for securing an array of 157 light emitting diodes indicated as diodes 250A–250I and also functions and as an electrical circuit board. Diodes 250A–250I are secured to combination, or unitary, housing/diode frame/circuit board 248 by stiff electrical leads 252 connected to diode bases 254 that maintain the proper angular configuration of each of diodes 250A–250I. Frame 248 functions as a unitary housing/diode frame/circuit board and is made of a nonconductive material that maintains a rigid ellipsoidal-shaped configuration as shown in FIG. 15. Frame 248 is configured so as to define a hollow volume, in particular being configured as a semi-ellipse, in particular an ellipsoidal-shaped hollow volume 256 having a base 258 and a periphery, or rim, 260 that defines a circular aperture 262 and an ellipsoidal inner surface 264.

Figure 16:
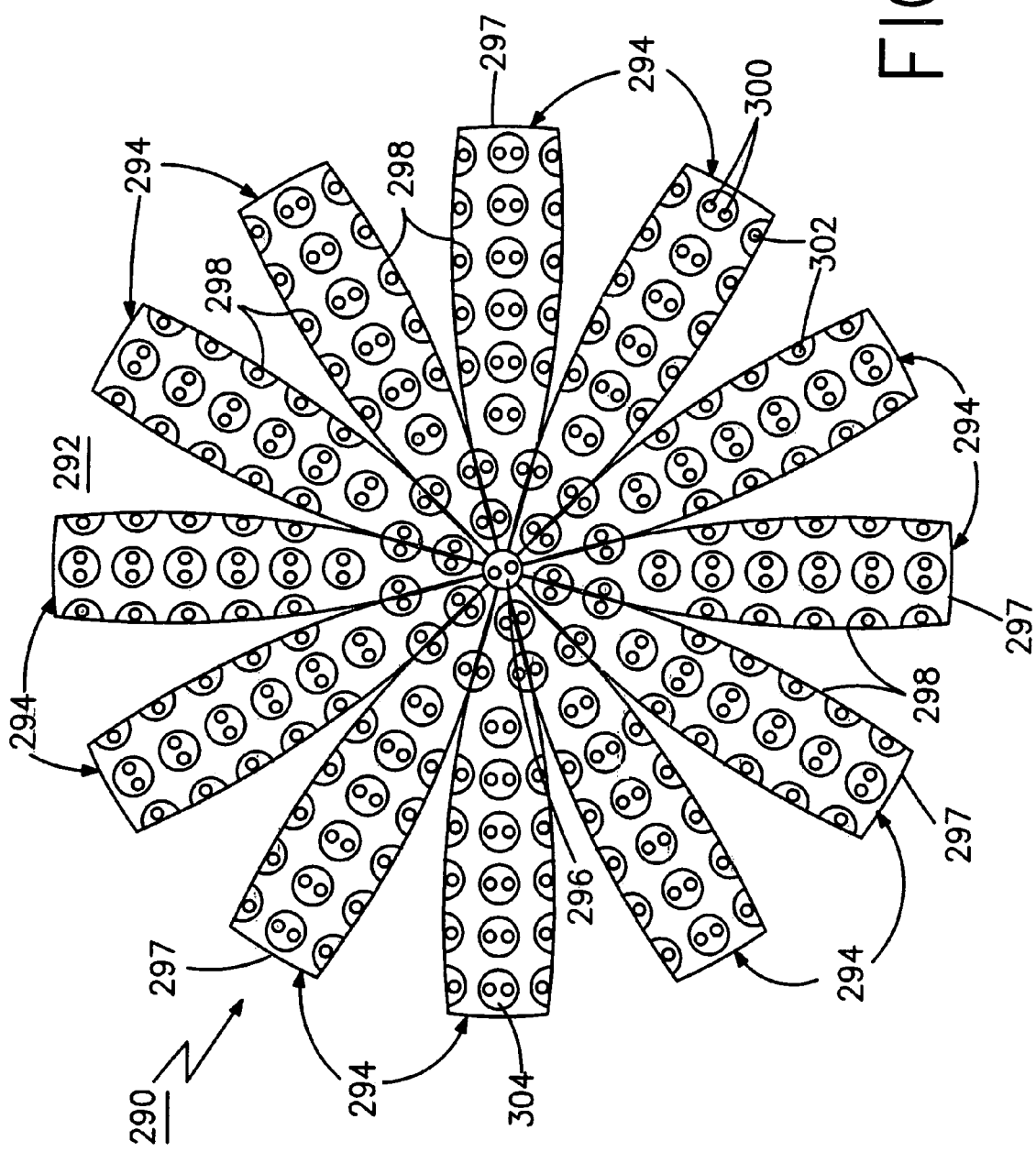
FIG. 16 is a top view of a flexible blank prior to being shaped into a rigid ellipsoidal-shaped configuration of a combination template, circuit board and housing such as shown in FIG. 15.

In the particular diode array shown in FIG. 15, the array of diodes indicated as diodes 250A–250I representing 8 rings of diodes 250A–250H and a single center diode 250I shown sectioned in the midview of FIG. 15. Stiff electrical leads 252 are in electrical connection with the circuit board function of unitary housing/diode frame/circuit board 248. A thin flat flexible blank 290 shown in FIG. 16 is subsequently formed to an ellipsoidal shape and secured at its side to achieve stiff unitary housing/diode frame/circuit board 248 shown in FIG. 15. Diodes 250A–250I are mounted as compactly as possible at the inner surface of ellipsoidal-shaped unitary housing/diode frame/circuit board 248 by stiff electrical leads 252. There is a slight clearance at leads 252 between diodes 250A–250I and unitary housing/frame/circuit board 248 so that the epoxy bulb (not shown) at the base of each diode and thus the diode chip itself is not damaged from excessive heat during the soldering process of connection. This clearance is typically no less than 3 mm. from unitary housing/diode frame/circuit board 248.

Diodes 250A–250I are mounted as compactly as possible at the inner surface of unitary housing/diode frame/circuit board 248 in a configuration of eight concentric rings and one center diode 250I as follows: 24 diodes in a circular configuration around the outer rim of unitary housing/diode frame/circuit board 248 as represented by diode 250A; 24 diodes in a circular configuration inwardly concentric with diodes 250A and as represented as diode 250B; 24 diodes 250C in a circular configuration inwardly concentric with diodes 250B as represented by diode 250C; 24 diodes 250D in a circular configuration inwardly concentric with diodes 250C as represented by diode 250D; 24 diodes 250E in a circular configuration inwardly concentric with diodes 250D as represented by diode 250E; 18 diodes 250F in a circular configuration inwardly concentric with diodes 250E as represented by diode 250F; 12 diodes 250G in a circular configuration inwardly concentric with diodes 250F as represented by diode 250G; and a most inward 6 diodes 250H inwardly concentric with diodes 250G as represented by exemplary diodes 250H. Single center diode 250I completes the diode array. A fixed imaging gate 266 is positioned proximate to unitary housing/diode frame/circuit board 248. Imaging gate 266 is analogous to imaging gate 48 shown in FIG. 8. Imaging gate 266 has mounted thereto a gobo 268 and a shutter blade 270 such as indicated in FIG. 8. Imaging gate 266 has a gate aperture 272. A collimating lens 274 is positioned spaced from imaging gate 266 and a focusing lens 276 is positioned further spaced from collimating lens 274. Each discrete diode light beam from each of diodes 250A–250I passes through gate aperture 272 and the totality of diode light beams creates a first total diode generated light beam 278 that passes through imaging gate aperture 272. First total diode light beam 278 substantially fills the areas around gate aperture 272 to produce an even coverage of light. The total of light beams generated by diodes 250A–250I creates the first total diode light beam 278 that passes through imaging gate aperture 272.

In accordance with the present invention, each of the array of 157 diodes 250A–250I is independently positioned at unitary housing/diode frame/circuit 248 at a preset angle by the adjustment of each stiff electrical lead 252 so that each discrete light beam 280 is directed at a focal point, or target zone, 282 so that the diode beams converge towards target zone 282. In the particular configuration of lighting system 18 shown in FIG. 15, first total light beam 278, which is a converging beam, passes through imaging gate aperture 272 and thereafter inverts at target zone 282 and continues as second diode total light beam 284 and then encounters intervening collimating lens 274 from where a collimated third diode total light beam 286 is directed to focusing lens 276 that then directs a focused fourth total diode light beam 287 to a screen 288. When focused fourth diode light beam 287 strikes screen 288, an image created at imaging gate 266 is focused on screen 288. The image that is created is related to the shape of gate aperture 272 in itself, or is related to the shape of a gobo pattern made by gobo 268 located in gate aperture 272, or is related to the shape of a light beam made by a shutter blade 270 located in gate aperture 272. Collimating lens 274 and focusing lens 276 are movable within the optical lighting system by means known in the art so that third light beam 286 can zoom and focus the gobo pattern of gobo 268 or shutter blade shape of shutter 270 or other such shaping object located at imaging gate 266 onto screen 288. Screen 288 is also representative of other possible objects to illuminate, such as a person or a decorative construct.

Target zone 282 achieves the function of the present invention for the reason that the paths of the totality of the 157 discrete light beams generated by diodes 250A–250I become organized in intensity and direction by their orientation towards target zone 282. The organization of first total light beam 278 is accomplished by each of diodes 250A–250I being secured to unitary housing/diode frame/circuit board 248, which are structured to orient each diode beam of diodes 250A–250I towards target zone 282.

FIG. 16 shows a top view of a thin flexible blank 290 prior to being formed to create the rigid ellipsoidal-shaped unitary housing/diode frame support/circuit board 248 such as shown in FIG. 15. Blank 290 is made of a nonconductive material, for example, a polyimide material that can withstand high temperatures during a soldering process. Blank 290 has opposed flat sides with a top side 292 as shown and a bottom side (not shown). Top side 292 is the designated inner mounting surface for diodes 250A–250I. A suggested minimum thickness between top side 292 and the bottom side is about 0.01 inch but the thickness might range generally between a lower end thickness of 0.0005 inch and an upper end thickness of 0.0625 inch depending on the material used. Other materials can include Mylar and polyester. This thickness will allow for flexibility during forming into a semi-ellipsoidal shape and be strong enough to maintain rigidity after wrapping to form rigid ellipsoidal-shaped unitary housing/diode frame support/circuit board 248. Blank 290 includes 12 outwardly extending portions, or petals, 294 of equal size and configuration that are separated from one another and are joined at a center portion 296, which is designated as base 258 in FIG. 15. Petals 294 have slightly outwardly curved opposed side edges 295 to accommodate alignment when unitary circuit board blank 290 is in a full semi-ellipsoidal volume mode as shown in FIG. 15. Petals 294 include outer end linear edges 298 that are designated to be combined together to achieve rim 260 of the assembled rigid ellipsoidal-shaped unitary housing/diode frame/circuit board 248. After petals 294 are assembled so as to form ellipsoidal-shaped unitary housing/diode frame/circuit board 248, fastening devices known in the art such as Snap-On connectors, for example, which are mounted to the bottom side of flexible unitary circuit board 248 are used to secure all 12 petals 294 until rigid unitary circuit board 248 is in the fully assembled mode.

Eight ring formations concentric with circular center portion 296 for diodes 250A–250H have 157 paired passages, or electrical lead holes 300 defined by blank 290 with a single paired passage 300 defined at circular center portion 296 for diode 250I. Split lead holes 302 are shown at the side edges 295 of petals 294 for later joining to aligned split lead holes 302 to form paired passages 300 at assembly. A solder pad 304 is attached to top side 292 and a similar solder pad (not shown) is mounted to the bottom side at each of paired passages 300 and 302. Paired passages 300 and 302 are for stiff electrical leads 252 shown in FIG. 15. Diodes 250A–250I are to be mounted at paired passages 300 and 302 to achieve the configuration as discussed in relation to FIG. 15. Paired passages 300 are designated to be located in concentric curved configurations that after assembly, or forming, of flexible blank 290 into the rigid semi-ellipsoid, or ellipsoidal-shape of unitary housing/diode frame/circuit board 248 as shown in FIG. 15. The curved configurations are shown in FIG. 16 as a first outer configuration of 24 electrical lead holes, a second inward configuration of 24 electrical lead holes 300, a third inward curve of 24 electrical lead holes 300, a fourth inward curve of 24 electrical lead holes 300, a fifth inward curve of 24 electrical lead holes 300, a sixth inward curve of 18 electrical lead holes 300, a seventh inward curve of 12 electrical lead holes, and an eighth most inward curve of 6 electrical lead holes 300. The center holds a single electrical lead hole 300. Each of electrical lead holes 300 accommodates the eight annular configurations of diodes 250A–250H of FIG. 15.

Attachments for securing rigid unitary circuit board 248 to an optional lamp housing or to an mounting fixture can be optionally added to flexible unitary housing/diode frame/circuit board 248 can be optionally included. Electronics for controlling the current related to diodes 250A–250I can be added after the assembly of blank 290 to rigid unitary circuit board 248. Such electronics are analogous to the electronics discussed in relation to control electrical circuit board 180 set forth in relation to blank 158 shown in FIG. 13.

Figure 17:
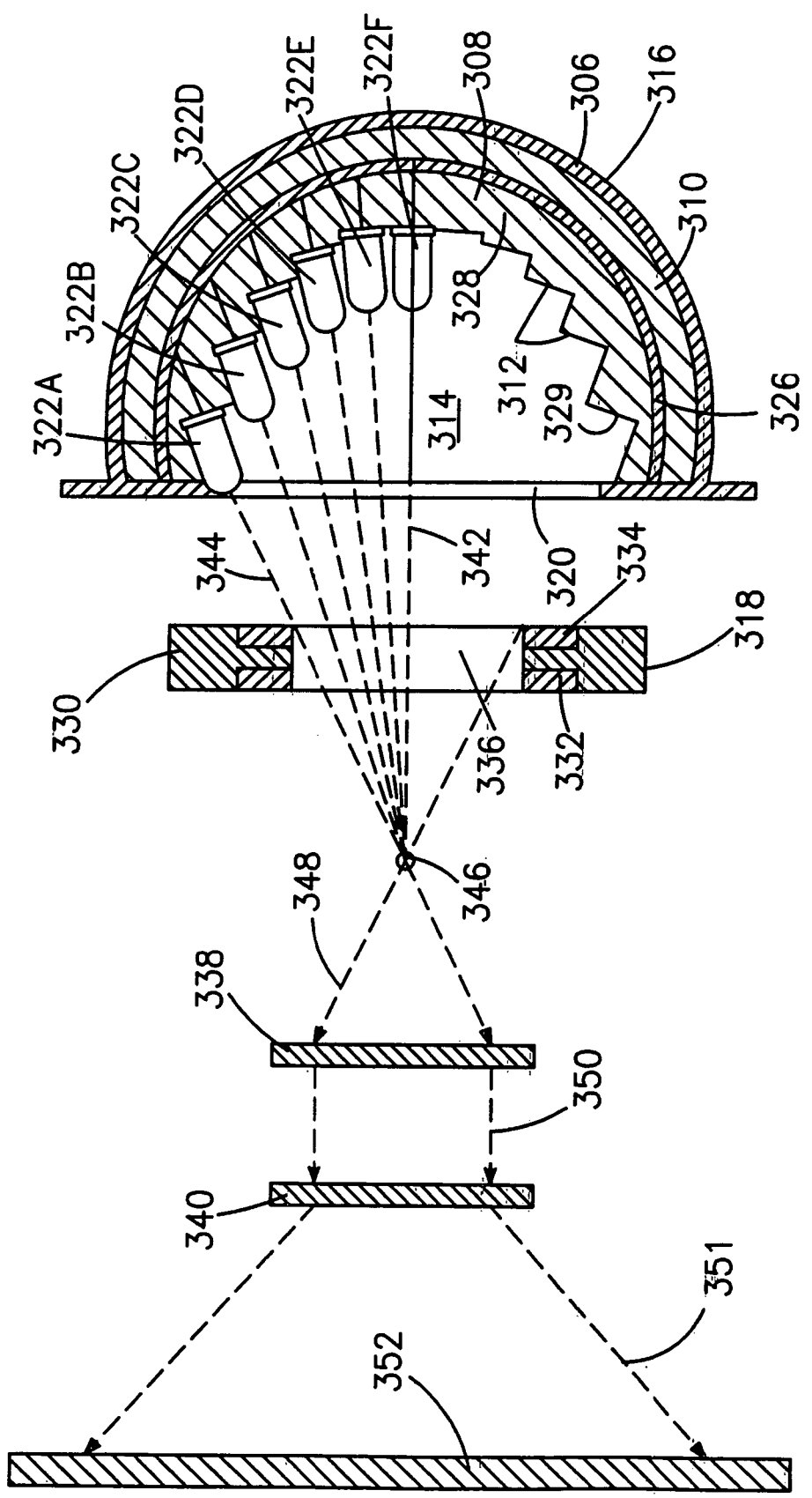
FIG. 17 is a schematic side view of a lighting system comprising a mid-sectioned semi-spherical-shaped hollow volume including a housing and a mounting template positioned in the housing with a circuit board mounted in the housing in association with the mounting template with a plurality of LEDs individually secured to the mounting template with each LED having a diode-generated beam directed through an imaging gate towards a diode-generated light beam-organizing target zone located between a collimating lens and a focusing lens as generally shown in FIG. 7 with the diode-generated light beams being directed first to the collimating lens and thereupon directed to the focusing lens and then to a display surface.

Another embodiment of architectural, theatrical and stage lighting system 18 as that shown in various configurations in FIGS. 2–7 is shown in FIG. 17 in a detailed configuration in a schematic side view and includes a mid-sectioned hollow volume configured as a semi-spherical-shaped, or hemi-spherical-shaped, nonconductive housing, or frame 306. A semi-spherical-shaped nonconductive diode mounting frame shown in FIG. 17 as a mounting template 308 that functions as a mounting frame is positioned in the hollow volume of frame 306. An electrical circuit board 310 that transmits and controls direct current electrical voltage is configured as an semi-sphere is mounted adjacent to frame 306. Mounting template 308 includes a plurality of graduated mounting steps 312 that are located over the entire inner surface area of mounting template 308.

Mounting template 308 itself is configured so as to define a hollow volume, in particular being configured as a semi-spherical-shaped volume 314 having a curved base 316 and a periphery, or rim, 318 that defines a circular aperture 320. Semi-spherical shaped volume 314 is functionally coextensive with the semi-spherical-shaped volume defined by semi-spherical-shaped frame 306. Semi-spherical-shaped volume 314 of mounting template 308 has a semi-spherical shaped inner volume surface that is functionally coextensive with graduated mounting steps 312. Diodes 322A–322F are mounted to mounting steps 312 themselves form another semi-spherical-shaped volume that is functionally coextensive with semi-spherical-shaped volume 314. Diodes 322A–322F are removably secured to mounting steps 312, for example by gluing or other means known in the art. Each diode of plurality of diodes 322A–322F is provided with electrical leads 324 that are in electrical connection with circuit board 310. Each circular configuration of the eight concentric rings formed by diodes 322A–322F define planes parallel to one another and parallel to the plane defined by rim 318. An optional intervening semi-spherical shaped mounting board 326 is positioned between mounting template 308 and frame 306. Each of diodes 322A–322F is provided with electrical leads 324 to circuit board 310. A slight clearance at leads 324 between diodes 322A–322F and mounting board 326, or circuit board 310, as the case may be, is recommended, so that the epoxy bulb (not shown) at the base of each diode and thus the diode chip itself is not damaged from excessive heat during the soldering process of connection. This clearance is typically no less than 3 mm. Inner surface 328 of mounting template 308 can be coated with a layer of a light reflecting substance 329 to further enhance the collection of any scattered light beams within semi-spherical-shaped volume 314.

Light emitting diodes are placed in mounting steps 312 in a compact as possible an array of diodes. In the particular array shown in FIG. 17, 91 diodes indicated as diodes 322A–322F, six of which shown sectioned in the midview of FIG. 17 but representing 91 diodes, are individually secured to each of the plurality of mounting steps 312. The total number of diodes that is in the exemplary configuration of FIG. 17 totals 91 diodes including single center diode 322F, the arrangement of each being the same as indicated in a blank 394 shown in FIG. 19 that is to be formed into the rigid circuit board 358 shown in FIG. 18. An array of diodes totaling 91 diodes are mounted as compactly as possible at the inner surface of mounting template 308 in a configuration of five concentric rings onto graduated mounting steps 312 as follows: 30 diodes in a circular configuration around the outer rim of semi-spherical-shaped mounting template 308 as represented by diode 322A; 24 diodes in a circular configuration inwardly concentric with diodes 322A and as represented as diode 322B; 18 diodes 322C in a circular configuration inwardly concentric with diodes 322B as represented by diode 322C; 12 diodes 322D in a circular configuration inwardly concentric with diodes 322C as represented by diode 322D; 6 diodes 322E in a circular configuration inwardly concentric with diodes 322D as represented by diode 322E; and a most inward diode 322F inwardly concentric with diodes 322E as represented by diode 322F.

A fixed imaging gate 330 is positioned proximate to frame 306. Imaging gate 330 is analogous to imaging gate 48 shown in FIG. 8. Imaging gate 330 has mounted thereto a gobo 332 and a shutter blade 334 such as gobo 50 and shutter blade 51 such as indicated in FIG. 8. Imaging gate 330 has a fixed gate aperture 336. A collimating lens 338 is positioned spaced from imaging gate 330 and a focusing lens 340 is positioned spaced from collimating lens 338. Each discrete diode beam 342 from each of diodes 322A–322F passes through gate aperture 336 and the totality of diode light beams creates a first total diode light beam 344 that passes through imaging gate aperture 336. First total diode light beam 344 substantially fills the areas around gate aperture 336 to produce an even coverage of light.

In accordance with the present invention, each of the array of 91 diodes 322A–322F is independently positioned at its own graduated mounting step 312 at a preset angle so that each discrete light beam 342 is directed at a focal point, or target zone, 346. In the particular configuration of lighting system 18 shown in FIG. 17, first total diode light beam 344, which is a converging beam, passes through imaging gate aperture 336 and thereafter converges at target zone 346. A subsequent inverted second total diode light beam 348 travels to intervening collimating lens 338 from where a collimated third diode light beam 350 is directed to focusing lens 340 that then directs a focused fourth total diode light beam 351 to a screen 352. When focused fourth diode-generated light beam 351 strikes screen 352, an image created at imaging gate 330 is focused on screen 352. The image that is created is related to the shape of gate aperture 336 in itself, or is related to the shape of a gobo pattern made by gobo 332 located in gate aperture 336, or is related to the shape of a light beam made by a shutter blade 334 located in gate aperture 336. Collimating lens 338 and focusing lens 340 are movable within the optical lighting system by means known in the art so that third total diode light beam 350 can zoom and focus the gobo pattern of gobo 332 or shutter blade shape of shutter blade 334 or other such shaping object located at imaging gate 330 onto screen 352. Screen 352 is also representative of other possible objects to illuminate, such as a person or a decorative construct.

Target zone 346 achieves the function of the present invention for the reason that the paths of the totality of the 91 discrete light beams generated by diodes 322A–322F become organized in intensity and direction by their orientation towards target zone 346. The organization of first total light beam 344 is accomplished by each of diodes 322A–322F being positioned in graduated mounting steps 312, which are structured to orient each diode beam of diodes 322A–322F towards target zone 346.

Figure 18:
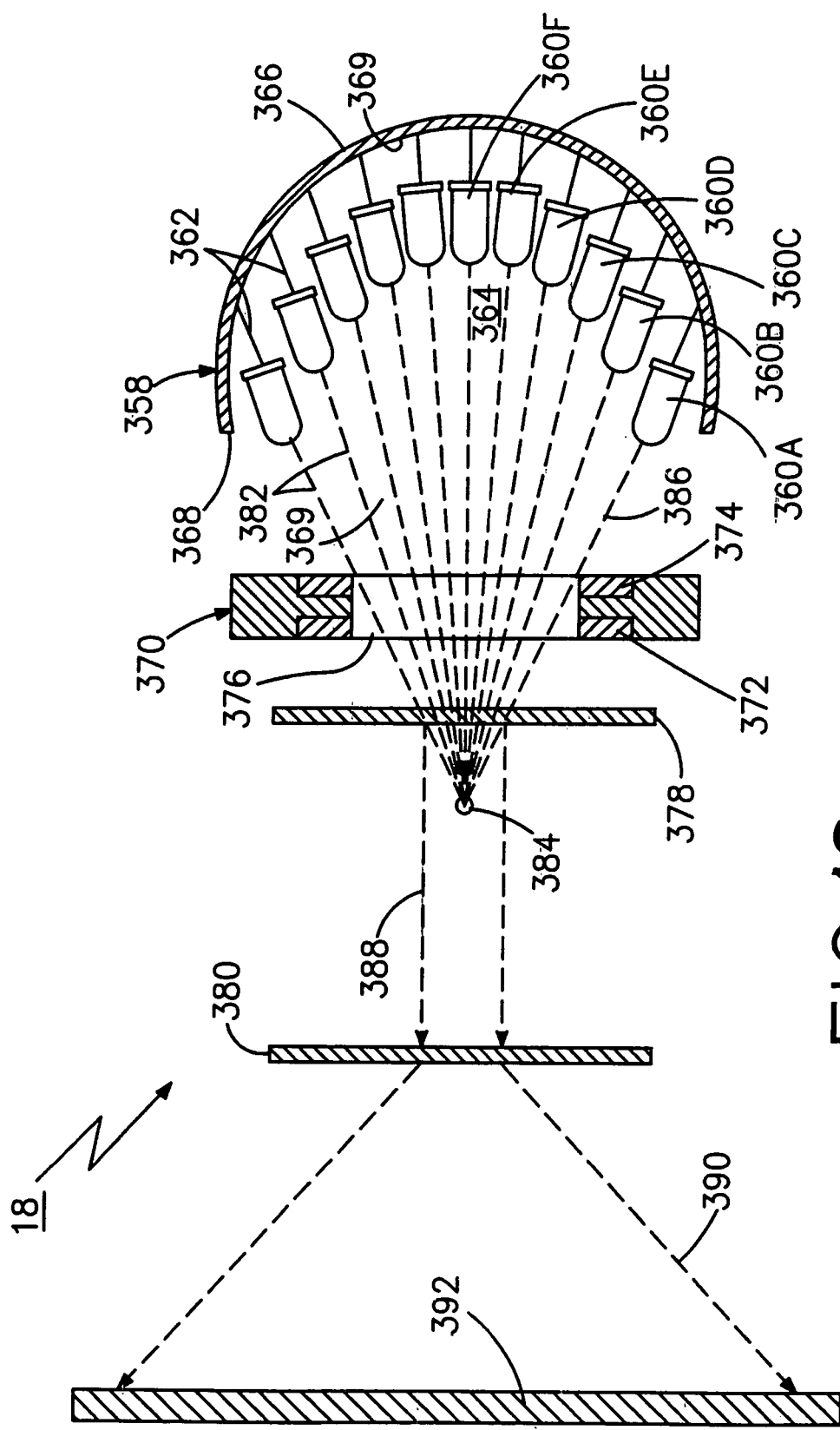
FIG. 18 is a schematic side view of a lighting system analogous to the lighting system shown in FIG. 17 including a circuit board configured as a hollow semi-ellipsoidal hollow volume that also functions as a mounting template with a plurality of LEDs individually secured the circuit board with the diode-generated light beams being directed through an imaging gate to a diode-generated beam-organizing target zone and then to a collimating lens and then to a focusing lens and then to a display surface.

Another embodiment or configuration of architectural, theatrical and stage lighting system 18 is shown in FIG. 18 in a detailed configuration in a schematic side view. Lighting system 18 is analogous in certain respects to FIG. 5 and FIG. 17 and includes a mid-sectioned hollow volume configured as a semi-spherical-shaped, or hemispherical, nonconductive housing 358 that also functions as a mounting frame for securing an array of 91 light emitting diodes indicated as diodes 360A–360F and also functions and as an electrical circuit board. Diodes 360A–360F are secured to combination, or unitary, housing/diode frame/circuit board 358 by stiff electrical leads 362 that maintain the proper angular configuration of each of diodes 360A–360F. Unitary housing/diode frame/circuit board 358 is made of a nonconductive material that maintains a rigid semi-spherical-shaped configuration as shown in FIG. 18. Unitary housing/diode frame/circuit board 358 is configured so as to define a hollow volume, in particular being configured as a semi-spherical, in particular a semi-spherical-shaped volume 364 having a curved base 366 and a periphery, or rim, 368 that defines a circular aperture 369.

In the particular diode array shown in FIG. 18, the array of diodes indicated as diodes 360A–360F representing 5 rings of diodes 360A–360E and a single center diode 360F are shown sectioned in the midview of FIG. 18. Stiff electrical leads 362 are in electrical connection with the circuit board function of unitary housing/diode frame/circuit board 358. Diodes 360A–360F are mounted as compactly as possible at the inner surface of semi-circular-shaped unitary housing/diode frame/circuit board 358 by stiff electrical leads 362. There is a slight clearance at leads 362 between diodes 360A–360F and unitary housing/frame/circuit board 358 so that the epoxy bulb (not shown) at the base of each diode and thus the diode chip itself is not damaged from excessive heat during the soldering process of connection. This clearance is typically no less than 3 mm. from unitary housing/diode frame/circuit board 358.

Diodes 360A–360F are mounted as compactly as possible at the inner surface of unitary housing/diode frame/circuit board 358 in a configuration of 5 concentric rings and one center diode 360F as follows: 30 diodes in a circular configuration around the outer rim of unitary housing/diode frame/circuit board 358 as represented by diode 360A; 24 diodes in a circular configuration inwardly concentric with diodes 360A and as represented as diode 360B; 18 diodes 360C in a circular configuration inwardly concentric with diodes 360B as represented by diode 360C; 12 diodes 360D in a circular configuration inwardly concentric with diodes 360C as represented by diode 360D; and 6 diodes 360E in a circular configuration inwardly concentric with diodes 360D as represented by diode 360E. Single center diode 360F completes the diode array. A fixed imaging gate 370 is positioned proximate to unitary housing/diode frame/circuit board 358. Imaging gate 370 is analogous to imaging gate 48 shown in FIG. 5. Imaging gate 370 has mounted thereto a gobo 372 and a shutter blade 374 such as gobo 50 and shutter blade 51 indicated in FIG. 8. Imaging gate 370 has a fixed gate aperture 376. A collimating lens 378 is positioned spaced from imaging gate 370 and a focusing lens 380 is positioned further spaced from collimating lens 378. Each diode center beam 382 from each of diodes 360A–360F passes through gate aperture 376 and the totality of diode light beams creates a first total diode generated light beam 386 that passes through imaging gate aperture 376. First total diode light beam 386 substantially fills the areas around gate aperture 382 to produce an even coverage of light. The totality of light beams generated by diodes 360A–360F is indicated as first total diode light beam 386 that passes through imaging gate aperture 370.

In accordance with the present invention, each of the array of 91 diodes 360A–360F is independently positioned at unitary housing/diode frame/circuit 358 at a preset angle by the adjustment of each stiff electrical lead 362 so that each discrete light beam 382 is directed at a focal point, or target zone, 384 so that the diode beams converge towards target zone 384. In the particular configuration of lighting system 18 shown in FIG. 18, first total light beam 386, which is a converging beam, passes through imaging gate aperture 376 and before reaching focus area, or target zone 384 encounters intervening collimating lens 378 from where a collimated second diode-generated total light beam 388 is directed to focusing lens 380 that then directs a focused third total diode-generated light beam 390 to a screen 392. When focused third diode-generated light beam 390 strikes screen 392, an image created at imaging gate 370 is focused on screen 392. The image that is created is either related to the shape of gate aperture 376 in itself, or is related to the shape of a gobo pattern made by gobo 372 located in gate aperture 376, or is related to the shape of a light beam made by a shutter blade 374 located in gate aperture 376. Collimating lens 378 and focusing lens 380 are movable within the optical lighting system by means known in the art so that third light beam 390 can zoom and focus the gobo pattern of gobo 372 or shutter blade shape of shutter blade 374 or other such shaping object located at imaging gate 370 onto screen 392. Screen 392 is also representative of other possible objects to illuminate, such as a person or a decorative construct.

Target zone 384 achieves the function of the present invention for the reason that the paths of the totality of the 91 discrete light beams generated by diodes 360A–360F become organized in intensity and direction by their orientation towards target zone 384. The organization of first total light beam 386 is accomplished by each of diodes 360A–360F being secured to unitary housing/diode frame/circuit board 358, which are structured to orient each diode beam of diodes 360A–360F towards target zone 384.

Figure 19:
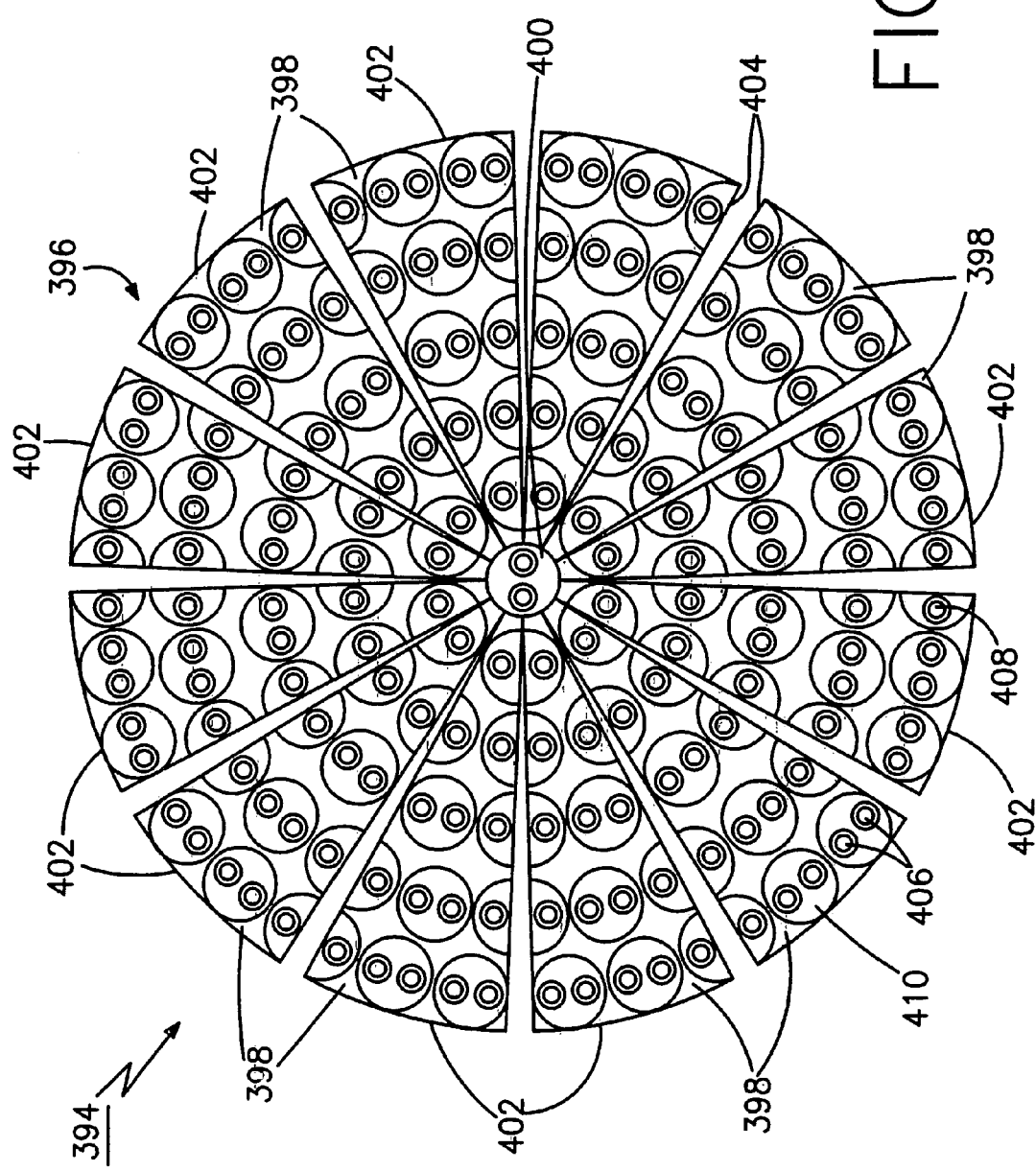
FIG. 19 is a top view of a flexible blank in a flat configuration prior to being shaped into a rigid semi-spherical-shaped configuration of a combination template, circuit board and housing such as shown in FIG. 18.

FIG. 19 shows a blank 394 prior to being formed by wrapping to create the rigid semi-spherical-shaped unitary housing/diode frame support/circuit board 358 such as shown in FIG. 18. Blank 394 is made of a flexible, nonconductive material, for example, a polyimide material that can withstand high temperatures during a soldering process. Blank 394 has opposed flat sides with a top side 396 as shown and a bottom side (not shown). Top side 396 is the designated inner mounting surface for diodes 360A–360F. A suggested thickness between top side 396 and the bottom side is about 0.01 inch but the thickness might range generally between a lower end thickness of 0.0005 inch and an upper end thickness of 0.0625 inch depending on the material used. Other materials that can be used include Mylar and polyester. This thin distance will allow for flexibility during forming into a semi-spherical shape and strong enough to maintain rigidity after assembly to form rigid semi-spherical-shaped unitary housing/diode frame support/circuit board 358. Blank 394 includes 12 wedge-shaped portions, or petals, 398 that are separated from one another and are joined at a circular center portion 400, which is designated as curved base 316 in FIG. 18. Petals 398 include outer curved edges 402 that are designated to be combined together to achieve rim 368 of the assembled rigid semi-spherical-shaped unitary housing/diode frame/circuit board 358. Petals 398 include opposed linear side walls 404 that are connected to outer edges 402. After petals 398 are drawn together so as to form rigid semi-spherical-shaped unitary housing/diode frame/circuit board 358, fastening devices known in the art such as hooks or Snap-On connections mounted to the bottom side of flexible unitary circuit board 358 are used to secure all 12 petals 398 so that rigid unitary circuit board 358 is constructed.

Eight ring formations concentric with center portion for diodes 360A–360E have 90 paired passages, or electrical lead holes, 406 defined by unitary flexible unitary housing/diode frame/circuit board blank 394 with a single pair of elecrtrical lead holes 408 defined at circular center portion 400 for diode 360F. A solder pad 410 is attached to top side 396 and another solder pad (not shown) is attached at the opposed side at each of paired lead holes 406 and 408. Paired lead holes 406 and 408 are for accommodating stiff electrical leads 362 shown in FIG. 18. Diodes 360A–360F are to be mounted at paired lead holes 406 and 408 to achieve the configuration as discussed in relation to FIG. 18. Paired lead holes 406 and 408 are designated to be located in concentric curved configurations that after wrapping, or forming, of blank 394 into the rigid semi-spherical-shape of unitary housing/diode frame/circuit board 358 in accordance with the configuration shown in FIG. 18. The curved configurations are shown in FIG. 19 as an first outer configuration of 30 paired electrical lead holes 406, a second inward configuration of 24 electrical lead holes 406, a third inward curve of 18 electrical lead holes 406, a fourth inward curve of 12 electrical lead holes 406, and a fifth inward curve of 6 electrical lead holes 406. The center electrical lead hole 408 for a single diode is at center portion 400. Each of electrical lead holes 406 and 408 accommodates the eight annular configurations of diodes 360A–360F of FIG. 18.

Figure 19A:
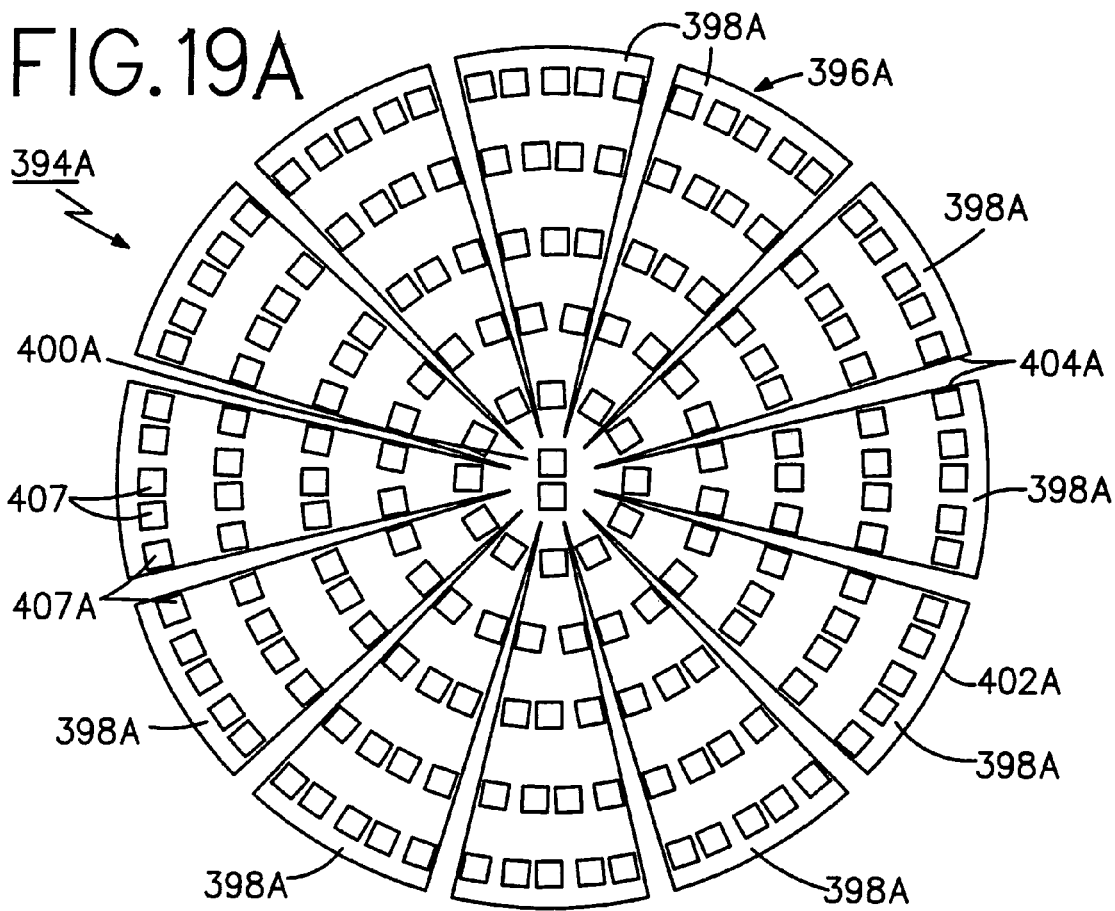
FIG. 19A is a top view of an alternative flexible blank with a printed circuit adapted to mount Surface Mount light emitting diodes, the blank being in a flat configuration prior to being shaped into a rigid semi-spherical-shaped configuration.

FIG. 19A shows a blank 394A prior to being formed by wrapping to create the rigid semi-spherical-shaped unitary housing/diode frame support/circuit board with a printed circuit on one side and that is analogous to blank 394. Blank 394A is structured to support 90 diodes. Blank 394A is made of a flexible, nonconductive material, for example, a polyimide material that can withstand high temperatures during a soldering process. Blank 394A has opposed flat sides with a top side 396A as shown and an opposed bottom side (not shown). Top side 396A is the designated inner mounting surface for the 90 diodes, which are analogous to diodes 360A–360F that are provided for by blank 394 shown in FIG. 19. A suggested minimum thickness between top side 396 and the bottom side is about 0.01 inch but the thickness might range generally between a lower end thickness of 0.0005 inch and an upper end thickness of 0.0625 inch depending on the material used. Other materials that can be used include Mylar and polyester. This thin distance will allow for flexibility during forming into a semi-spherical shape and strong enough to maintain rigidity after assembly to form a rigid semi-spherical-shaped unitary housing/diode frame support/circuit board with a printed circuit. Blank 394A includes 12 wedge-shaped portions, or petals, 398A that are separated from one another and are joined at a circular center portion 400A, which is analogous to curved base 316 shown in FIG. 18. Petals 398A include outer curved edges 402A that are designated to be combined together to achieve a rim analogous to rim 368 of the assembled rigid semi-spherical-shaped unitary housing/diode frame/circuit board 358 shown in FIG. 18. Petals 398A include opposed linear side walls 404A that are connected to outer edges 402A. After petals 398A are drawn together so as to form a rigid semi-spherical-shaped unitary housing/diode frame/circuit board with a printed circuit, fastening devices known in the art such as hooks or Snap-On connections mounted to the bottom side of blank 394A are used to secure all 12 petals 398A so that a rigid unitary circuit board analogous to rigid unitary circuit board 358 is constructed.

Five ring formations are concentric with a center portion for the 90 diodes to be mounted to the rigid semi-spherical-shaped unitary housing/diode frame/circuit board with printed circuit from blank 394A. Each diode is a Surface Mount Device (SMD) that has its electrical leads soldered to solder pads 407 that are premounted to topside 396A. Solder pads 407 are indicated as paired squares in FIGS. 19A and 19B. Thirty SMDs are to be mounted to 30 paired solder pads 407 in an outermost circular configuration seen in FIG. 19A; 24 SMDs are to be mounted to 24 paired solder pads 407 in a first subsequent inner circular configuration; 18 SMDs are to be mounted to 18 paired solder pads 407 in a second subsequent inner circular configuration; 12 SMDs are to be mounted to 12 paired solder pads 407 in a third subsequent circular configuration; and 6 SMDs are to be mounted to 6 paired solder pads 407 in the most inner circular configuration.

Figure 19B:
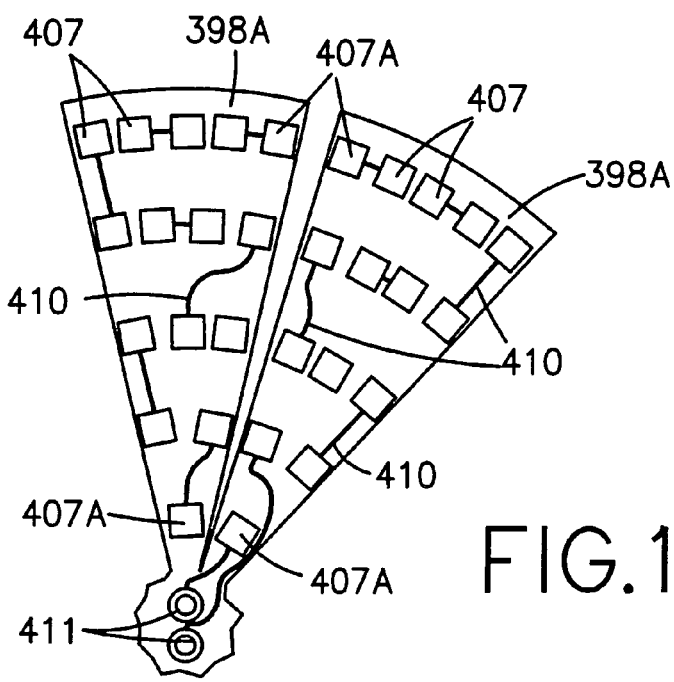
FIG. 19B is a detailed view of a two adjoining petal segments of the blank shown in FIG. 19A.

As shown in FIG. 19B shows flexible printed circuit 410 connected to a pair of electrical connectors 411 at center circular portion 400A and to electrical contacts for each SMD to be mounted at paired solder pads 407. Electrical power passes through each SMD to circuit 410. Paired solder pads 407A shown in FIG. 19 are separated by linear side edges 404A wherein adjoining petals 398 will be moved into juxtaposition upon formation of blank 394A into a semi-spherical hollow volume. Flexible printed circuit 410 is structurally integrated with blank 394A. SMD diodes mounted to paired solder pads 407A also hold petals 398A together in the formed rigid semi-spherical-shaped unitary housing/diode frame mode because one electrical lead is on one petal 398A and the other electrical lead is on the adjacent petal 398A.

When blank 394A is formed into a semi-spherical hollow volume, SMD diodes mounted to top side 396 are arranged within the inner surface of the hollow volume. The bottom side of blank 394A is smooth and thus the outer surface of the formed hollow volume is likewise smooth.

Blank 394A having a printed circuit board is exemplary for printed flexible circuit board blanks having printed circuits that can be used to contruct a cone-shaped hollow volume such as flexible unitary circuit board blank 158 such as that shown in FIG. 13 and also that can be used to construct an ellipsoidal-shaped hollow volume such as flexible unitary circuit board blank 290 such as that shown in FIG. 16.

Blanks for printed circuit boards can be a single-sided circuit board, a double-sided circuit board or a multi-sided circuit board. Single-sided circuit boards for printed circuits have solder pads on only one side. Double-sided circuit boards have solder pads on both sides of the circuit board and have plated through holes for electrical leads. Multi-sided circuit boards are basically multiple layers of double-sided circuit boards stacked perfectly on top of one another.

A method for assembling a frame 358 such as shown in FIG. 19 comprises the following steps:

a. providing flexible, thin, flat blank 394 and pulling petals 402 into alignment around center portion 400 so as to form frame 358 configured as semi-circular hollow volume 364 with top side 396 of blank 394 being inner surface 369 of semi-spherical hollow volume 364 and the opposed bottom side of blank 394 being the outer surface of semi-circular hollow volume 364;

b. joining opposed side edges 404 to curved outer edges 402 and aligning outer edges 402 so as to form circular rim 368 of hollow volume 364; and c. securing plurality of petals 398 by employment of a means for securing such as hook or snap-in connectors attached to the bottom side of blank 394 so as to assemble frame 358 defining rigid hollow volume 364.

Attachments for securing rigid unitary housing/diode frame/circuit board 358 to a mounting fixture can be optionally added to blank 394. Electronics for controlling the current related to diodes 360A–360F can be added after the assembly of blank 394 to rigid unitary circuit board 358. Such electronics are analogous to the electronics discussed in relation to control electrical circuit board 180 set forth in relation to the blank 158 shown in FIG. 13.

Figure 20:
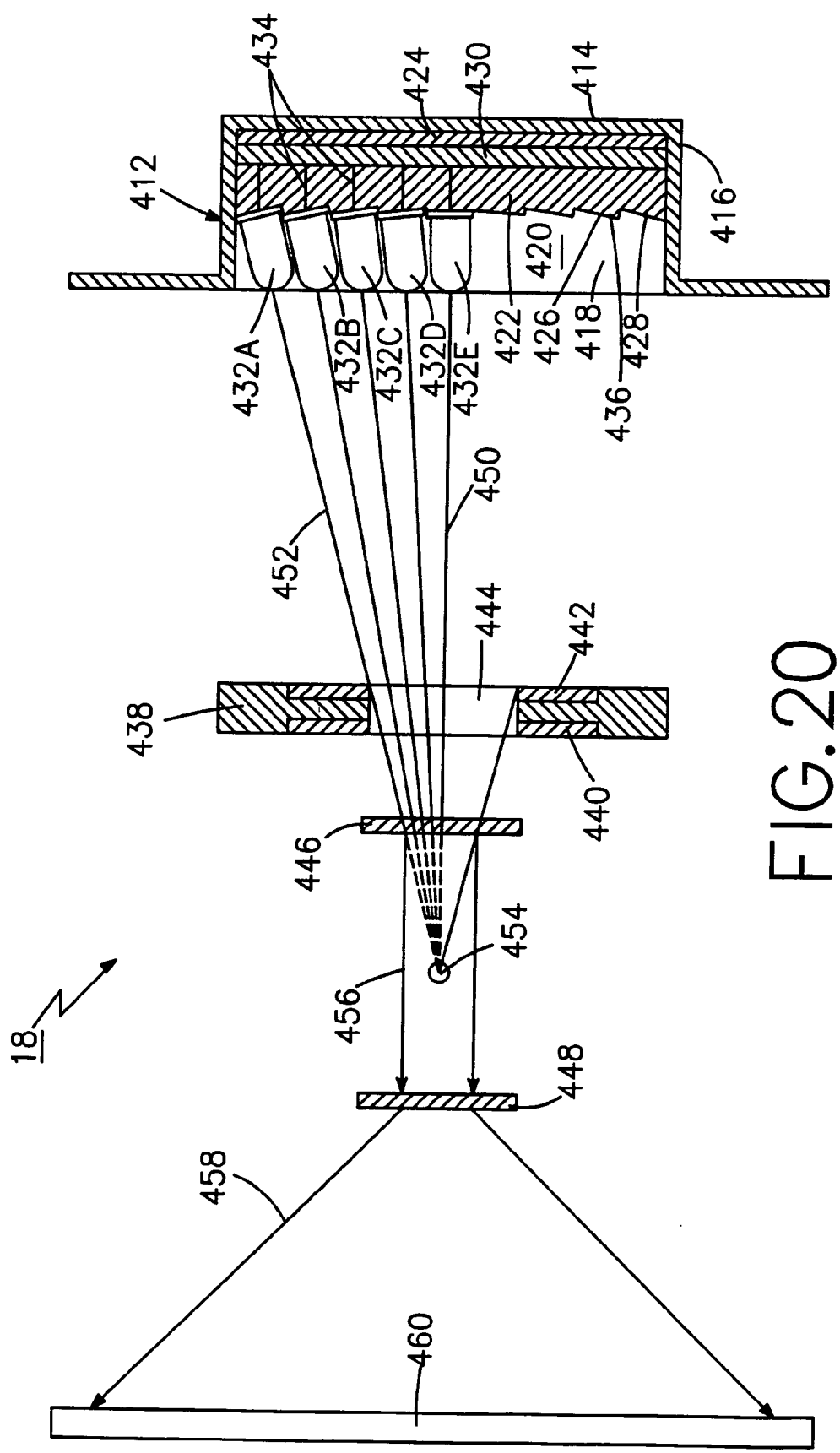
FIG. 20 is a schematic side view of a lighting system comprising a mid-sectioned cylindrical-shaped housing and a substantially flat cylindrical mounting template positioned in the housing with a flat circuit board mounted in the housing in association with the mounting template with a plurality of LEDs individually secured to the mounting template with each LED having a diode-generated beam directed through an imaging gate towards a diode-generated light beam-organizing target zone located between a collimating lens and a focusing lens as generally shown in FIG. 7 with the diode-generated light beams being directed first to the collimating lens and thereupon directed to the focusing lens and then to a display surface.

Another embodiment of architectural, theatrical and stage lighting system 18 as that shown in various configurations in FIGS. 2–7 and in particular as shown in FIG. 6 is shown in FIG. 20 in a detailed configuration in a schematic side view and includes a mid-sectioned nonconductive housing configured as a cylindrical housing, or frame, 412 having a flat rear wall 414 and a continuous circular side wall, or rim, 416 connected to rear wall 414 defining a circular housing aperture 418 so as to define a cylindrical volume 420.

A cylindrical-shaped nonconductive diode mounting frame is shown as a mounting template 422 is positioned in the hollow cylindrical volume 420 of cylindrical housing 412. A cylindrical electrical circuit board 424 that transmits and controls direct current electrical voltage is mounted in the cylindrical volume 420 of housing 412 adjacent to flat rear wall 414. Mounting template 422 includes a front wall 426 that defines 67 graduated mounting steps 428 that are located over the entire circular front wall 426. An optional cylindrical mounting board 430 is positioned between mounting template 422 and cylindrical circuit board 424.

Sixty-seven diodes 432A–432E mounted to mounting steps 428 themselves form a substantially planar front wall. Each circular configuration of four concentric rings formed by diodes 432A–432E define planes parallel to one another and parallel to the plane defined by rim 416. Diodes 432A–432E are provided with electrical leads 434 that extend through mounting board 430 are in electrical connection with circuit board 424. A slight clearance at leads 434 between diodes 432A–432E and mounting board 430, or circuit board 424, as the case may be, is recommended, so that the epoxy bulb (not shown) at the base of each diode and thus the diode chip itself is not damaged from excessive heat during the soldering process of connection. This clearance is typically no less than 3 mm. Outer surface 436 of mounting template 422 can be coated with a layer of a light reflecting substance to further enhance the collection of any scattered light beams from areas of outer surface 436 outside of diodes 432A–432E.

Light emitting diodes are placed in mounting steps 428 in a compact as possible an array of diodes. In the particular array shown in FIG. 20, 67 diodes indicated as diodes 432A–432E, five of which shown sectioned in the midview of FIG. 17 as representing all 67 diodes, are individually secured to each of mounting steps 428. The total number of diodes that is in the exemplary configuration of FIG. 20 totals 67 diodes including single center diode 432E are arranged in a manner analogous to that shown for blank 495 shown in FIG. 22. An array of diodes totaling 67 diodes are mounted as compactly as possible at the outer surface 436 of mounting template 422 in a configuration of four concentric rings onto graduated mounting steps 428 as follows: 28 diodes in a circular configuration the outer rim of cylindrical mounting template 422 as represented by exemplary diode 432A; 20 diodes in a circular configuration inwardly concentric with diodes 432A and as represented by exemplary diode 432B; 12 diodes 432C in a circular configuration inwardly concentric with diodes 432B as represented by exemplary diode 432C; 6 diodes 432D in a circular configuration inwardly concentric with diodes 432C as represented by exemplary diode 432D; and a most inward diode 432E inwardly concentric with diodes 432D as represented by diode 432E.

A fixed imaging gate 438 is positioned proximate to housing 412. Imaging gate 438 is analogous to imaging gate 48 shown in FIG. 8. Imaging gate 438 has mounted thereto a gobo 440 and a shutter blade 442 such as gobo 50 and shutter blade 51 indicated in FIG. 8. Imaging gate 438 has a gate aperture 444. A collimating lens 446 is positioned spaced from imaging gate 438 and a focusing lens 448 is positioned further spaced from collimating lens 446. Each discrete diode beam 450 from each of diodes 432A–432E passes through gate aperture 444 and the totality of diode light beams creates a first total diode generated light beam 452 that passes through imaging gate aperture 444. First total diode light beam 452 substantially fills the areas around gate aperture 444 to produce an even coverage of light. The totality of light beams generated by diodes 432A–432E creates the first total diode light beam 452 that passes through imaging gate aperture 444.

In accordance with the present invention, each of the array of 67 diodes 432A–432E is independently positioned at its own graduated mounting step 428 at a preset angle so that each discrete light beam 450 is directed at a focal point, or target zone, 454 so that the diode beams converge towards target zone 454. In the particular configuration of lighting system 18 shown in FIG. 20, first total light beam 452, which is a converging beam, passes through imaging gate aperture 444 and thereafter encounters intervening collimating lens 446 from where a collimated second diode-generated total light beam 456 is directed to focusing lens 448 that then directs a focused third diode-generated light beam 458 to a screen 460. When focused third diode-generated light beam 458 strikes screen 460, an image created at imaging gate 438 is focused on screen 460. The image that is created is related to the shape of gate aperture 444 in itself, or is related to the shape of a gobo pattern made by gobo 440 located in gate aperture 444, or is related to the shape of a light beam made by a shutter blade 442 located in gate aperture 444. Collimating lens 446 and focusing lens 448 are movable within the optical lighting system by means known in the art so that third light beam 458 can zoom and focus the gobo pattern of gobo 440 or shutter blade shape of shutter blade 442 or other such shaping object located at imaging gate 438 onto screen 460. Screen 460 is also representative of other possible objects to illuminate, such as a person or a decorative construct.

Figure 21:
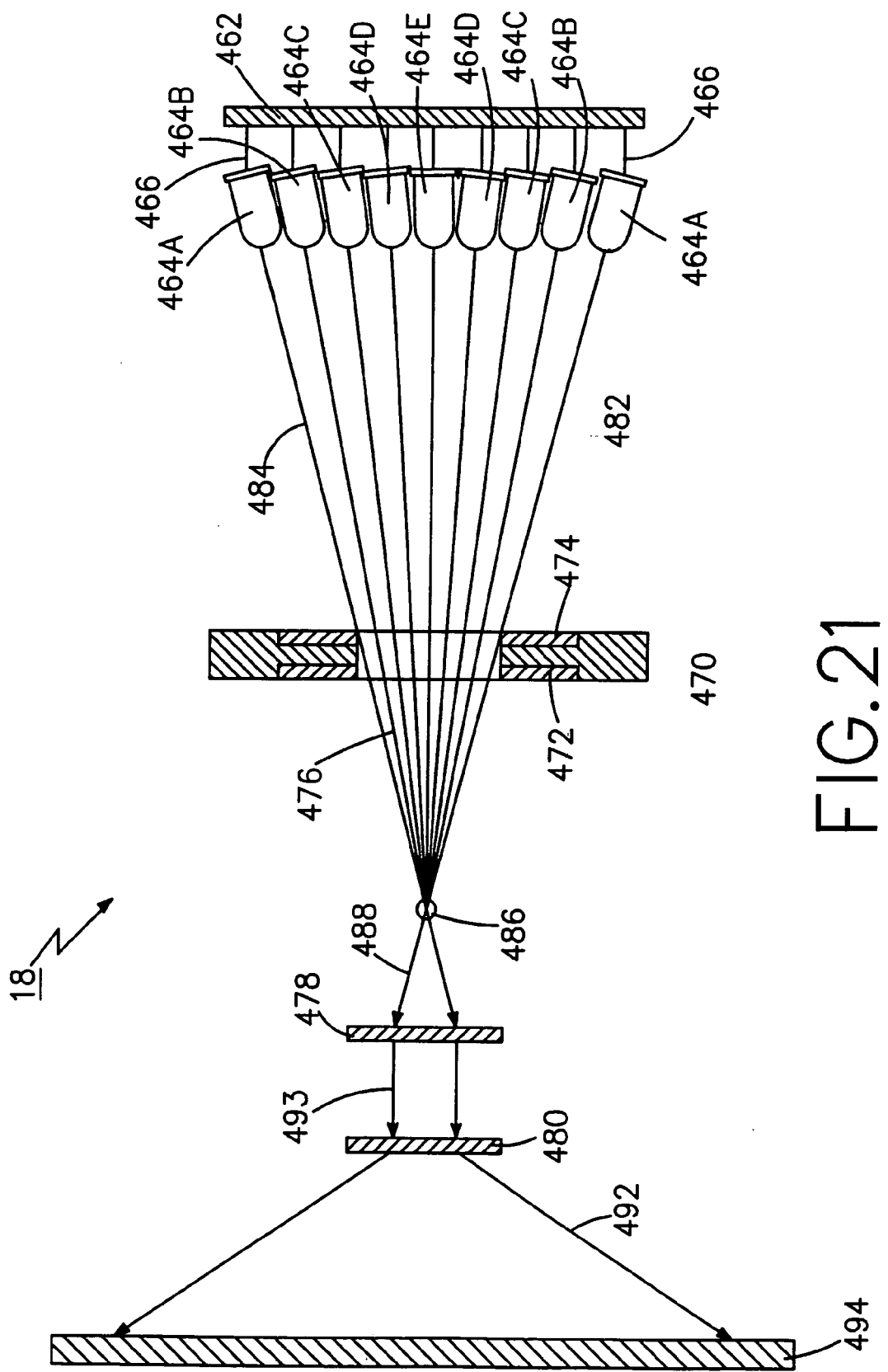
FIG. 21 is a schematic side view of a lighting system analogous to the lighting system shown in FIG. 20 including a substantially flat cylindrical circuit board that also functions as a mounting template with a plurality of LEDs individually secured the circuit board with the diode-generated light beams being directed through an imaging gate to a diode-generated beam-organizing target zone and then to a collimating lens and then to a focusing lens and then to a display surface.

Target zone 454 nonetheless achieves the function of the present invention for the reason that the paths of the totality of the 67 discrete light beams generated by diodes 432A–432E become organized in intensity and direction by their orientation towards target zone 454. The organization of first total light beam 452 is accomplished by each of diodes 432A–432E being positioned in graduated mounting steps 428, which are structured to orient each diode beam of diodes 432A–432E towards target zone 454. Another embodiment or configuration of architectural, theatrical and stage lighting system 18 is shown in FIG. 21 in a detailed configuration in a schematic side view. Lighting system 18 as shown in the configuration of FIG. 21 is analogous in certain respects to FIG. 6 and FIG. 20 and includes a circular flat nonconductive mounting frame for securing an array of 67 light emitting diodes 464A–464E that also functions and as an electrical circuit board to form a unitary mounting frame/electrical circuit board 462. Diodes 464A–464E are secured to combination, or unitary, diode frame/circuit board 462 by stiff electrical leads 466 that maintain the proper angular configuration of diodes 464A–464E. Unitary diode frame/circuit board 462 is made of a nonconductive material that maintains a rigid flat configuration as shown in FIG. 21 and is configured as a flat cylinder. Circular unitary frame/circuit board 462 has a thickness for the circuit board functions and for the bearing function for holding leads 466 and diodes 464A–464E and can also be designated as being cylindrical in configuration. In the particular diode array shown in FIG. 21, the array of diodes representing 4 rings of diodes 464A–464D and a single center diode 464E are shown sectioned in the midview of FIG. 21. Diodes 464A–464E are mounted as compactly as possible at the outer surface 468 of unitary diode frame/circuit board 462 by stiff electrical leads 466. There is a slight clearance of leads 466 between diodes 464A–464E and the circuit board function of unitary diode frame/circuit board 462 so that the epoxy bulb (not shown) at the base of each diode and thus the diode chip itself is not damaged from excessive heat during the soldering process of connection. This clearance is typically no less than 3 mm. from unitary diode frame/circuit board 462.

Diodes 464A–464E are mounted in a configuration of 4 concentric rings and one center diode 464E as follows: 28 diodes in a circular configuration around the outer rim of unitary diode frame/circuit board 462 as represented by exemplary diode 464A; 20 diodes in a circular configuration inwardly concentric with diodes 464A and as represented as diode 464B; 12 diodes 464C in a circular configuration inwardly concentric with diodes 464B as represented by exemplary diode 464C; and 6 diodes 464D in a circular configuration inwardly concentric with diodes 464C as represented by exemplary diode 464D. Single center diode 464E completes the diode array. A fixed imaging gate 470 is positioned proximate to unitary diode frame/circuit board 462. Imaging gate 470 is analogous to imaging gate 48 shown in FIG. 8. Imaging gate 470 has mounted thereto a gobo 472 and a shutter blade 474 such as gobo 50 and shutter blade 51 such as indicated in FIG. 8. Imaging gate 470 has a fixed gate aperture 476. A collimating lens 478 is positioned spaced from imaging gate 470 and a focusing lens 480 is positioned farther spaced from collimating lens 478. Each discrete diode beam 482 from each of diodes 464A–464E passes through gate aperture 476 and the totality of diode light beams creates a first total diode generated light beam 484 that passes through imaging gate aperture 476. First total diode light beam 484 substantially fills the areas around gate aperture 476 to produce an even coverage of light. The totality of light beams generated by diodes 464A–464E creates the first total diode light beam 484 that passes through imaging gate aperture 476.

In accordance with the present invention, each of the array of 67 diodes 464A–464E is independently positioned at unitary diode frame/circuit 462 at a preset angle by the adjustment of each stiff electrical lead 466 so that each discrete light beam 482 is directed at a focal point, or target zone, 486 so that the diode beams converge towards target zone 486. In the particular configuration of lighting system 18 shown in FIG. 21, first total light beam 484, which is a converging beam, passes through imaging gate aperture 476 reaching focus area, or target zone 486 from which point an inverted expanding second total diode light beam 484 encounters intervening collimating lens 478 from where a collimated third total diode-generated total light beam 493 is directed to focusing lens 480 that then directs a focused fourth total diode light beam 492 to a screen 494. When focused fourth diode-generated light beam 492 strikes screen 494, an image created at imaging gate 470 is focused on screen 494. The image that is created is either related to the shape of gate aperture 476 in itself, or is related to the shape of a gobo pattern made by gobo 472 located in gate aperture 476, or is related to the shape of a light beam made by shutter blade 474 located in gate aperture 476. Collimating lens 478 and focusing lens 480 are movable within the optical lighting system by means known in the art so that fourth total diode light beam 492 can zoom and focus the gobo pattern of gobo 472 or shutter blade shape 474 or other such shaping object located at imaging gate 470 onto screen 494. Screen 494 is also representative of other possible objects to illuminate, such as a person or a decorative construct.

Target zone 486 achieves the function of the present invention for the reason that the paths of the totality of the 67 discrete light beams generated by diodes 464A–464E become organized in intensity and direction by their orientation towards target zone 486. The organization of first total diode light beam 484 is accomplished by each of diodes 464A–464E being secured to unitary diode frame/circuit board 462, which together with stiff electrical leads 466 are structured to orient each diode beam 482 of diodes 464A–464E towards target zone 486.

Attachments for securing unitary diode frame/circuit board 462 to an optional lamp housing or to a mounting fixture can be optionally added to unitary diode frame/circuit board 462. Electronics for controlling the current related to diodes 464A–464E can be added to unitary diode frame/circuit board 462. Such electronics are analogous to the electronics discussed in relation to control electrical circuit board 180 set forth in relation to flexible unitary circuit board 158 shown in FIG. 13.

Figure 22:
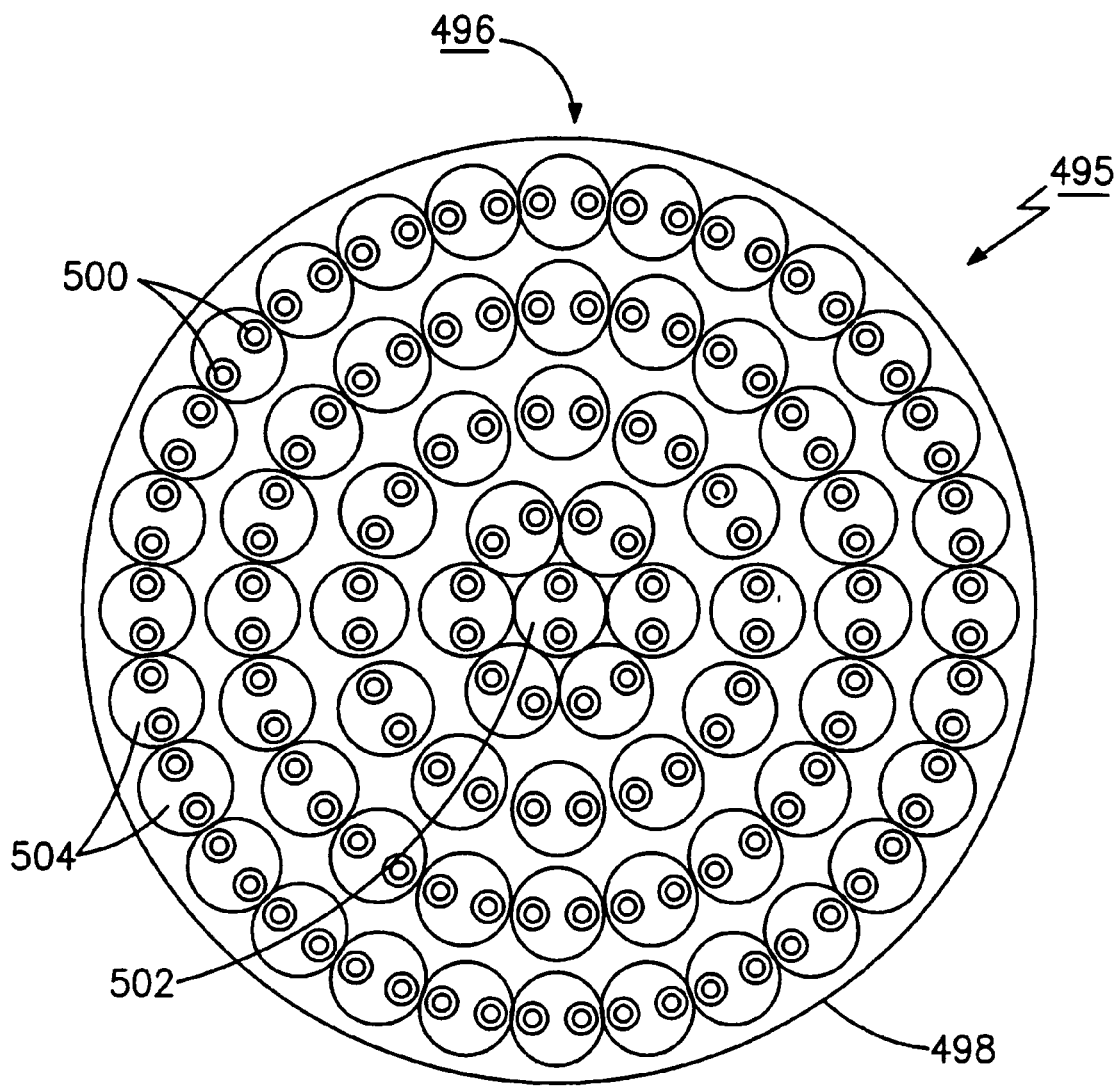
FIG. 22 is a top view of a rigid cylindrical circuit board that can be used for the circuit board for the lighting system configurations shown in FIGS. 20 and 21.

FIG. 22 shows a top view of a thin flexible blank 495 that is assembled to the cylindrical rigid unitary diode frame/circuit board 462 as shown in FIG. 21 prior to having diodes 464A–464E mounted thereto. Blank 495 is made of a rigid nonconductive material, for example, a polyimide material that can withstand high temperatures during a soldering process or standard G10 epoxy fiberglass boards. Blank 495 has opposed flat sides with a top side 496 as shown and a bottom side (not shown) and a circular edge 498. Top side 496 is the designated flat mounting surface for diodes 464A–464E.

Four ring formations concentric with center portion for diodes 464A–464D have 66 paired passages, or electrical lead holes 500 defined by blank 495 with a single pair of electrical lead holes 500 defined at a circular center portion 502 for diode 464E. A solder pad 504 is attached to top side 496 and another solder pad (not shown) is attached on the opposed bottom side at each of paired lead holes 498. Paired lead holes 500 are for accommodating stiff electrical leads 466 shown in FIG. 21. Diodes 464A–464E are to be mounted at paired lead holes 500 to achieve the configuration as discussed in relation to FIG. 21.

The circular configurations of paired electrical lead holes 500 shown in FIG. 22 as an first outer ring of 28 paired electrical lead holes 500 for accommodating diodes 464A, a second inward concentric ring of 20 paired electrical lead holes 500 for accommodating diodes 464B, a third inward concentric ring of 12 paired electrical lead holes 500 for accommodating diodes 464C, and a fourth inward concentric ring of 6 paired electrical lead holes 500 for accommodating diodes 464D. The center paired electrical lead hole 500 at center portion 502 accommodates center diode 464E to complete the diode array.

Attachments for securing unitary diode framework/circuit board 462 to an optional lamp housing or to a mounting fixture can be optionally added to unitary diode framework/circuit board 462. Electronics for controlling the current related to diodes 464A–464E can be added to unitary diode framework/circuit board 462. Such electronics are analogous to the electronics discussed in relationship to control electrical circuit board 180 set forth in relation to flexible unitary circuit board 158 shown in FIG. 13.

Flexible blank 495 can be alternatively structured as a blank with a printed circuit that includes paired solder pads on top side 496 so that Surface Mount Devices (SMD) light emitting diodes can be mounted to top side 496, which would in an analogous manner locate the printed circuit with the accompanying SMD's at the outer or front surface 468 of unitary frame/circuit board 462. Such a printed circuit structure is descibed in relation to FIGS. 19A and 19B showing a printed circuit 410 printed on flexible blank 394A and such an analogous structure can be applied to a flexible blank that can be substituted for flexible blank 495.

Flexible circuit board blanks such as flexible blanks 290, 394, 394A and 495 including FIGS. 19A and 19B can include the following composites:

The known resin and resin composites useful in flexible circuit boards are within the contemplation for use as the LED mount flexible sheet contruction of the present invention. Useful resins in the resin composites are various thermosetting resins, for example, an epoxy resin, an unsaturated polyester resin, an epoxy-isocyanate resin, a maleimide resin, a maleimide-epoxy resin, a cyanate ester resin, a cyanate ester-epoxy resin, a cyanate ester-maleimide resin, a phelonic resin, a diallylphthalate resin, an urethane resin, a cyanamide resin, and a maleimide-cyanamide resin.

By way of example, silicon-containing compounds, fluorine-containing compounds, and the polymers of these compounds are also useful with the aforementioned thermosetting resins. Typical examples of the silicon-containing compounds are organosiloxane and organopolysiloxane each of which has its terminals of its side chains functional groups such as amino groups, carboxyl groups, epoxy groups, hydroxyl groups, pyrimidinyl groups or carboxylic groups. Typical examples of the fluorine-containing compounds are perfluoroether, PTFE (polytetrafluoroethylene), PFA (tetrafluroethylene perfluoroalkyl vinyl ether copolymer), FEP (tetrafluoroethylene hexafluoropropene copolymer), PCTFE (polychlorotrifluoroethylene), ETFE (ethyene tetrafluroethylene copolymer), ECTFE (ethylene chlorotrifluoroethylene copolymer), PVDF (polyvinylidene difluoride) and PVF (polyvinyl fluoride) each of which has at its terminals or its side chains, functional groups such as amino groups, carboxyl groups, epoxy groups, hydroxyl groups, pyrimidinyl groups, isocyanic groups or carboxylic groups. Each of the polymers of the specified compounds should preferably have a molecular weight of $10^3$ to about $10^6$. These polymers effectively lower the elastic modulus.

In the present invention, the aforementioned resin composites of high heat resistance are also useful. By way of example, in the case of a resin composite which consists of an epoxy compound and a silicon-containing compound, the silicon-containing compound and the epoxy compound which have groups being reactive with epoxy groups or hydroxyl groups can be previously reacted in a solution at the preparation of a varnish. It is also possible to add a setting agent, an inorganic filler and/or a coupling agent.

As for a carrier substrate according to the present invention, a laminated plate composed of organic material and fiber reinforcing material such as glass cloth may be used. The laminated plate can be obtained by laminating, heating and pressing prepreg sheets of the fiber reinforcing material impregnated with the aforesaid resin component.

As for the above-mentioned reinforcing materials, they can be a cloth or sheet made of a non-organic fiber such as glass, titanium and so on; cloth or sheet made of polyamide, polyamideimide, polyimide, liquid-crystal polymer, aromatic amide; or a cloth or sheet made of a surface insulated carbon fiber or complex of these materials. The finished flexible sheet will have a heat resistance or glass transition temperature of about 150° C. to 300° C.

Polymers useful in forming a flexible sheet for LED mounting include, by way of example, the polyimides e.g., Kapton, the polyesters e.g., Mylar and Teflon, and the aramids e.g. Nomex and Kevlar.

The preferred thickness of flexible blanks 290, 394, 394A and 495 including FIGS. 19A and 19B might range generally between a lower end thickness of 0.0005 inch and an upper end thickness of 0.0625 inch, depending on the material used.

Each of housings 54, 198, 306 and 412 can have each of their rims 68, 210, 318 and 416, respectively, angled relative to the direction of the discrete diode beams emanating from each housing.

Figure 23:
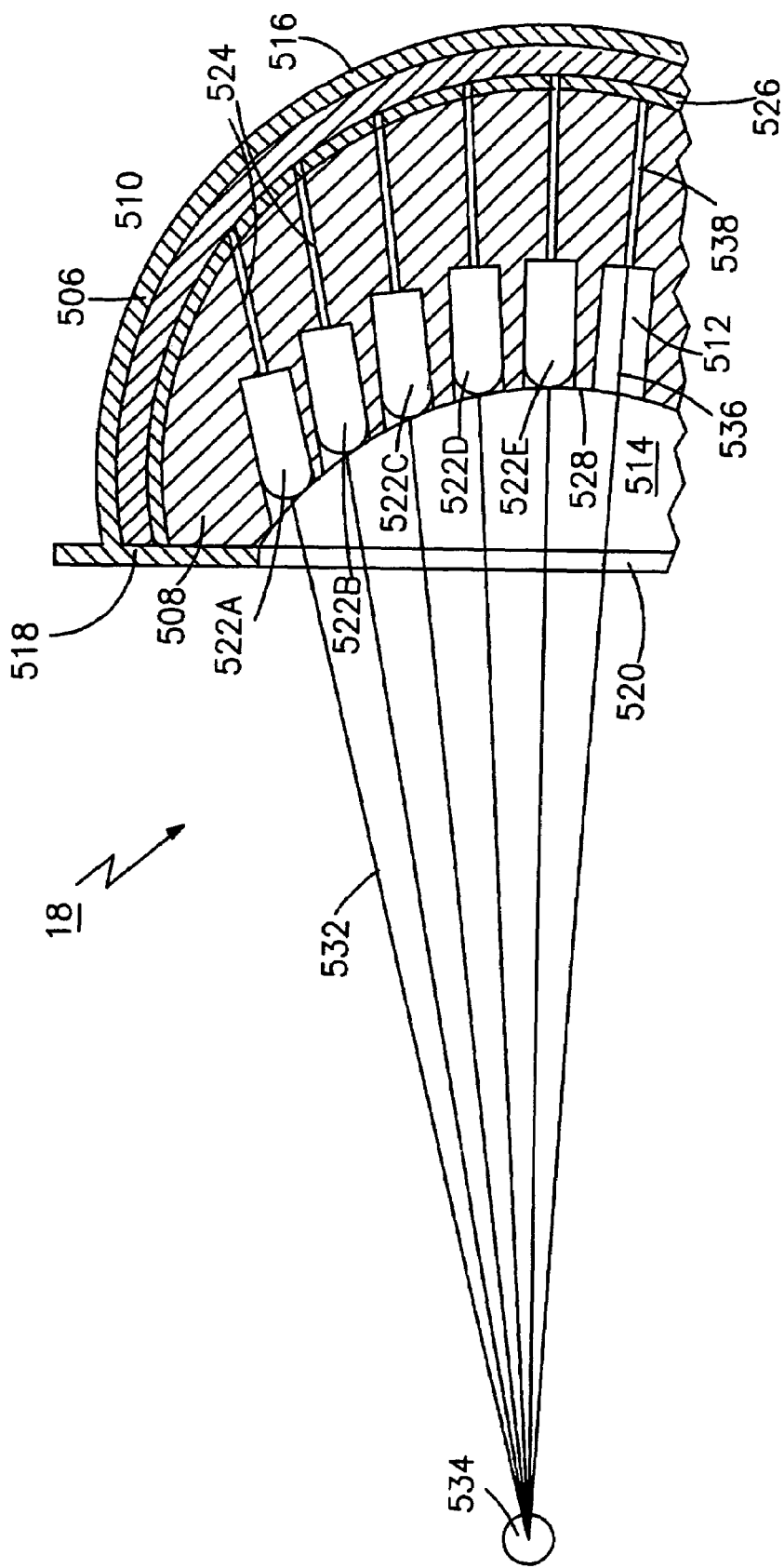
FIG. 23 is a schematic partial side view of another embodiment of diode individual mounting recesses for a plurality of LEDs shown as a part of a lighting system analogous to FIG. 17.

Another embodiment of the architectural, theatrical and stage lighting system 18 as shown in various configurations in FIGS. 2–7 and in particular analogous to the configuration shown in FIG. 17, is shown in FIG. 23 in a detailed configuration in a schematic side view. The FIG. 23 embodiment includes a mid-sectioned hollow volume configured as a semi-spherical-shaped, or hemispherical-shaped, nonconductive housing, or frame 506. A semi-spherical-shaped nonconductive diode mounting frame is shown in FIG. 23 as a mounting template 508 and is positioned in the hollow volume of frame 506. An electrical circuit board 510 that transmits and controls direct current electrical voltage is configured as a semi-sphere and is mounted adjacent to frame 506. Mounting template 508 includes a plurality of individual cylindrical recesses 512 that are located over the entire inner surface area of mounting template 508 and are represented in the expository partial view as six cylindrical recesses 512.

Mounting template 508 itself is configured so as to define a hollow volume, in particular being configured as a semi-spherical-shaped volume 514 having a curved base 516 and a periphery, or rim, 518 that defines a circular aperture 520. Semi-spherical shaped volume 514 is functionally coextensive with the semi-spherical-shaped volume defined by semi-spherical-shaped frame 506. Semi-spherical-shaped volume 514 of mounting template 508 has a semi-spherical shaped inner volume surface that is functionally coextensive with cylindrical recesses 512. Diodes 522A–522E positioned in cylindrical recesses 512 themselves form another semi-spherical-shaped volume that is functionally coextensive with semi-spherical-shaped volume 514. Each diode of plurality of diodes 522A–522E is provided with electrical leads 524 that are in electrical connection with circuit board 510. Each circular configuration of four concentric rings formed by diodes 522A–522D define planes parallel to one another and parallel to the plane defined by rim 518. Diodes 522D and 522E share curved base area 516 of semi-spherical-shaped semi-spherical shaped volume 514. An optional intervening semi-spherical shaped mounting board 526 is positioned between mounting template 508 and electrical circuit board 510. Each of diodes 522A–522E are provided with electrical leads 524 to circuit board 510. A slight clearance at leads 524 between diodes 522A–522D and mounting board 526, or circuit board 510, as the case may be, is recommended, so that the epoxy bulb (not shown) at the base of each diode and thus the diode chip itself is not damaged from excessive heat during the soldering process of connection. This clearance is typically no less than 3 mm. Inner surface 528 of mounting template 508 can be coated with a layer of a light reflecting substance 530 to further enhance the collection and dissemination of any scattered light beams within semi-spherical-shaped volume 514.

Light emitting diodes are placed in cylindrical recesses 512 in a compact as possible an array of diodes. In the particular array shown in FIG. 23, a plurality of diodes represented by sectioned diodes 522A–522D in a configuration of four concentric rings onto graduated cylindrical recesses 512 with the first ring represented by diodes 522A in a circular configuration around the outer rim of semi-spherical-shaped mounting template 508; the second ring represented by diode 522B in a circular configuration inwardly concentric with ring of diodes 522A; the third ring represented by diode 522C in a circular configuration inwardly concentric with diodes 522B; and the fourth ring represented by both diode 522D and 522E in a circular configuration inwardly concentric with diodes 522C.

In accordance with the present invention, the diodes of the array of diodes rings represented by diodes 522A–522D are independently positioned at graduated, or stepped, cylindrical recesses 512 at a preset angle so that each discrete diode light beam 532 is directed at a focal point, or target zone, 534. In the particular configuration of lighting system 18 shown in FIG. 23, first total diode light beam 536, which is a converging beam, converges at target zone 534. A subsequent inverted second total diode light beam 538 travels to an illumination area (not shown). An imaging gate such an imaging gate 330, an intervening collimating lens such as collimating lens 338, and an intervening focusing lens such as focusing lens 340 all shown in FIG. 17 can likewise be used as a part of the illustrative configuration as shown in FIG. 23.

Target zone 534 achieves the function of the present invention for the reason that the paths of the totality of the plurality of discrete light beams 532 generated by diode rings 522A–522D become organized in intensity and direction by their orientation towards target zone 534. The organization of discrete diode light beams 532 is accomplished by each of diodes rings 522A–522D being positioned in cylindrical recesses 512, which are structured to orient each discrete diode light beam of diode rings 522A–522D towards target zone 534.

Cylindrical recesses 512 have diameters that are approximately the same as the diameters of diodes 522A–522E such that diodes 522A–522E can be press-fitted into cylindrical recesses 512 and diodes 522A–522E are operatively gripped therein. In addition, diodes 522A–522E can be removed from cylindrical recesses 512. Each of cylindrical recesses 512, one of which is shown at an expository empty cylindrical recess 512 shown next to center diode 522E, has a cylindrical axis 538 aligned with focus point (target zone) 534. Electrical leads 524 secure diodes 522A–522E to electrical circuit board 510. Electrical leads 524 can be removed either from each of diodes 522A–522E or from electrical circuit board 510 in a manner known in the art and thereupon slid into or from the elongated passages 538 formed in mounting template 508 when diodes 522A–522E are mounted into or removed from cylindrical recesses 512.

The diodes shown in FIGS. 9, 14, and 17 are removably secured to mounting steps 60, 204, 312, by a number of ways known in the art, such as by gluing or using snap-on connectors. The referred to diodes are removably secured to electrical circuit boards 58, 202, and 310, respectively, by electrical leads 72, 216, 324, respectively. Electrical leads 72, 216, and 324 extend through elongated passages formed in mounting templates 56, 200, and 308.

Figure 24:
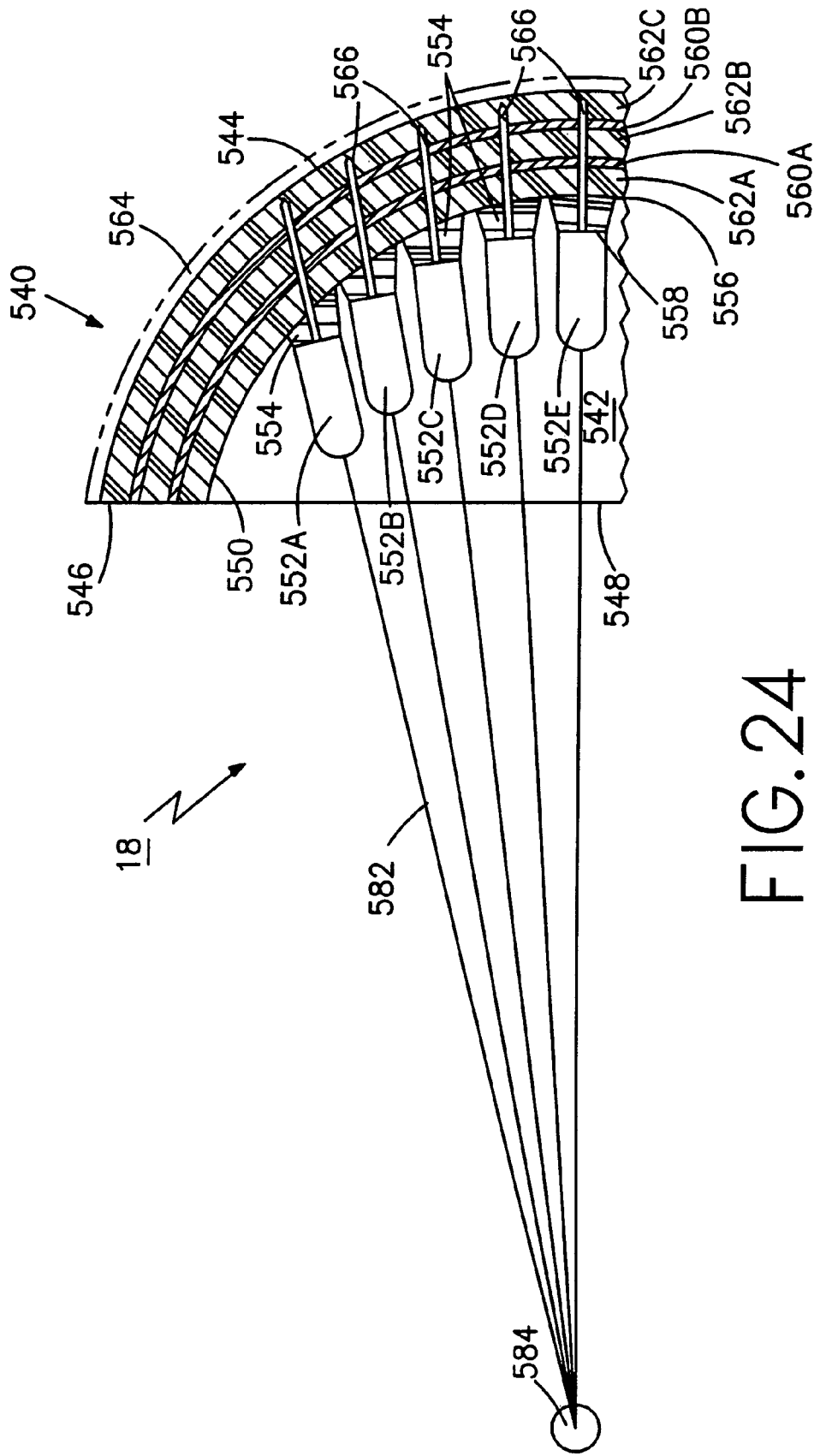
FIG. 24 is a schematic partial side view of another embodiment of the present invention analogous to FIG. 17 having a semi-spherical-shaped hollow volume formed by a sandwich structure with two conductive cores interposed between layers foam insulating material with a plurality of LEDs removably mounted thereto by electrical pin connectors in contact with the conductive cores.

Another embodiment of architectural, theatrical and stage lighting system 18 as that shown in various configurations in FIGS. 2–7 and in particular analogous to the configuration shown in FIG. 18 is shown in FIG. 24 in a detailed configuration in a schematic side view and includes a partial mid-sectioned hollow volume configured as a semi-spherical-shaped, or hemispherical-shaped, sandwich structure housing, or frame, 540. Basic elements of sandwich frame 540 herein are described in U.S. Pat. No. 6,132,859 issued to Jolly on Oct. 17, 2000, as a sandwich panel, whose patent is incorporated herein and made a part of the present disclosure.

Sandwich frame 540 itself is arcuate so as to define a hollow volume, in particular being configured as a semi-spherical-shaped hollow volume 542 having a curved base 544 and a periphery, or rim, 546 that defines a circular aperture 548. Semi-spherical-shaped volume 542 as defined by sandwich frame 540 has a semi-spherical shaped curved inner volume surface 550. Five diodes 552A–552E are shown in FIG. 24 and are positioned in volume 542 and are mounted to five diode mounts 554 that are functionally secured to inner volume surface 550 such that diode mounts 554 themselves define another semi-spherical-shaped volume that is functionally coextensive with semi-spherical-shaped volume 542. Thus, diode mounts 554 in effect direct the discrete light beams emanating from diodes 552A–552D. Diodes 552A–552D each represent a plurality of diode rings that are in planes parallel to the plane defined by rim 546 and aperture 548. Diode 552E is a single center diode at base 544. Diode mounts 554 are made of a nonconductive material such as a nonconductive plastic.

Sandwich frame 540 includes two conductive layers, namely, positive conductive metal sheet, or layer, 560A and negative conductive metal sheet, or layer, 560B that are interposed between three biasable layers of nonconductive, insulating nonconductive foam 562A, 562B and 562C. Foam layer 562A is the innermost foam layer. Foam layer 562B is positioned between innermost conductive layer 562A and outermost conductive layer 562C, which is located at the outer curve of sandwich frame 540 and in effect forms the arcuate outer wall of sandwich frame 540. A protective arcuate outer wall 564 shown in phantom line can optionally enclose outermost foam layer 562C.

A mounting pin 566 of cylindrical configuration is joined to each of diodes 552A–552E at one end and has a metal pointed tip 568 at the other end that is embedded within outer foam layer 562B. Because pins 566 are inserted into and positioned within foam layers 562A, 562B and 562C and can be retracted without leaving any significant trace, the diameter of pins 566 is small.

In FIG. 25, each pin 566 includes a cylindrical pin wall 570 defining a hollow cylindrical pin passage 572 in which are positioned a positive electrical lead, or wire 574A and a negative electrical lead, or wire 574B that are in electrical contact with diodes 552A–552E. Pin wall 570 includes a nonconductive wall portions 575 and also includes a cylindrical first conductive pin wall portion 576A and a cylindrical second conductive pin wall portion 576B spaced from first conductive pin wall portion 576A and from pin tip 568. Positive electrical wire 574A is in electrical contact with first conductive pin wall portion 576 at an electrical contact 578A and negative electrical wire 574B is in electrical contact with second conductive pin wall portion 576B at an electrical contact 578B both contacts being by welded connections.

The insulating material of foam layers 560A, 560B and 560C has an elasticity threshold at least equal to the maximum pressure exerted by any one of pins 566. One such material is polyurethane.

As shown in FIG. 25, pin 566, on insertion, crushes foam layers 562A, 562B and 562C and breaks through, or perforates, conductive sheets 560A and 560B, which fold or bend back to form peripheral, or petaled, first and second peripheral connector portions 580A and 580B, respectively, in circular configurations dipped downwardly surrounding around each pin 566 in the direction of introduction of each pin 566. Biasable foam layers 562A, 562B and 562C have elastic recovery properties that cause the return bending of first and second connector portions 578A and 578B of conductor sheets 560A and 560B, respectively, in the direction of inserted pin 566. Thus, first and second peripheral connector portions 580A and 580B are pressed against first and second cylindrical pin wall conductive portions 576A and 576B, respectively, with sufficient contact surface and sufficient contact pressure to pass electrical current to and from positive and negative electrical wires 574A and 574B for illuminating diodes 552A–552E.

In the particular array shown in FIG. 24, light emitting diodes are placed in semi-spherical-shaped hollow volume 542 in as compact as possible array. A plurality of diodes represented by sectioned diodes 552A–552D in a configuration of four concentric rings onto diode mounts 554 that in turn are secured to inner surface 550. A first outer ring of diodes are represented by diodes 552A in a circular configuration around rim 546; a second ring of diodes are represented by diode 552B in a circular configuration inwardly concentric with ring of diodes 552A; a third ring of diodes are represented by diode 552C in a circular configuration inwardly concentric with diodes 552B; and a fourth ring of diodes is represented by diode 552D in a circular configuration inwardly concentric with diodes 552C. Diode 552E is the single central diode. The described configuration and arrangement are for purposes of exposition only and many other arrangement and numbers of diodes are possible within the spirit of the invention.

In accordance with the present invention, the diodes of the array of diodes rings represented by diodes 552A–552D and diode 552E are independently at a preset angle so that each discrete diode light beam 582 is directed at a focal point, or target zone, 584. Diode mounts 554 are oriented to direct each such discrete diode light beam 582 to target zone 584. Subsequent directioning of each diode beam 582 after emergence beyond target zone 584 can be in accordance with the lighting system shown in FIG. 23, for example, that shows an inverted second total diode light beam 538 that travels to an illumination area (not shown). Other aspects of a lighting system such as an imaging gate such an imaging gate 330, an intervening collimating lens such as collimating lens 338, and an intervening focusing lens such as focusing lens 340 all shown in FIG. 17 can likewise be used as a part of the illustrative configuration as shown in FIG. 24. Target zone 584 achieves the function of the present invention for the reason that the paths of the totality of the plurality of discrete light beams 582 generated by diodes 552A–552E become organized in intensity and direction by their orientation towards target zone 584. The organization of discrete diode light beams 582 is accomplished by each of diodes 552A–552E being positioned upon and secured to diode mounts 554, which are positioned and arranged to orient each discrete diode light beam 582 of diodes 552A–552E towards target zone 584. An optional stiff protective layer 586 is mounted over inner foam layer 562A and the bottom walls 558 of diode mounts 554 are secured to stiff protective layer 586.

As best seen in FIG. 25, positive and negative electrical wires 574A and 574B are positioned in pin passage 572. Positive electrical wire 574A is connected to diode bottom 590 and extends therefrom to an electrical connector 592A that electrically connects positive electrical wire 574A with first conductive pin wall portion 576A which in turn is in electrical contact with first electrical contact area 578A that in turn is in electrical contact with positive conductive metal sheet 560A. Likewise, positive electrical wire 574B is connected to diode bottom 590 and extends therefrom to an electrical connector 592B that electrically connects positive electrical wire 574B with first conductive pin wall portion 576B which in turn is in electrical contact with first electrical contact area 578B that in turn is in electrical contact with positive conductive metal sheet 560B.

In accordance with the present invention biasing pressure from middle and outer foam layers 562B and 562C exert a pressure in the horizontal direction on first and second peripheral connecting portions 580A and 580B of positive and negative conductive metal sheets 560A and 560B so as to press them against first and second peripheral conductive connecting portions 580A and 580B as indicated by pair of arrows 596 and pair of arrows 598.

Layers of adhesive cement (not shown) are generally used to secure the different foam layers 562A, 562B and 562C and conductive metal sheets 560A and 560B together. Such cement layers preferably have elastomeric qualities. Elastomeric cement can also have conductive qualities. FIG. 25 indicates an alternative to positive and negative conductive metal sheets 560A and 560B in the form of an elastomeric glue, or cement indicated as 600A and 600B and which is of sufficient thickness that can be substituted for conductive metal sheets 560A and 560B, respectively, that provides a securing effect, an added element of elastic return effect, and sufficient electric conductive effect in a single layer of material.

FIG. 25 also indicates an alternative to positive and conductive metal sheets 560A and 560B in the form of multi-sheet assemblies of material having elastic return properties and electrically conductive material indicated as 601A and 601B, respectively, that can be substituted for conductive metal sheets 560A and 560B, respectively, that provide an added element of elastic return effect, and sufficient electric conductive effect in single layer of material. Such multi-sheet assemblies comprise alternate metal sheets and elastomer layers.

FIG. 25 also indicates another alternative to positive and conductive metal sheets 560A and 560B in the form of conductively loaded foam material having elastic return properties shown as 601A and 601B, respectively, that can be substituted for conductive metal sheets 560A and 560B, respectively, that provide the element of elastic return effect and sufficient electric conductive effect in a single layer of material.

Figure 26:
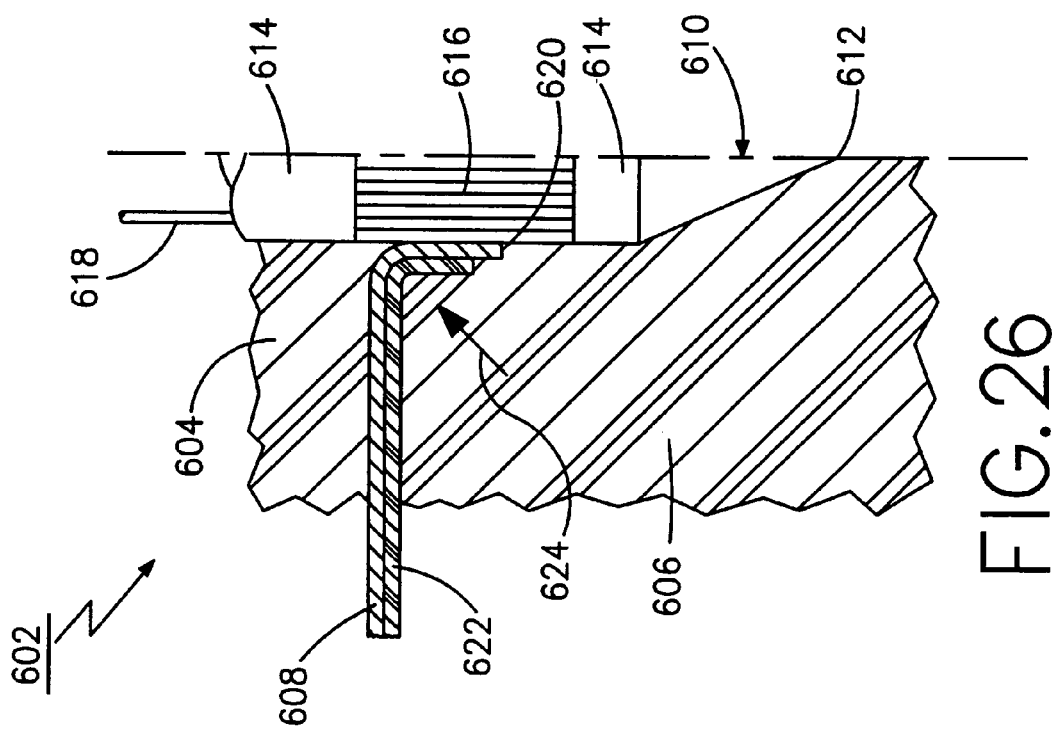
FIG. 26 is a partial sectioned side view of a bottom area of an electrical pin connector analogous to the electrical pin connector shown in FIG. 24 with a sheet of material having elastic recovery properties interposed between the insulating foam and a bottom conductive layer.

FIG. 26 shows an isolated portion of an alternative sandwich structure housing 602 similar to sandwich frame 540 shown in FIG. 24 and that in particular shows portions of a nonconductive middle foam layer 604 and a nonconductive outer foam layer 606 with a conductive metal sheet 608 interposed there between with the structure being analogous respectively to middle foam layer 562B, outer foam layer 562C and negative conductive metal sheet 560B interposed there between as shown in FIG. 25. In the case of alternative sandwich structure housing 602, a sheet of biasable material 610 having elastic recovery properties is interposed between outer foam layer 606 and outer conductive metal sheet 608. A pin 610 analogous to pin 566 shown with sandwich frame 540 has been punched through alternative sandwich structure housing 602. Pin 610 includes a pin tip 612, a non-conducive pin outer wall portion 614 and an outer conductive pin wall portion 616 analogous to second conductive pin wall portion 576B shown in FIG. 25. A positive electrical wire 618 is shown mounted inside of pin 610. Outer conductive metal sheet 608 has been folded into an outer peripheral petaled connecting portion 620 into electrical contact with outer conductive pin wall portion 616 by the entry of pin 610 into alternative sandwich structure housing 602. In accordance with the inventive aspect of alternative sandwich structure housing 602, a sheet of biasable material 622 having elastic return properties such as an elastomer is interposed between outer conductive metal sheet 608 and outer foam layer 606, that is, directly below and in contact with outer conductive metal sheet 608 in the direction of introduction of pin 610. Sheet of biasable material 622 also folds into a peripheral petaled portion that is in pressing contact with peripheral petaled connecting portion 620 by the action of the entry of pin 610 into alternative sandwich structure housing 602. The pressure exerted by outer foam layer 606 in the horizontal direction on outer peripheral conductive portion 620 is reinforced by the pressure exerted by sheet of biasable material 608 as indicated by arrow 624 so as to aid in increasing the electrical contact area and thus creating an increased electrical contact between outer conductive pin wall portion 616 and outer conductive metal sheet 608 than would be the case with the pressure exerted by outer foam layer 606 alone. The figure and description herein regarding outer conductive metal sheet 608, outer foam layer 606, and sheet of biasable material 622 applies likewise to the remaining structure (not shown) between middle foam layer 604 and the inner conductive sheet (not shown) interposed between middle foam layer and the inner foam layer (not shown) of alternative sandwich structure 602.

Figure 27:
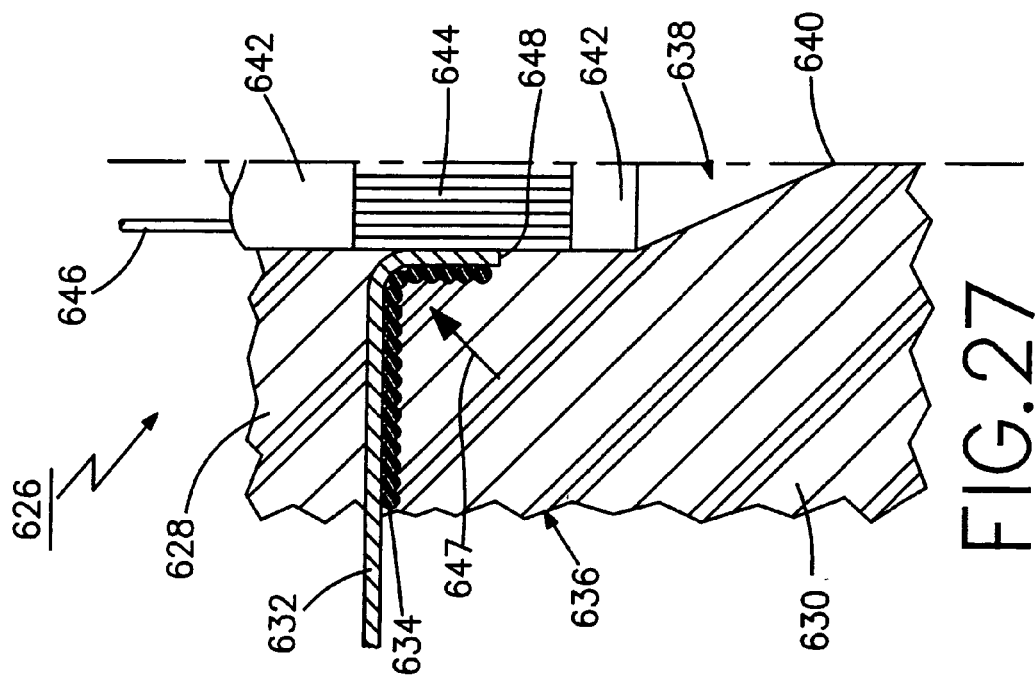
FIG. 27 is a partial sectioned side view of a bottom area of an electrical pin connector analogous to the electrical pin connector shown in FIG. 24 including a layer of elastomer balls embedded in the upper layer of the insulating foam facing the conductive layer.

FIG. 27 shows an isolated portion of an alternative sandwich structure housing 626 similar to sandwich frame 540 shown in FIG. 24 and that in particular shows portions of a nonconductive middle foam layer 628 and a nonconductive outer foam layer 630 with a conductive metal sheet 632 interposed there between with the structure being analogous respectively to middle foam layer 562B, outer foam layer 562C and negative conductive metal sheet 560B interposed there between as shown in FIG. 25. In the case of alternative sandwich structure housing 626, an integrated layer of insulating biasable material 634 having elastic recovery properties is made integral with outer foam layer 630, which structure is accomplished during the production process at least at the surface area 636 of outer foam layer 630 specifically between outer foam layer 630 and outer conductive metal sheet 632. Integrated layer of insulating biasable material 634 can be an insulating foam that is more elastic than outer foam layer 630 and can comprise, for example, elastomeric balls, which are shown in FIG. 27.

A pin 638 analogous to pin 566 shown with sandwich frame 540 has been punched through alternative sandwich structure housing 626. Pin 638 includes a pin tip 640, a nonconductive portion of pin outer wall 642 and a conductive portion of pin outer wall 644 analogous to second conductive pin wall portion 576B shown in FIG. 25. A positive electrical wire 646 (negative wire not shown) is shown mounted inside of pin 638. Outer conductive metal sheet 632 has been folded into an outer peripheral, or petaled, connecting portion 648 into electrical contact with conductive portion of pin outer wall 644 by the entry of pin 638 into alternative sandwich structure housing 626.

In accordance with the inventive aspect of alternative sandwich structure housing 626, the pressure exerted by outer foam layer 630 in the horizontal direction on outer peripheral conductive portion 648 is reinforced by the pressure exerted by integrated layer of insulating biasable material (elastomeric balls) 634 as indicated by arrow 647 so as to aid in increasing the electrical contact area and thus creating an increased electrical contact between conductive outer pin wall portion 644 and outer conductive metal sheet 632 than would be the case with the pressure exerted by outer foam layer 630 alone. The figure and description herein regarding outer conductive metal sheet 646, outer foam layer 630 and integrated layer of insulating biasable material 634 applies likewise to the remaining structure (not shown) between middle foam layer 628 and the inner conductive sheet (not shown) interposed between middle foam layer 628 and the inner foam layer (not shown) of alternative sandwich structure housing 626, which as stated earlier is analogous to sandwich frame 540.

FIG. 28 shows a sandwich frame 650 that is analogous to sandwich frame 540 and that defines a semi-spherical-shaped hollow volume 652 such as hollow volume 542 such as described in relation to FIGS. 24 and 25. Hollow volume 652 has an inner volume curved surface 654 and a rim 656 that defines a circular aperture 658. An exemplary light emitting diode 660 emitting a discrete diode light beam 662 to a focal point, or target zone (not shown), is positioned in hollow volume 652. Diode 660 is representative of a plurality of diodes mounted in hollow volume 652, such as diodes 552A–552E shown in FIG. 24 that themselves represent a totality of a plurality of diodes mounted in hollow volume 542.

Exemplary diode 660 is mounted to diode mount 664 that is secured to inner volume surface 654 such that all the diode mounts (not shown) themselves define another semi-spherical-shaped volume that is functionally coextensive with inner volume surface 654 of semi-spherical-shaped hollow volume 652.

Diode mount 664 is secured to curved inner surface 654 by any means known in the art of mounting, for example, by gluing or by pin connectors. Diode mount 664 includes a curved bottom surface 666 contoured to curved inner volume surface 654 and further includes a flat top surface 668 to which diode 660 is positioned, optionally removably positioned. Diode mount 664 is made of a nonconductive material such as a nonconductive plastic.

Sandwich frame 650 includes two conductive layers, namely, positive conductive metal sheet, or layer, 670A and negative conductive metal sheet, or layer, 670B that are interposed between three biasable layers of nonconductive, insulating nonconductive foam 672A, 672B and 672C.

Foam layer 672A is the innermost foam layer and foam layer 672C is the outermost foam layer. Foam layer 672B is positioned between innermost nonconductive layer 672A and outermost foam layer 672C, which is located at the outer curve of sandwich frame 650 and in effect forms the arcuate outer wall of sandwich frame 650. Positive conductive layer 670A is positioned between inner foam layer 672A and middle foam layer 672B, and negative conductive layer is positioned between inner foam layer 672B and outer foam layer 672C.

As shown in FIG. 28, a pair of mounting pins 674 and 676 of cylindrical configuration are each joined at one end to diode 660, which as before stated is representative of each of the plurality of diodes mounted to sandwich frame 650, and each have pointed tips 678 and 680, respectively, at the other end. Pin 674 is a long pin and pin 676 is a short pin. Long pin 674 extends through diode mount 664 and foam layers 672A and 672B with long pin tip 678 being positioned in outer foam layer 672C. Short pin 676 extends through diode mount 664 and foam layer 672A with short pin tip 680 being positioned in middle foam layer 672B. Because long and short pins 674 and 676 are inserted into and positioned in foam layers 672A, 672B and 672C and foam layers 672A and 672B, respectively, and can be retracted without leaving any significant trace, the diameters of long and short pins 674 and 676 are relatively small. Long and short pins 674 and 676 are made of a stiff conductive metal that is able to withstand the force of penetration into foam layers 672A, 672B and 672C without distortion.

As also seen in FIG. 29A, long pin 674 is enclosed by a cylindrical nonconductive pin outer wall 682 that defines a hollow cylindrical long pin passage 684 in which is positioned long pin 674. Nonconductive long pin wall 682 terminates at a point 686 in middle foam layer 672B. Long pin 674 functions as the negative electrical lead in electrical connection with diode 660. Long pin nonconductive outer wall 682 continues to a termination point 686 in middle foam layer 672B and long pin 674 continues from termination point 686 as a bare electrical lead in electrical contact with negative conductive metal strip 670B and long pin tip 678 is positioned in outer foam layer 672C.

Short pin 676 functions as a bare electrical lead in electrical contact with positive conductive metal strip 670A. A short pin passage 685 is defined in FIG. 29B. Short pin 676 is made of a metal with sufficient stiffness and strength so as to be able to penetrate both inner foam layer 672A and middle 672B foam layer with short pin tip 680 being positioned in middle foam layer 672B. Short pin 676 is in electrical contact with inner positive conductive metal strip 670A. Thus, an electrical circuit is formed between diode 660 and inner and outer conductive metal strips 670A and 670B and a source of electrical power (not shown) in electric circuit connection with positive and negative conductive metal strips 670A and 670B.

As shown in FIG. 28, long pin 674 crushes biasable foam layers 672A, 672B and 672C and breaks through, or perforates, conductive sheets 670A and 670B, which fold or bend back to form peripheral, or petaled first and second peripheral connector portions, or petals 688A and 688B, respectively, in circular configurations downwardly around each long and short pin 674 and 676, respectively, in the direction of introduction of each long and short pin 674 and 676. Biasable foam layers 672A, 672B and 672C have elastic recovery properties that bends back, or pressures, first and second petals 688A and 688B of conductive sheets 670A and 670B, respectively, in the direction of introduction of long and short pins 674 and 676. Thus, first and second petals 688A and 688B are pressed against long and short pins 674 and 676, respectively, with sufficient contact surface and sufficient contact pressure to pass electrical current to and from positive and negative pins 674 and 676 in the quantity necessary for illuminating diode 660.

The insulating material of foam layers 672A, 672B and 672C has an elasticity threshold that will grip and hold in place both long and short mounting pins 674 and 676. In particular, the insulating material of foam layers 672A, 672B and 672C has an elasticity threshold at least equal to the maximum pressure exerted by any one of pins 674 and 676. One such material is polyurethane.

Sandwich frames 540, 602, 626 and 650 can be configured as ellipsoids, cones, and semi-spherical hollow volumes among other possible frame configurations. In addition sandwich frames 540, 602, 626, and 650 are to be used in combination with the lighting systems shown in FIGS. 2, 3, 4, 5, 6, and 7 including all discrete diode beams being directed to a focal point (target zone) 28 as shown therein and to an illumination area 36. A fixed imaging gate 48 including gobo 50 and shutters 51 can also be used with sandwich frames 540, 602, 626 and 650.

With reference to

Another embodiment of architectural, theatrical and stage lighting system 18 as that shown in various configurations in FIGS. 2–7 and in particular analogous to the configuration shown in FIG. 20 is shown in FIG. 30 in a detailed configuration in a schematic side view and includes a partial mid-sectioned configured as a substantially planar sandwich structure housing, or frame, 690. Basic elements of sandwich frame 690 herein are described in U.S. Pat. No. 6,132,859 issued to Jolly on Oct. 17, 2000, as a sandwich panel, which patent is incorporated herein and made a part of the present disclosure. In addition, sandwich structure frame 690 is analogous to sandwich structure frame 650 shown in FIGS. 24 and 25.

Sandwich frame 690 is substantially planar. Seven diodes 692A–692G are shown in FIG. 30 mounted to a planar mounting template 694 that is secured to a front planar surface 696 of sandwich frame 690 by a nonconductive means known in the art, for example, a nonconductive cement (not shown). Mounting template 694 is made of a nonconductive material such as plastic. Diodes 692A–692G each represent one of a plurality of diodes positioned in a rectangular configuration connected to mounting template 694. Diodes 692A–692C and 692E–692G are mounted on steps 698 that are integral with mounting template 694. Central diode 692D is secured directly to mounting template 694. FIG. 30A shows a detail of a typical step 698 with exemplary diode 692A mounted to a flat slanted surface 700 of typical step 698. The flat bottom of diode 692A is mounted to flat slanted surface 700 so that each discrete diode light beam 702 is directed to a focal point (target zone) 704.

Sandwich frame 690 includes two conductive layers, namely, positive conductive metal sheet, or layer, 706A and negative conductive metal sheet, or layer, 706B that are interposed between three biasable layers of nonconductive, insulating nonconductive foam layers 708A, 708B and 708C. Foam layer 708A is the innermost foam layer and foam layer 708C is the outermost foam layer and foam layer 708B is positioned between inner foam layer 708A and outer foam layer 708C, which is located at the outer area of sandwich frame 690 and in effect forms the planar outer wall of sandwich frame 690. A protective planar outer wall 710 shown in phantom line can optionally enclose outermost foam layer 708C. Positive conductive layer 706A is positioned between outer foam layer 708A and middle foam layer 708B, and negative conductive layer 706B is positioned between middle foam layer 708B and outer foam layer 708C.

Mounting pins 712 of cylindrical configuration are joined to each of diodes 692A–692G at one end and have pointed tips 714 at the other end. Because each pin 712 is inserted into and positioned within foam layers 708A, 708B and 708C and can be retracted without leaving any significant trace, the diameter of pins 712 is small.

Each pin 712 includes a cylindrical pin wall defining a hollow cylindrical pin passage in which are positioned a positive electrical lead, or wire, and a negative electrical lead, or wire, that are in electrical contact with diodes 692A–692G. This structure is as shown as described relative to FIG. 25. Each pin 712 has a pin wall that includes a nonconductive wall portion and also includes a cylindrical first conductive pin wall portion and a cylindrical second conductive pin wall portion that is spaced from the first conductive pin wall portion and from pin tip 714. The positive electrical wire is in electrical contact with the first conductive pin wall portion at one electrical contact and the negative electrical wire is in electrical contact with the second conductive pin wall portion at another electrical contact. The positive electrical wire and the negative electrical wire are both insulated against electrical contact within each pin passage. Again, this is as shown and described in relation to FIG. 25.

As shown in FIG. 30, pin 712 crushes foam layers 708A, 708B and 708C and breaks through, or perforates, conductive layers 706A and 706B, which fold or bend back to form peripheral, or petaled, first and second peripheral connector portions 716A and 716B, respectively, in circular configurations downwardly around each pin 712 in the direction of introduction of each pin 712. Biasable foam layers 708A, 708B and 708C have elastic recovery properties that bends back, or pressures, first and second connector portions, or petals, 716A and 716B of conductor layers 706A and 706B, respectively, in the direction of introduction of pin 712. Thus, first and second petals 716A and 716B are pressed against the first and second cylindrical pin wall conductive portions described in relation to FIG. 25 as first and second cylindrical pin wall conductive portions 576A and 576B, respectively, with sufficient contact surface and sufficient contact pressure to pass electrical current to and from the positive and negative electrical wires in pin 712 in the quantity necessary for illuminating diodes 692A–692G.

As shown in FIG. 30, long pins 712 crush biasable foam layers 708A, 708B and 708C and breaks through, or perforates, conductive sheets 706A and 706B, which fold or bend back to form peripheral, or petaled first and second peripheral connector portions, or petals 716A and 716B, respectively, in circular configurations downwardly around pins 712 in the direction of introduction of pins 712. Biasable foam layers 708A, 708B and 708C have elastic recovery properties that bends back, or pressures, first and second petals 716A and 716B of conductive sheets 706A and 706B, respectively, in the direction of introduction of pins 712. Thus, first and second petals 716A and 716B are pressed against pins 712 with sufficient contact surface and sufficient contact pressure to pass electrical current to and from pins 712 in the quantity necessary for illuminating diodes 692A–692G.

The insulating material of foam layers 708A, 708B and 708C has an elasticity threshold that will grip and hold in place pins 712. In particular, the insulating material of foam layers 708A, 708B and 708C has an elasticity threshold at least equal to the maximum pressure exerted by pins 712. One such material is polyurethane.

Diodes 692A–692G can optionally be provided with two pins such as long and short pins 674 and 676 shown in FIG. 28 and described relative to the two pin structure shown therein, namely long and short pins 674 and 676, respectively.

Each discrete diode beam 702 is directed to target zone 704 from where such discrete beams can be directed to an illumination screen 718 directly. FIG. 30 shows discrete light beams 702 being directed to a fixed imaging gate 720 and then to a first focal lens 722, then to a second focal lens 724 and thereupon focused at illumination screen 718.

Basic electrical control of light emitting diodes can be accomplished in different basic electrical structures or configurations that are set forth in FIGS. 31, 32, 33 and 34 as discussed below. Before proceeding with a discussion of these electrical configurations, a basic comment is as follows. A light emitting diode is a special luminescent semiconductor device that when an adequate amount of forward drive current is passed through the diode, a particular color of light is emitted. This forward drive current is typically 20 milliamperes (20 mA) depending on individual light emitting diode characteristics.

Figure 31:
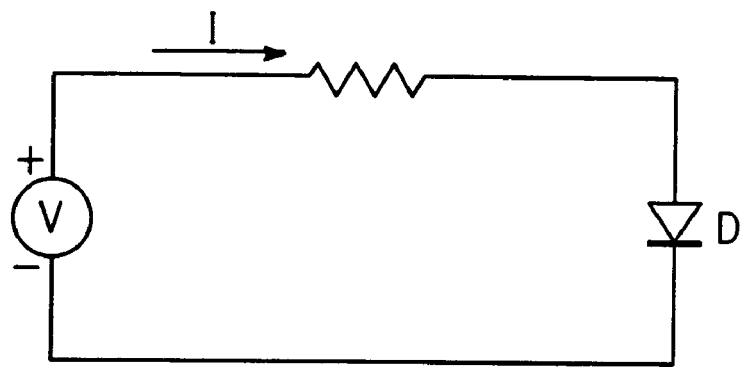
FIG. 31 is a basic electrical diagram that relates to the selection of a single light emitting diode for a given direct current voltage.

In FIGS. 31, 32, 33 and 34 the following is the legend:
~=VAC (Voltage Alternating Current)
V=VDC (Voltage Direct Current)
I=Current
R=Resistance
C=Capacitance
D=Light Emitting Diode
B=Diode Bridge Rectifier FIG. 31 is an electrical diagram that shows the derivation of a forward current I driving a light emitting diode D by dividing the direct current voltage V by the resistor value, or resistance R, that is, I=V/R. With a constant voltage value, the resistance R can be selected to produce the necessary forward drive current for light emitting diode D.

Figure 32:
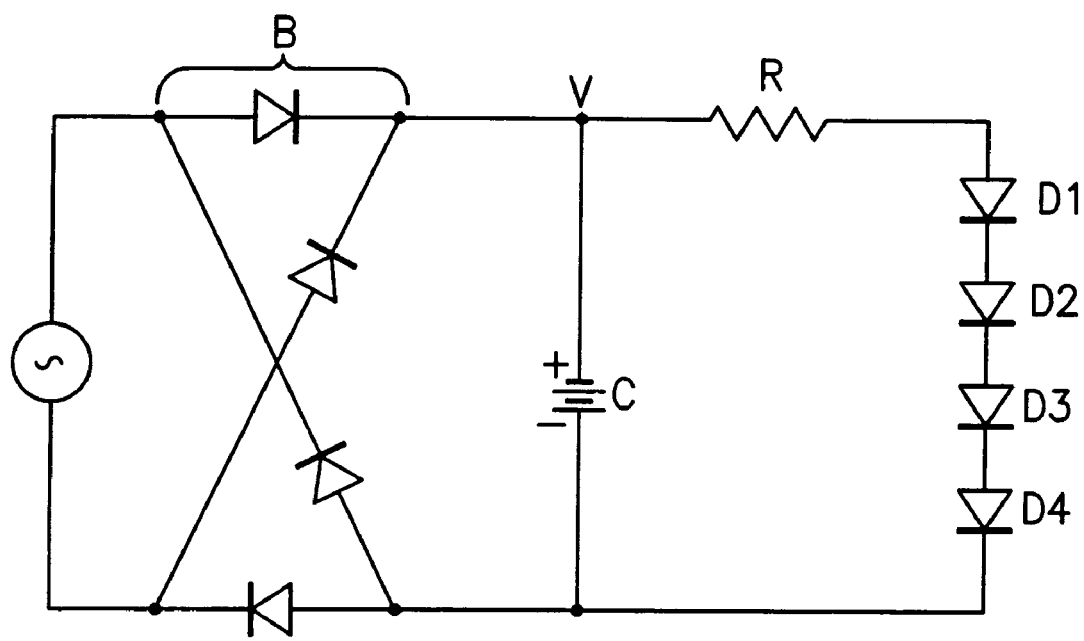
FIG. 32 is a basic electrical diagram that relates to the selection of a plurality of light emitting diodes connected in series in electrical connection with a source of alternating current that has been converted to direct current voltage.

FIG. 32 is an electrical diagram that shows alternating current voltage passing through diode bridge rectifier B and becoming direct current voltage V to drive the light emitting diodes $D_1$, $D_2$, $D_3$ and $D_4$. Resistance R is used to limit the forward drive current I, and the capacitance C is used to smooth out the ripple current of the alternating current voltage and make it more constant. The light emitting diodes are connected in series such that the forward drive current is identical in all of the light emitting diodes $D_1$, $D_2$, $D_3$ and D4. Provided that the light emitting diodes $D_1$, $D_2$, $D_3$ and D4 are the same, the actual voltage seen by each identical light emitting diode is equivalent to the direct current voltage V divided by the actual number of light emitting diodes in the series, or in this case, V/4.

Figure 33:
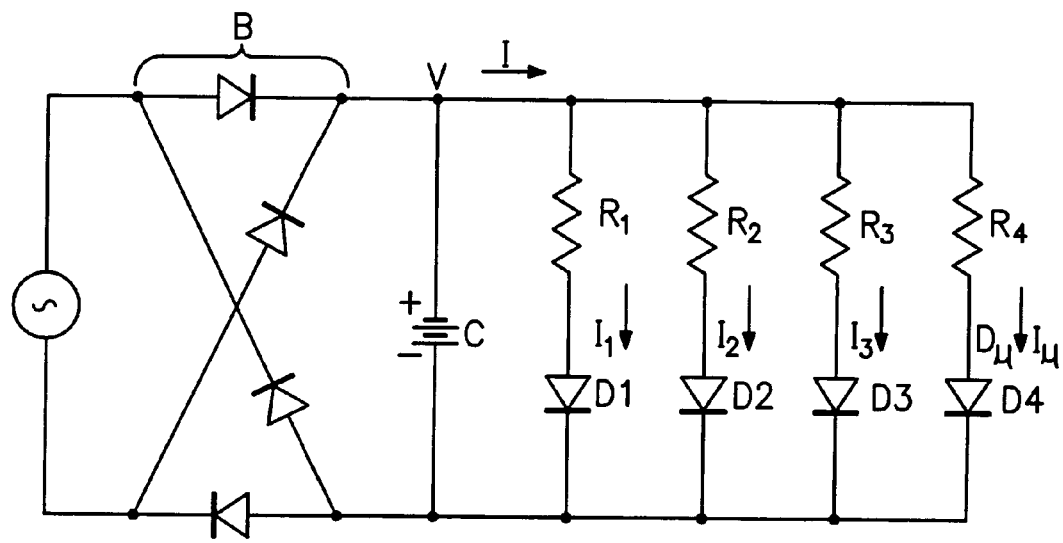
FIG. 33 is a basic electrical diagram that relates to the selection of a plurality of light emitting diodes connected in parallel in electrical connection with a source of alternating current that has been converted to direct current voltage.

FIG. 33 is an electrical diagram that shows light emitting diodes $D_1$, $D_2$, $D_3$ and $D_4$ are now connected in parallel such that each individual light emitting diode receives the same direct current voltage V. The individual forward drive currents are derived as follows for each light emitting diode. For $D_1$, $I_1=V/R_1$; for $D_2$, $I_2=V/R_2$; for $D_3$, $I_3=V/R_3$; and for $D_4$, $I_4=V/R_4$. The total current $I=I_1+I_2+I_3+I_4$.

Figure 34:
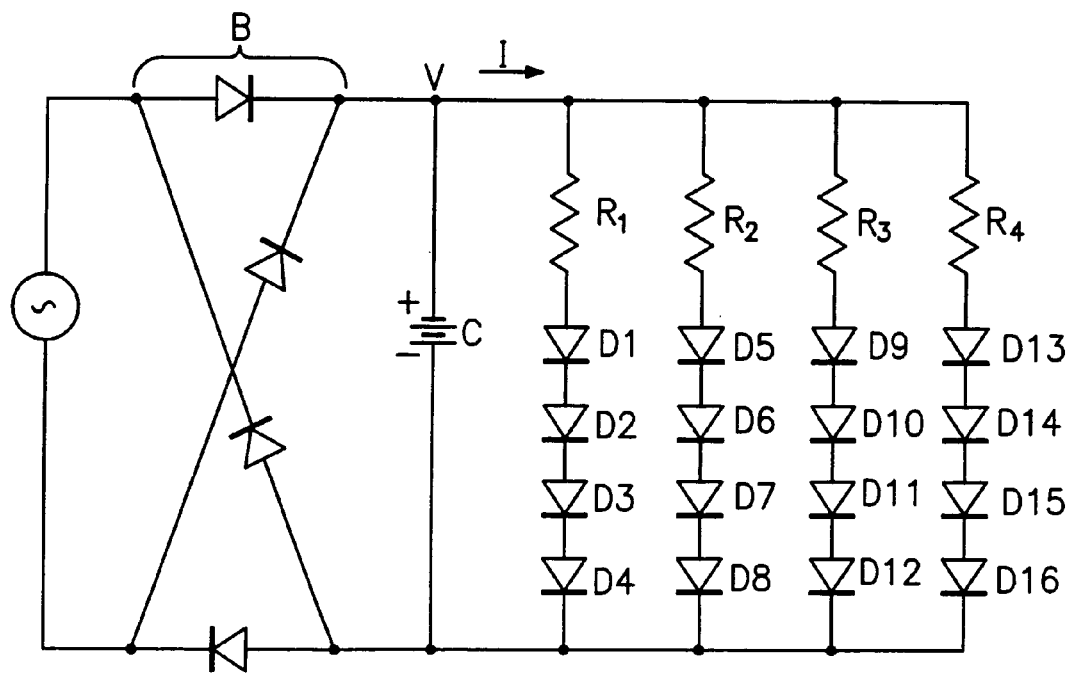
FIG. 34 is a basic electrical diagram that relates to the selection of a plurality of light emitting diodes connected both in series and in parallel in electrical connection with a source of alternating current that has been converted to direct current voltage.

FIG. 34 is an electrical diagram that shows a combination of light emitting diodes connected in both series and parallel. Each series leg is connected in parallel to each other. As in FIG. 33, each series leg sees the same direct current voltage V. The total current $I=I_1+I_2+I_3+I_4$. The individual forward drive currents are derived as follows for each light emitting diode: For $D_1$ to $D_4$, $I_1=V/R_1$; for $D_5$ to D8, $I_2=V/R_2$; for $D_9$ to $D_{12}$, $I_3=V/R_3$; and for $D_{13}$ to $D_{16}$, $I_4=V/R_4$. Each light emitting diode in the individual series leg sees only a quarter of the overall voltage V. Alternating current voltage passes through a diode bridge rectifier B and becomes direct current voltage V to drive the light emitting diodes $D_1$–$D_{16}$.

Four diodes are shown in each of FIGS. 31, 32 and 33 for purposes of exposition only. More or fewer diodes can be used for each example without altering the fundamental derivations.

Added commentary on FIGS. 31, 32, 33 and 34 follows. A fairly direct relationship exists between the forward drive current versus the relative output luminosity for a light emitting diode. The luminous intensity is normally at its maximum at the rated DC forward drive current operating at an ambient temperature of 25 degrees Celsius. When the drive current is less than the rated forward drive current, the output will be correspondingly lower. The described circuit arrangements, therefore, will cause the light emitting diodes to give out a lower light output when the input alternating current voltage is lowered. This makes the light emitting diodes and the related circuitry ideal replacements for existing incandescent filament lamps, because they can be operated with and be dimmed using conventional SCR type wall dimmers or an equivalent.

Likewise, instead of using a constant voltage source to supply current to a circuit containing light emitting diodes, a pulsed forward current can be used. A pulsed forward drive current, as obtained from pulse width modulation circuits with adjustable duty cycles will allow for rapid bursts of extra drive voltage at very short intervals causing the light emitting diodes to see more drive current and resulting in apparently brighter light outputs. Caution must be used when overdriving the light emitting diodes so as not to overheat the diodes and cause them to burn out prematurely.

The LEDs described herein are primarily used to produce white light. Colored LEDs can also be used to produce the primary colors red, green, and blue, and also the secondary colors cyan, yellow, and magenta. The LEDs described herein also can be multi-chip and multi-LED arrays. Furthermore the LEDs described herein can also be infrared.

Each of housings or frames 54, 102, 140, 198, 248, 306, 358, 412, 462, 540, 602, 626 and 650 and 690 can have each of their rims angled relative to the direction of the discrete diode beams emanating from each housing.

Although the present invention has been described in some detail by way of illustration and example for purposes of clarity and understanding, it will, of course, be understood that various changes and modifications may be made in the form, details, and arrangements of the parts without departing from the scope of the invention set forth in the following claims.

What is claimed is:

1. A lighting system for stage, theatrical and architectural lighting, comprising:

frame means defining a longitudinal axis and an open end at one axial end and a predetermined dimension along said longitudinal axis between said open end and another axial end said frame means defining a mounting surface for supporting a plurality of light emitting diodes, said frame means including a substantially rigid mounting template for providing a substantially fixed hollow volume defining a focal point substantially along said longitudinal axis said open end defining a dimension transverse to said longitudinal axis which is less than said predetermined longitudinal dimension;

means for mounting at least one diode of said plurality of diodes within said hollow volume of said frame means and simultaneously for positioning said plurality of diodes wherein at least one discrete diode is oriented to emit a light beam skewed to a normal direction of said mounting surface of said mounting template and directed to a predetermined illumination area generally along said longitudinal axis beyond said focal point, and circuit board means structurally associated with same frame means for transmitting and controlling electrical voltage to said plurality of light emitting diodes.

2. A lighting system for stage, theatrical and architectural light, comprising:
   frame means for supporting a plurality of light emitting diodes, said frame means including a substantially rigid mounting template for providing a substantially fixed hollow volume;
   means for mounting each diode of said plurality of diodes with said hollow volume of said frame means and simultaneously for positioning said plurality of diodes wherein each discrete diode light beam is directed to a predetermined, substantially fixed remote point (target zone) and thereupon directed to a predetermined illumination area, and
   circuit board means structurally associated with said frame means for transmitting and controlling electrical voltage to said plurality of light emitting diodes,
   wherein said frame means includes a mounting template, and said means for mounting includes said mounting template forming a plurality of individually positioned mounting steps wherein each said diode of said plurality of diodes is positioned at one mounting step of said plurality of mounting steps wherein each discrete diode light beam is independently directed to said focal point.

3. The lighting system in accordance with claim 2, wherein said mounting template has an interior volume surface and a closed plane aperture having a periphery, said plurality of diodes being positioned and arranged at such mounting steps so as to assume the configuration of said interior volume surface, said diode beams emitting from said diodes being directed through said closed plane aperture.

4. The lighting system in accordance with claim 2, wherein said mounting template is configured substantially as a planar surface, said plurality of diodes being positioned and arranged at said mounting steps so as to assume the configuration of said planar surface.

5. The lighting system in accordance with claim 2, further including a nonconductive housing, said mounting template being positioned in said nonconductive housing.

6. The lighting system in accordance with claim 2, further including an imaging gate aperture positioned at a distance from said frame means.

7. The lighting system in accordance with claim 2, wherein said light emitting diodes are white light emitting diodes.

8. The lighting system in accordance with claim 2, wherein said light emitting diodes are colored light emitting diodes selected from the group consisting of red, green, and blue light emitting diodes.

9. The lighting system in according with claim 2, wherein said light emitting diodes are light emitting diodes selected from the group consisiing of cyan, yellow, and magenta light emitting diodes.

10. The lighting system in accordance with claim 2, further including means for securing said plurality of diodes to said mounting template, said means for securing being wherein each said diode is removably mounted to each of said mounting steps.

11. The lighting system in accordance with claim 2, wherein said plurality of diodes are cylindrical in configuration and wherein said frame means includes a mounting template and said means for mounting includessaid mounting template forming a plurality of individuality positioned cylindrical recesses wherein each said diode of said plurality of diodes is positioned within one of said plurality of cylindrical recesses wherein teach said discrete diode light beam is independently directed to said focal point.

12. The lighting system in accordance with claim 3, wherein said hollow volume is configured as a hollow cone wherein said closed plane aperture is configured as a hollow cone wherein said closed plane aperture is configured as a cone closed plane aperture defined by a cone periphery, and said interior volume surface is a cone inner volume surface defined between the vertex of said cone and said cone periphery.

13. The lighting system in accordance with claim 3, wherein said hollow volume is configured as a hollow semi-ellipse wherein said closed plane aperture is configured as an ellipsoidal-based closed plane aperture defined by an ellipsoidal-based periphery and said interior volume surface is defined by said ellipsoidal interior volume surface and said ellipsoidal periphery.

14. The lighting system in according with claim 3, wherein said hollow volume is configured as a hollow hemisphere wherein said closed plane aperture is configured as a hemispherical closed plane aperture defined by a hemispherical periphery and said interior volume surface is defined by a hemispherical interior volume surface and said hemispherical periphery.

15. The lighting system in accordance with claim 3, wherein said circuit board means is a circuit board configured in accordance with the configuration of said mounting template and positioned in proximity to said mounting template.

16. The lighting system in accordance with claim 12, wherein said periphery of said cone closed aperture is configured as a circle.

17. The lighting system in accordance with claim 13, wherein the ellipsoidal periphery is configured as a circle.

18. The lighting system in accordance with claim 14, wherein said hemispherical periphery is configured as a circle.

19. A lighting system for stage, theatrical and architectural lighting, comprising:
   frame means defining a longitudinal axis and an open end at one axial end and a predetermined dimension along said longitudinal axis between said open end and another axial end said frame means defining a mounting surface for supporting a plurality of light emitting diodes, said frame means including a substantially rigid mounting template for providing a substantially fixed hollow volume, a focal point substantially along said longitudinal axis said open end defining a dimension transverse to said longitudinal axis which is less than said predetermined longitudinal dimensions;
   means for mounting at least one diode of said plurality of diodes with said hollow volume of said frame means and simultaneously for positioning said plurality of diodes wherein at least one discrete diode is oriented to emit a light beam skewed to a normal direction of said mounting surface of said mounting template and directed to a predetermined illumination area generally along said longitudinal axis beyond said focal point, and circuit board means structurally associated with said frame means for transmitting and controlling electrical voltage to said plurality of light emitting diodes, wherein said circuit board means is a unitary rigid circuit board and frame including a plurality of diode electrical connectors, and said means for mounting includes plurality of diodes having a plurality of diode electrical leads connected to said plurality of diode electrical connectors, and said means for mounting includes said plurality of electrical leads being individually positioned and angles wherein said plurality of diodes are positioned and arranged wherein each said discrete diode light is independently directed to said focal point.

20. A lighting system for stage, theatrical and architectural lighting, comprising:

frame means defining a mounting surface for supporting a plurality of light emitting diodes, said frame means including a substantially rigid mounting template for providing a substantially fixed hollow volume;

means for mounting at least one diode of said plurality of diodes with said hollow volume of said frame means and simultaneously for positioning said plurality of diodes wherein each discrete diode is individually oriented to emit a light beam skewed to said mounting surface of said mounting template and directly directed to a predetermined illumination area, and circuit board means structurally associated with said frame means for transmitting and controlling electrical voltage to said plurality of light emitting diodes, wherein said circuit board means is a unitary rigid circuit board and frame including a plurality of diode electrical connectors, and said means for mounting includes plurality of diodes having a plurality of diode electrical leads connected to said plurality of diode electrical connectors, and said means for mounting includes said plurality of electrical leads being individually positioned and angles wherein said plurality of diodes are positioned and arranged wherein each said discrete diode light is independently directed to said focal point, wherein said plurality of diode electrical leads are stiff electrical leads.

21. The lighting system in accordance with claim 20, further including a means of securing said plurality of diodes to said unitary rigid circuit board and frame, said means for securing being still electrical leads.

22. A lighting system for stage, theatrical and architectural lighting, comprising:

frame means defining a mounting surface for supporting a plurality of light emitting diodes, said frame means including a substantially rigid mounting template for providing a substantially fixed hollow volume;

means for mounting at least one diode of said plurality of diodes with said hollow volume of said frame means and simultaneously for positioning said plurality of diodes wherein each discrete diode is individually oriented to emit a light beam skewed to said mounting surface of said mounting template and directly directed to a predetermined illumination area, and circuit board means structurally associated with said frame means for transmitting and controlling electrical voltage to said plurality of light emitting diodes, wherein said circuit board means is a unitary rigid circuit board and frame including a plurality of diode electrical connectors, and said means for mounting includes plurality of diodes having a plurality of diode electrical leads connected to said plurality of diode electrical connectors, and said means for mounting includes said plurality of electrical leads being individually positioned and angles wherein said plurality of diodes are positioned and arranged wherein each said discrete diode light is independently directed to said focal point, wherein said unitary circuit board and frame is configured so as to define a hollow volume having an interior volume surface and a closed plane aperture having a periphery, said plurality of diodes being positioned so as to assume the configuration of said interior volume surface, said discrete diode light beams emitting from said diodes being directed through said closed plane aperture.

23. The lighting system in accordance with claim 22, wherein said hollow volume is configured as a hollow cone wherein said closed plane aperture is configured as a cone closed plane aperture defined by a cone periphery, and said interior volume surface is a cone inner volume surface defined between the vertex of said cone and said cone peryphery.

24. The lighting system in accordance with claim 22, wherein said hollow volume is configured as a hollow semi-ellipse wherein said closed plane aperture is configured as an ellipsoidal-based closed plane aperture defined by an ellipsoidal-based periphery and said interior volume surface is defined by said ellipsoidal interior volume surface and said ellipsoidal periphery.

25. The lighting system in accordance with claim 22, wherein said hollow volume is configured as a hollow hemisphere where said closed plane aperture is configured as an hemispherical closed plane aperture defined by a hemispherical periphery and said interior volume surface is defined by a hemispherical interior volume surface and said hemispherical periphery.

26. The lighting system in accordance with claim 22, wherein said unitary rigid board and frame means is configured substantially as a planar surface, said plurality of diodes being positioned with said plurality of stiff electrical leads so as to assume the configuration of said planar surface.

27. The lighting system in accordance with claim 23, wherein said periphery of said cone closed plane aperture is configured as a circle.

28. The lighting system in accordance with claim 24, wherein said ellipsoidal periphery is configured as a circle.

29. The lighting system in accordance with claim 25, wherein said hemispherical periphery is configured as a circle.

30. The lighting system in accordance with claim 6, further including a gobo operatively mounted with said imaging gate.

31. The lighting system in accordance with claim 6, further including a shutter blade operative mounted with said imaging gate.

32. The lighting system in accordance with claim 6, further including focusing lens means for intercepting said plurality of diode discrete diode light beams and directing said plurality of diode light beams as focused total diode light beam to said illumination area, said focusing lens means being positioned between said imaging gate and said illumination area.

33. The lighting system in accordance with claim 32, wherein said focal point (target area) is located between said imaging gate and said focusing lens.

34. The lighting system in accordance with claim 33, wherein said focal point (target area) is a virtual focal point (target area) located between said focusing lens means and said illumination area.

35. The lighting system in accordance with claim 32, further including collimating lens means spaced from said imaging gate, said focusing lens means being spaced from said collimating means, said collimating lens means being for collecting said plurality of diode discrete light beams emitted by said plurality of diodes being supported by said frame means and directing a collimated diode total light beam to said focusing lens, said focusing lens being for collecting said collimated diode total light beam and directing a focused diode total light beam to said illumination area.

36. The lighting system in accordance with claim 35, wherein said collimating lens and said focusing lens are movable relative to one another and to said imaging gate.

37. The lighting system in accordance with claim 15, further including a mounting board positioned between said mounting template and said circuit board.

38. The lighting system in accordance with claim 10, wherein each said diode is removably glued to each of said mounting steps.

39. The lighting system in accordance with claim 11, wherein said plurality of diodes have diode diameters and said plurality of cylindrical recess have recess diameters slightly smaller than said diode diameters, said plurality of diodes being removably positioned in said plurality of recess diameters in a press-fit relationship.

40. The lighting system in accordance with claim 39, further including electrical leads between said circuit board means and said plurality of diodes wherein said electrical leads are removably connected to said plurality of diodes.

41. The lighting system in accordance with claim 39, further including electrical leads between said circuit board means and said plurality of diodes wherein said electrical leads are removably connected to said circuit board means.

42. A lighting system for stage, theatrical and architectural lighting, comprising
   a sandwich frame for supporting a plurality of light emitting diodes, said sandwich frame including a positive electrically conductive layer and a negative electrically conductive layer interposed between layers of biasable insulating foam,
   said sandwich frame defining a hollow volume having an interior volume surface and a closed plane aperture having a circular periphery, said plurality of diodes being positioned within said interior volume in association with said interior volume surface, said diode light beams emitting from said plurality of diodes being directed through said closed plane aperture,
   means for mounting each diode of said plurality of diodes to said frame and simultaneously for positioning said plurality of diodes wherein each discrete diode light beam is directed to a prescribed focal point (target zone) and thereupon directed to a predetermined illumination area,
   said means for mounting including at least one pin removably positioned in said layers of foam, said at least one pin including positive and negative electrical leads in electrical contact with said positive and negative conductive layers,
   said biasable foam having an elasticity threshold at least equal to the maximum pressure exerted by said at least one pin; and
   electrical power for transmitting and controlling electrical voltage to said positive and negative conductive layers and to said plurality of light emitting diodes.

43. The lighting system according to claim 42, wherein said means for mounting includes a plurality of diode mounts secured to said interior volume surface, said diode mounts having opposed top and bottom diode mount surfaces, said bottom diode mount surfaces being contoured to said interior volume surface and said top diode mount surfaces being planar with said diodes being secured to said planar top diode mount surfaces, said diode mounts being individually oriented to position each of said plurality of diodes so as to direct each said discrete diode light beam to said target zone.

44. The lighting system according to claim 42, wherein said means for mounting including at least one mounting pin removably positioned in said layers of foam is two mounting pins removably positioned in said foam, said two mounting pins including an electrically conductive long mounting pin and an electrically conductive short mounting pin, said long mounting pin being in electrical contact with one of said positive and said negative conductive layers, and said short mounting pin being in electrical contact with the other of said of said positive and negative conductive layers.

45. The lighting system according to claim 42, wherein said layers of biasable insulating foam include an inner foam layer proximate said diodes, an outer foam layer distal said diodes and a middle foam layer positioned between said inner and said outer foam layers.

46. The lighting system according to claim 42, wherein said plurality of diodes are positioned and arranged so as to assume the configuration of said interior volume surface.

47. The lighting system according to claim 42, wherein said hollow volume is configured as a semi-ellipse.

48. The lighting system according to claim 42, wherein said hollow volume is configured as a semi-sphere.

49. The lighting system according to claim 42, wherein said hollow volume is configured as a cone.

50. The lighting system in accordance with claim 42, wherein said light emitting diodes are white light emitting diodes.

51. The lighting system in accordance with claim 42, wherein said light emitting diodes are colored light emitting diodes selected from the group consisting of red, green, and blue light emitting diodes.

52. The lighting system in accordance with claim 42, wherein said light emitting diodes are light emitting diodes selected from the group consisting of cyan, yellow and magenta light emitting diodes.

53. The lighting system in accordance with claim 42, further including an imaging gate defining a gate aperture positioned at a distance from said frame means.

54. The lighting system in accordance with claim 42, further including a gobo operatively mounted with said imaging gate.

55. The lighting system in accordance with claim 42, further including a shutter blade.

56. The lighting system in accordance with claim 42, further including focusing lens means for intercepting said plurality of diode discrete diode light beams and directing said plurality of diode light beams as a focused total diode light beam to said illumination area, said focusing lens means being positioned between said imaging gate and said illumination area.

57. The lighting system in accordance with claim 42, wherein said focal point (target area) is located between said imaging gate and said focusing lens.

58. The lighting system in accordance with claim 42, wherein said focal point (target area) is a virtual focal point (target area) located between said focusing lens means and said illumination area.

59. The lighting system in accordance with claim 42, further including collimating lens means spaced from said imaging gate, said focusing lens means being spaced from said collimating lens means, said collimating lens means being for collecting said plurality of diode discrete light beams emitted by said plurality of diodes being supported by said frame means and directing a collimated diode total light beam to said focusing lens, said focusing lens being for collecting said collimated diode total light beam and directing a focused diode total light beam to said illumination area.

60. The lighting system according to claim 43, wherein each said diode mount defines two passages wherein are positioned said positive and negative electrical leads.

61. The lighting system according to claim 60, wherein said at least one pin includes an elongated cylindrical pin wall defining a pin passage, wherein are positioned said positive and negative electrical leads.

62. The lighting system according to claim 61, wherein said cylindrical pin wall includes nonconductive wall portions and isolated positive and negative conductive wall portions in electrical contact with said positive and negative leads, respectively, said positive and negative conductive wall portions also being in electrical contact with said positive and negative conductive layers, respectively.

63. The lighting system according to claim 44, wherein said long mounting pin includes a nonconductive outer wall positioned at said other of said positive and said negative conductive layers.

64. The lighting system according to claim 45, wherein one of said positive and negative conductive layers is positioned between said inner and said middle foam layers and the other of said positive and negative conductive layers is positioned between said middle and said outer foam layers.

65. The lighting system according to claim 64, wherein said positive and negative conductive layers are made of a conductive metal.

66. The lighting system according to claim 64, wherein said positive and negative conductive sheets are made of a multi-sheet assembly of material having elastic return properties and electrically conductive material.

67. The lighting system according to claim 64, wherein said positive and negative conductive sheets are made of a conductively loaded foam having elastic return properties.

68. The lighting system according to claim 64, wherein a first sheet of material having elastic recovery properties is interposed between said one of said positive and negative conductive sheets and said middle foam layer and a second sheet of material having elastic recovery properties is interposed between said other of said positive and negative conductive sheets and said outer foam layer.

69. The lighting system according to claim 68 wherein said first and second sheets of material having elastic recovery properties are integrated with said middle foam layer and with said outer foam layer, respectively.

70. The lighting system according to claim 69, wherein said first and second sheets of material having elastic return properties that are integrated with said middle foam layer and with said outer foam layer are comprised of layers of balls of elastomer embedded in said middle foam layer at said one of said positive and negative conductive layers and also embedded in said outer foam layer at said other of said positive and negative conductive layers.

71. The lighting system according to claim 70, wherein said first sheet of material having elastic recovery properties and second sheet of material having elastic recovery properties are made of an elastomeric cement.

72. The lighting system according to claim 70, wherein said first and second sheets of material having elastic recovery properties are made of a conductively loaded foam material.

73. The lighting system in accordance with claim 59, wherein said collimating lens and said focusing lens are movable relative to one another and to said imaging gate.

74. The lighting system according to claim 43, wherein said plurality of diode mounts are connected together so as to form a unified diode mounting template.

75. A lighting system for stage, theatrical and architectural lighting, comprising a sandwich frame for supporting a plurality of light emitting diodes, said sandwich frame including a positive electrically conductive layer and a negative electrically conductive layer interposed between layers of biasable insulating foam, said sandwich frame having a surface, said plurality of diodes being positioned at said surface, means for mounting each diode of said plurality of diodes to said frame at said surface and simultaneously for positioning said plurality of diodes wherein each discrete diode light beam is directed to a prescribed remote focal point (target zone) and thereupon directed to a predetermined illumination area, said means for mounting including at least one pin removably positioned in said layers of foam, said at least one pin including positive and negative electrical leads in electrical contact with said positive and negative conductive layers, said biasable foam having an elasticity threshold at least equal to the maximum pressure exerted by said at least one pin; and electrical power for transmitting and controlling electrical voltage to said positive and negative conductive layers and to said plurality of light emitting diodes.

76. The lighting system according to claim 75, wherein said means for mounting includes a plurality of diode mounts secured to said surface, said diode mounts having opposed top and bottom diode mount surfaces, said bottom diode mount surfaces being contoured to said surface and said top diode mount surfaces being planar with said diodes being secured to said planar top diode mount surfaces, said diode mounts being individually oriented to position each of said plurality of diodes so as to direct each said discrete diode light bean to said target zone.

77. The lighting system according to claim 75, wherein said plurality of diode mounts are joined together so as to form a unified diode mounting template including said plurality of diode mounts.

78. The lighting system according to claim 75, wherein said at least-one pin includes an elongated cylindrical pin wall defining a pin passage, wherein are positioned said positive and negative electrical leads.

79. The lighting system according to claim 75, wherein said means for mounting including at least one mounting pin removably positioned in said layers of foam is two mounting pins removably positioned in said foam, said two mounting pins including an electrically conductive long mounting pin and an electrically conductive short mounting pin, said long mounting pin being in electrical contact with one of said positive and said negative conductive layers, and said short mounting pin being in electrical contact with the other of said of said positive and negative conductive layers.

80. The lighting system according to claim 75, wherein said layers of biasable insulating foam include an inner foam layer proximate said diodes, an outer foam layer distal said diodes and a middle foam layer positioned between said inner and said outer foam layers.

81. The lighting system according to claim 75, wherein said positive and negative conductive layers are made of a conductive metal.

82. The lighting system according to claim 75, wherein said positive and negative conductive sheets are made of a multi-sheet assembly of material having elastic return properties and electrically conductive material.

83. The lighting system according to claim 75, wherein said sandwich frame defines a hollow volume having a volume surface and a closed plane aperture having a circular periphery, said plurality of diodes being positioned within said interior volume in association with said interior volume surface, said diode light beams emitting from said plurality of diodes being directed through said closed plane aperture.

84. The lighting system according to claim 75, wherein said sandwich frame is configured substantially as a planar surface.

85. The lighting system according to claim 76, wherein each said diode mount defines two passages wherein are positioned said positive and negative electrical leads.

86. The lighting system according to claim 76, wherein said plurality of diode mounts are connected together so as to form a unified diode mounting template.

87. The lighting system according to claim 78, wherein said cylindrical pin wall includes nonconductive wall portions and isolated positive and negative conductive wall portions in electrical contact with said positive and negative leads, respectively, said positive and negative conductive wall portions also being in electrical contact with said positive and negative conductive layers, respectively.

88. The lighting system according to claim 79, wherein said long mounting pin includes a nonconductive outer wall positioned at said other of said positive and said negative conductive layers.

89. The lighting system according to claim 80, wherein one of said positive and negative conductive layers is positioned between said inner and said middle foam layers and the other of said positive and negative conductive layers is positioned between said middle and said outer foam layers.

90. The lighting system according to claim 80, wherein a first sheet of material having elastic recovery properties is interposed between said one of said positive and negative conductive sheets and said middle foam layer and a second sheet of material having elastic recovery properties is interposed between said other of said positive and negative conductive sheets and said outer foam layer.

91. The lighting system according to claim 81, wherein said positive and negative conductive sheets are made of a conductively loaded foam having elastic return properties.

92. The lighting system according to claim 90, wherein said first and second sheets of material having elastic recovery properties are integrated with said middle foam layer and with said outer foam layer, respectively.

93. The lighting system according to claim 90, wherein said first and second sheets of material having elastic return properties that are integrated with said middle foam layer and with said outer foam layer are comprised of layers of balls of elastomer embedded in said middle foam layer at said one of said positive and negative conductive layers and also embedded in said outer foam layer at said other of said positive and negative conductive layers.

94. The lighting system according to claim 90, wherein said first sheet of material having elastic recovery properties and second sheet of material having elastic recovery properties are made of an elastomeric cement.

95. The lighting system according to claim 90, wherein said first and second sheets of material having elastic recovery properties are made of a conductively loaded foam material.

96. The lighting system according to claim 83, wherein said hollow volume is configured as a semi-ellipse.

97. The lighting system according to claim 83, wherein said hollow volume is configured as a semi-sphere.

98. The lighting system according to claim 83, wherein said hollow volume is configured as a cone.

99. A lighting system for stage, theatrical and architectural lighting, comprising frame means for supporting a plurality and light emitting diodes, means for mounting each diode of said plurality of diodes to said frame means and simultaneously for positioning said plurality of diodes wherein each discrete diode light is directed to a prescribed remote focal point (target zone) and thereupon directed to a predetermined illumination area, and circuit board means structurally associated with said frame means for transmitting and controlling electrical voltage to said plurality of light emitting diodes, wherein said frame means includes a mounting template and said means for mounting includes said mounting template forming a plurality of individually positioned mounting steps wherein each said diode of said plurality of diodes is positioned at one mounting step of said plurality of mounting steps wherein each said discrete diode light beam is independently directed to said focal point, and wherein said mounting template is configured so as to define a hollow volume having an interior volume surface and a closed plane aperture having a periphery, said plurality of diodes being positioned and arranged at said mounting steps so as to assume the configuration of said interior volume surface, said diode light beams emitting from said diodes being directed through said closed plane aperture, and further wherein said hollow volume is configured as a hollow cone where said closed plane aperture is configures as a cone closed plane aperture defined between the vertex of said cone and said cone periphery.

100. A lighting system for stage, theatrical and architectural lighting, comprising frame means for supporting a plurality of light emitting diodes, means for mounting each diode of said plurality of diodes to said frame means and simultaneously for positioning said plurality of diodes wherein each discrete diode light beam is directed to a prescribed remote focal point (target zone) and thereupon directed to a predetermined illumination area, and circuit board means structurally associated with said frame means for transmitting and controlling electrical voltage to said plurality of light emitting diodes, wherein said frame means includes a mounting template and said means for mounting includes said mounting template forming a plurality of individually positioned mounting steps wherein each said diode of said plurality of diodes is positioned at one mounting step of said plurality of mounting steps wherein each said discrete diode light beam is independently directed to said focal point, and wherein said mounting template is configured so as to define a hollow volume having an interior volume surface and a closed plane aperture having a periphery, said plurality of diodes being positioned and arranged at said mounting steps so as to assume the configuration of said interior volume surface, said diode light beams emitting from said diodes being directed through said closed plane aperture, and further wherein said hollow volume is configured as a hollow semi-ellipse wherein said closed plane aperture is configured as an ellipsoidal-based periphery and said interior volume surface is defined by said ellipsoid interior volume surface and said ellipsoidal periphery.

101. A lighting system for stage, theatrical and architectural lighting, comprising frame means for supporting a plurality of light emitting diodes, means for mounting each diode of said plurality of diodes to said frame means and simultaneously for positioning said plurality of diodes wherein each discrete diode light beam is directed to a prescribed remote focal point (target zone) and thereupon directed to a predetermined illumination area, and circuit board means structurally associated with said frame means for transmitting and controlling electrical voltage to said plurality of light emitting diodes, wherein said frame means includes a mounting template and said means for mounting includes said mounting template forming a plurality of individually positioned mounting steps wherein each said diode of said plurality of diodes is positioned at one mounting step of said plurality of mounting steps wherein each said discrete diode light beam is independently directed to said focal point, and wherein said mounting template is configured so as to define a hollow volume having an interior volume surface and a closed plane aperture having a periphesy, said plurality of diodes being positioned and arranged at said mounting steps so as to assume the configuration of said interior volume surface, said diode light beams emitting from said diodes being directed through said closed plane aperture, and further wherein said hollow volume is configured as a hollow hemisphere wherein said closed plane aperture is configured as a hemispherical closed plane aperture defined by a hemispherical periphery and said interior volume surface is defined by a hemispherical interior volume surface and said hemispherical periphery.

102. A lighting system for stage, theatrical and architectural lighting, comprising frame means for supporting a plurality of light emitting diodes, means for mounting each diode of said plurality of diodes to said frame means and simultaneously for positioning said plurality of diodes where each discrete diode light beam is directed to a prescribed remote focal point (target zone) and thereupon directed to a predetermined illumination area, and circuit board means structurally associated with said frame means for transmitting and controlling electrical voltage to said plurality of light emitting diodes, wherein said circuit board means is a unitary rigid circuit board and frame including a plurality of diode electrical connectors, and said means for mounting includes said plurality of diodes having a plurality of diode electrical leads connected to said plurality of diode electrical connectors, and said means for mounting includes said plurality of electrical leads being individually positioned and angled wherein said plurality of diodes are positioned and arranged wherein each said discrete diode light beam is independently directed to said focal point.

103. A lighting system for stage, theatrical and architectural lighting, comprising frame means for supporting a plurality of light emitting diodes, means for mounting each diode of said plurality of diodes to said frame means and simultaneously for positioning said plurality of diodes wherein each discrete diode light beam is directed to a prescribed remote focal point (target zone) and thereupon directed to a predetermined illumination area, and circuit board means structurally associated with said frame means for transmitting and controlling electrical voltage to said plurality of light emitting diodes, further including an imaging gate defining a gate aperture positioned at a distance from said frame means.

104. A lighting system for stage, theatrical and architectural lighting, comprising frame means for supporting a plurality of light emitting diodes, means for mounting each diode of said plurality of diodes to said frame means and simultaneously for positioning said plurality of diodes wherein each discrete diode light beam is directed to a prescribed remote focal point (target zone) and thereupon directed to a predetermined illumination area, and circuit board means structurally associated with said frame means for transmitting and controlling electrical voltage to said plurality of light emitting diodes, wherein said frame means includes a mounting template and said means for mounting includes said mounting template forming a plurality of mounting steps wherein each said discrete diode light beam is independently directed to said focal point, and wherein said mounting template is configured so as to define a hollow volume having an interior volume surface and a closed plane aperture having a periphery, said plurality of diodes being positioned and arranged at said mounting steps so as to assume the configuration of said interior volume surface, said diode light beams emitting from said diodes being directed through said closed plane aperture, wherein said circuit board means is a circuit board configured in accordance with the configuration of said mounting template and positioned in proximity to said mounting template.

105. A lighting system for stage, theatrical and architectural lighting, comprising frame means for supporting a plurality of light emitting diodes, means for mounting each diode of said plurality of diodes to said frame means and simultaneously for positioning said plurality of diodes wherein each discrete diode light beam is directed to a prescribed remote focal point (target zone) and thereupon directed to a predetermined illumination area, and circuit board means structurally associated with said frame means for transmitting and controlling electrical voltage to said plurality of light emitting diodes, wherein said plurality of diodes are cylindrical in configuration and wherein said frame means includes a mounting template and said means for mounting includes said mounting template forming a plurality of individually positioned cylindrical recesses wherein each said discrete diode light beam is independently directed to said focal point.

* * * * *